(12) United States Patent
Villeneuve et al.

(10) Patent No.: US 10,520,602 B2
(45) Date of Patent: *Dec. 31, 2019

(54) PULSED LASER FOR LIDAR SYSTEM

(71) Applicant: Luminar Technologies, Inc., Portola Valley, CA (US)

(72) Inventors: Alain Villeneuve, Mont-Royal (CA); Jason M. Eichenholz, Orlando, FL (US)

(73) Assignee: Luminar Technologies, Inc., Orlando, FL (US)

( * ) Notice: Subject to any disclaimer, the term of this patent is extended or adjusted under 35 U.S.C. 154(b) by 298 days.

This patent is subject to a terminal disclaimer.

(21) Appl. No.: 15/363,795

(22) Filed: Nov. 29, 2016

(65) Prior Publication Data

US 2017/0155225 A1     Jun. 1, 2017

Related U.S. Application Data

(60) Provisional application No. 62/261,214, filed on Nov. 30, 2015.

(51) Int. Cl.
*G01C 3/08* (2006.01)
*G01S 17/10* (2006.01)
(Continued)

(52) U.S. Cl.
CPC ............ *G01S 17/105* (2013.01); *G01S 7/483* (2013.01); *G01S 7/4804* (2013.01); *G01S 7/484* (2013.01);
(Continued)

(58) Field of Classification Search
CPC .. H01S 3/06754; H01S 3/0007; H01S 3/0078; H01S 3/0085; H01S 3/0675; H01S 3/10023; G01S 7/483; G01S 17/02
See application file for complete search history.

(56) References Cited

U.S. PATENT DOCUMENTS

| 5,198,657 A | 3/1993 | Trost et al. |
| 5,696,788 A | 2/1997 | MacPherson |

(Continued)

FOREIGN PATENT DOCUMENTS

| JP | H05-232230 | 9/1993 |
| JP | 2012-510064 | 4/2012 |

(Continued)

OTHER PUBLICATIONS

U.S. Appl. No. 15/180,580, filed Jun. 13, 2016, Hall.
(Continued)

*Primary Examiner* — Samantha K Abraham

(57) ABSTRACT

In one embodiment, a laser system includes a seed laser configured to produce optical seed pulses. The laser system also includes a first fiber-optic amplifier configured to amplify the seed pulses by a first amplifier gain to produce a first-amplifier output that includes amplified seed pulses and amplified spontaneous emission (ASE). The laser system further includes a first optical filter configured to remove from the first-amplifier output an amount of the ASE. The laser system also includes a second fiber-optic amplifier configured to receive the amplified seed pulses from the first optical filter and amplify the received pulses by a second amplifier gain to produce output pulses. The output pulses have output-pulse characteristics that include: a pulse repetition frequency of less than or equal to 100 MHz; a pulse duration of less than or equal to 20 nanoseconds; and a duty cycle of less than or equal to 1%.

29 Claims, 25 Drawing Sheets

(51) Int. Cl.
| | |
|---|---|
| *G01S 17/42* | (2006.01) |
| *G01S 17/93* | (2006.01) |
| *G01S 7/481* | (2006.01) |
| *G01S 7/484* | (2006.01) |
| *G01S 17/89* | (2006.01) |
| *G01S 17/08* | (2006.01) |
| *H01S 3/067* | (2006.01) |
| *H01S 3/08* | (2006.01) |
| *H01S 3/094* | (2006.01) |
| *H01S 3/0941* | (2006.01) |
| *H01S 3/10* | (2006.01) |
| *H01S 3/11* | (2006.01) |
| *H01S 5/40* | (2006.01) |
| *G01S 7/48* | (2006.01) |
| *G01S 7/483* | (2006.01) |
| *G01S 17/02* | (2006.01) |
| *H01S 3/00* | (2006.01) |
| *G01S 17/00* | (2006.01) |
| *G01S 17/06* | (2006.01) |
| *G01S 17/88* | (2006.01) |
| *G01S 7/487* | (2006.01) |
| *H01S 5/00* | (2006.01) |
| *H01S 3/23* | (2006.01) |
| *H01S 3/16* | (2006.01) |
| *G01S 17/32* | (2006.01) |

(52) U.S. Cl.
CPC ........... *G01S 7/4811* (2013.01); *G01S 7/4814* (2013.01); *G01S 7/4815* (2013.01); *G01S 7/4816* (2013.01); *G01S 7/4817* (2013.01); *G01S 7/4818* (2013.01); *G01S 7/4861* (2013.01); *G01S 7/4863* (2013.01); *G01S 7/4865* (2013.01); *G01S 7/4873* (2013.01); *G01S 7/4876* (2013.01); *G01S 17/00* (2013.01); *G01S 17/02* (2013.01); *G01S 17/06* (2013.01); *G01S 17/08* (2013.01); *G01S 17/10* (2013.01); *G01S 17/102* (2013.01); *G01S 17/42* (2013.01); *G01S 17/88* (2013.01); *G01S 17/89* (2013.01); *G01S 17/936* (2013.01); *H01S 3/0007* (2013.01); *H01S 3/0078* (2013.01); *H01S 3/0085* (2013.01); *H01S 3/0675* (2013.01); *H01S 3/06733* (2013.01); *H01S 3/06754* (2013.01); *H01S 3/06758* (2013.01); *H01S 3/08086* (2013.01); *H01S 3/0941* (2013.01); *H01S 3/094003* (2013.01); *H01S 3/094042* (2013.01); *H01S 3/094076* (2013.01); *H01S 3/10023* (2013.01); *H01S 3/1106* (2013.01); *H01S 5/4012* (2013.01); *H01S 5/4087* (2013.01); *G01S 17/32* (2013.01); *H01S 3/1608* (2013.01); *H01S 3/2383* (2013.01); *H01S 5/0057* (2013.01); *H01S 5/0085* (2013.01); *H01S 2301/02* (2013.01)

(56) References Cited

U.S. PATENT DOCUMENTS

| | | | |
|---|---|---|---|
| 5,696,778 | A | 12/1997 | MacPherson |
| 5,867,305 | A | 2/1999 | Waarts et al. |
| 5,872,621 | A | 2/1999 | Wilkerson et al. |
| 5,892,575 | A | 4/1999 | Marino |
| 5,978,736 | A | 11/1999 | Greendale et al. |
| 6,449,384 | B2 | 9/2002 | Laumeyer et al. |
| 6,710,324 | B2 | 3/2004 | Hipp |
| 6,723,975 | B2 | 4/2004 | Saccomanno |
| 6,747,747 | B2 | 6/2004 | Hipp |
| 6,759,649 | B2 | 7/2004 | Hipp |
| 7,092,548 | B2 | 8/2006 | Laumeyer et al. |
| 7,209,221 | B2 | 4/2007 | Breed et al. |
| 7,345,271 | B2 | 3/2008 | Boehlau et al. |
| 7,443,903 | B2 | 10/2008 | Leonardo et al. |
| 7,532,311 | B2 | 5/2009 | Henderson et al. |
| 7,570,793 | B2 | 8/2009 | Lages et al. |
| 7,583,364 | B1 | 9/2009 | Mayor et al. |
| 7,649,920 | B2 | 1/2010 | Welford |
| 7,652,752 | B2 | 1/2010 | Fetzer et al. |
| 7,872,794 | B1 | 1/2011 | Minelly et al. |
| 7,902,570 | B2 | 3/2011 | Itzler et al. |
| 7,945,408 | B2 | 5/2011 | Dimsdale et al. |
| 7,969,558 | B2 | 6/2011 | Hall |
| 7,983,565 | B2 * | 7/2011 | Varshneya ............... G01S 7/481 398/118 |
| 7,995,796 | B2 | 8/2011 | Retterath et al. |
| 8,059,263 | B2 | 11/2011 | Haberer et al. |
| 8,072,663 | B2 | 12/2011 | O'Neill et al. |
| 8,081,301 | B2 | 12/2011 | Stann et al. |
| 8,138,849 | B2 | 3/2012 | West et al. |
| 8,279,420 | B2 | 10/2012 | Ludwig et al. |
| 8,280,623 | B2 | 10/2012 | Trepagnier et al. |
| 8,346,480 | B2 | 1/2013 | Trepagnier et al. |
| 8,364,334 | B2 | 1/2013 | Au et al. |
| 8,452,561 | B2 | 5/2013 | Dimsdale et al. |
| 8,541,744 | B1 | 9/2013 | Liu |
| 8,548,014 | B2 | 10/2013 | Fermann et al. |
| 8,625,080 | B2 | 1/2014 | Heizman et al. |
| 8,675,181 | B2 | 3/2014 | Hall |
| 8,723,955 | B2 | 5/2014 | Klehn et al. |
| 8,767,190 | B2 | 7/2014 | Hall |
| 8,796,605 | B2 | 8/2014 | Mordarski et al. |
| 8,804,787 | B1 | 8/2014 | Coleman et al. |
| 8,836,922 | B1 | 9/2014 | Pennecot et al. |
| 8,880,296 | B2 | 11/2014 | Breed |
| 8,896,818 | B2 | 11/2014 | Walsh et al. |
| 8,934,509 | B2 | 1/2015 | Savage-Leuchs et al. |
| 8,947,659 | B1 | 2/2015 | Baastians et al. |
| 9,000,347 | B2 | 4/2015 | Woodward et al. |
| 9,041,136 | B2 | 5/2015 | Chia |
| 9,048,370 | B1 | 6/2015 | Urmson et al. |
| 9,063,549 | B1 | 6/2015 | Pennecot et al. |
| 9,069,060 | B1 | 6/2015 | Zbrozek et al. |
| 9,074,878 | B2 | 7/2015 | Steffey et al. |
| 9,086,273 | B1 | 7/2015 | Gruver et al. |
| 9,086,481 | B1 | 7/2015 | Dowdall et al. |
| 9,091,754 | B2 | 7/2015 | d'Aligny |
| 9,103,669 | B2 | 8/2015 | Giacotto et al. |
| 9,121,703 | B1 | 9/2015 | Droz et al. |
| 9,160,140 | B2 | 10/2015 | Gusev et al. |
| 9,170,333 | B2 | 10/2015 | Mheen et al. |
| 9,199,641 | B2 | 12/2015 | Ferguson et al. |
| 9,213,085 | B2 | 12/2015 | Kanter |
| 9,239,260 | B2 | 1/2016 | Bayha et al. |
| 9,246,041 | B1 | 1/2016 | Clausen et al. |
| 9,285,464 | B2 | 3/2016 | Pennecot et al. |
| 9,285,477 | B1 | 3/2016 | Smith et al. |
| 9,297,901 | B2 | 3/2016 | Bayha et al. |
| 9,299,731 | B1 | 3/2016 | Lenius et al. |
| 9,304,154 | B1 | 4/2016 | Droz et al. |
| 9,304,203 | B1 | 4/2016 | Droz et al. |
| 9,304,316 | B2 | 4/2016 | Weiss et al. |
| 9,310,471 | B2 | 4/2016 | Sayyah et al. |
| 9,335,255 | B2 | 5/2016 | Retterath et al. |
| 9,360,554 | B2 | 6/2016 | Retterath et al. |
| 9,368,933 | B1 | 6/2016 | Nijjar et al. |
| 9,383,201 | B2 | 7/2016 | Jachman et al. |
| 9,383,445 | B2 | 7/2016 | Lu et al. |
| 9,383,753 | B1 | 7/2016 | Templeton et al. |
| 9,476,980 | B2 | 10/2016 | Thayer et al. |
| 9,823,353 | B2 | 11/2017 | Eichenholz et al. |
| 9,874,441 | B1 | 1/2018 | Hines et al. |
| 2002/0041435 | A1 | 4/2002 | Krummrich |
| 2002/0060784 | A1 | 5/2002 | Pack et al. |
| 2003/0043058 | A1 | 3/2003 | Jamieson et al. |
| 2005/0214690 | A1 | 9/2005 | Verheijden et al. |
| 2006/0231771 | A1 | 10/2006 | Lee et al. |
| 2006/0290920 | A1 | 12/2006 | Kämpchen et al. |

(56) References Cited

U.S. PATENT DOCUMENTS

| | | |
|---|---|---|
| 2007/0040121 A1 | 2/2007 | Kalayeh |
| 2007/0182949 A1 | 8/2007 | Niclass |
| 2008/0027591 A1 | 1/2008 | Lenser et al. |
| 2008/0074640 A1 | 3/2008 | Walsh et al. |
| 2008/0181266 A1 | 7/2008 | Deladurantaye et al. |
| 2008/0219300 A1 | 9/2008 | Krupkin et al. |
| 2008/0309913 A1 | 12/2008 | Fallon |
| 2009/0122295 A1 | 5/2009 | Eaton |
| 2009/0262760 A1 | 10/2009 | Krupkin et al. |
| 2009/0273770 A1 | 11/2009 | Bauhahn et al. |
| 2010/0034221 A1 | 2/2010 | Dragic |
| 2010/0091263 A1 | 4/2010 | Kumagai et al. |
| 2010/0128744 A1 | 5/2010 | Deladurantaye et al. |
| 2010/0231774 A1 | 9/2010 | Tashiro |
| 2011/0085149 A1 | 4/2011 | Nathan |
| 2012/0130588 A1 | 5/2012 | Hukkeri |
| 2012/0168605 A1 | 7/2012 | Milanovic |
| 2012/0206712 A1 | 8/2012 | Chang et al. |
| 2012/0227263 A1 | 9/2012 | Leclair et al. |
| 2012/0268105 A1 | 10/2012 | Mann et al. |
| 2013/0010820 A1 | 1/2013 | Curtis |
| 2013/0033742 A1 | 2/2013 | Rogers et al. |
| 2013/0175435 A1 | 7/2013 | Drader |
| 2013/0282208 A1 | 10/2013 | Mendez-Rodriguez et al. |
| 2014/0111805 A1 | 4/2014 | Albert et al. |
| 2014/0146303 A1 | 5/2014 | Mitchell et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0268098 A1 | 9/2014 | Schwartz |
| 2014/0268311 A1 | 9/2014 | Zhu |
| 2014/0293263 A1 | 10/2014 | Justice et al. |
| 2014/0293266 A1 | 10/2014 | Hsu et al. |
| 2014/0330479 A1 | 11/2014 | Dolgov |
| 2014/0376001 A1 | 12/2014 | Swanson |
| 2015/0109605 A1 | 4/2015 | Major, Jr. et al. |
| 2015/0116695 A1 | 4/2015 | Bartolome et al. |
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0219765 A1 | 8/2015 | Mead et al. |
| 2015/0260843 A1 | 9/2015 | Lewis |
| 2015/0285623 A1 | 10/2015 | Tachibana |
| 2015/0301182 A1 | 10/2015 | Geiger et al. |
| 2015/0316415 A1* | 11/2015 | Islam .................. G01J 3/453 250/338.4 |
| 2015/0323654 A1 | 11/2015 | Jachmann et al. |
| 2015/0378023 A1 | 12/2015 | Royo et al. |
| 2015/0378241 A1 | 12/2015 | Eldada |
| 2016/0025842 A1 | 1/2016 | Anderson et al. |
| 2016/0047901 A1 | 2/2016 | Pacala et al. |
| 2016/0047904 A1 | 2/2016 | Mellot |
| 2016/0049765 A1 | 2/2016 | Eldada |
| 2016/0146926 A1 | 5/2016 | Jungwirth |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2017/0155225 A1 | 6/2017 | Villeneuve et al. |
| 2017/0201059 A1 | 7/2017 | Villeneuve et al. |
| 2017/0299721 A1 | 10/2017 | Eichenholz et al. |
| 2019/0018143 A1 | 1/2019 | Thayer et al. |

FOREIGN PATENT DOCUMENTS

| | | |
|---|---|---|
| WO | 2015/077614 | 5/2015 |
| WO | 2017/095817 | 6/2017 |

OTHER PUBLICATIONS

Search Report and Written Opinion in corresponding PCT Application No. PCT/US2016/064020 dated Apr. 4, 2017, 37 pgs.
Non-Final Office Action dated Apr. 23, 2019 for U.S. Appl. No. 15/363,726.
Non-Final Office Action dated May 23, 2017 for U.S. Appl. No. 15/470,730.
Non-Final Office Action dated Jun. 22, 2017 for U.S. Appl. No. 15/470,694.
Non-Final Office Action dated Mar. 5, 2019 for U.S. Appl. No. 15/364,085.
Non-Final Office Action dated Aug. 14, 2017 for U.S. Appl. No. 15/470,708.
Non-Final Office Action dated Jul. 13, 2017 for U.S. Appl. No. 15/470,718.
Non-Final Office Action dated Jun. 20, 2017 for U.S. Appl. No. 15/470,735.
Non-Final Office Action dated Mar. 20, 2018 for U.S. Appl. No. 15/859,170.
Final Office Action dated Aug. 12, 2019 for U.S. Appl. No. 15/363,726.
Notice of Reasons for Rejection for JP Application No. 2018-547860 dated Aug. 20, 2019.
English Translation of Notice of Reasons for Rejection for JP Application No. 2018-547860 dated Aug. 20, 2019.
Extended European Search Report dated Oct. 25, 2019 for EP Application No. 16871363.4.

* cited by examiner

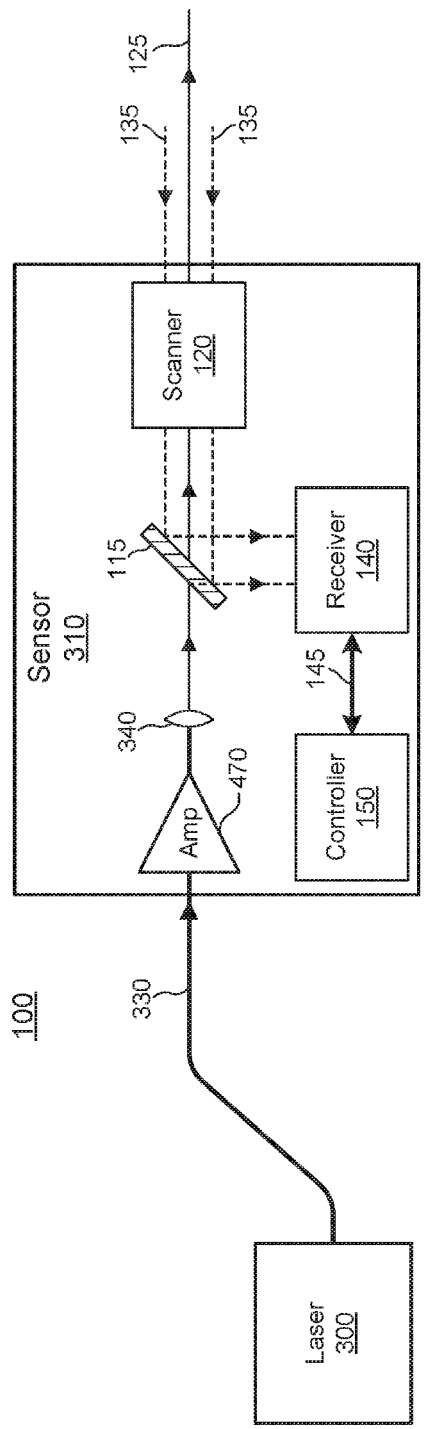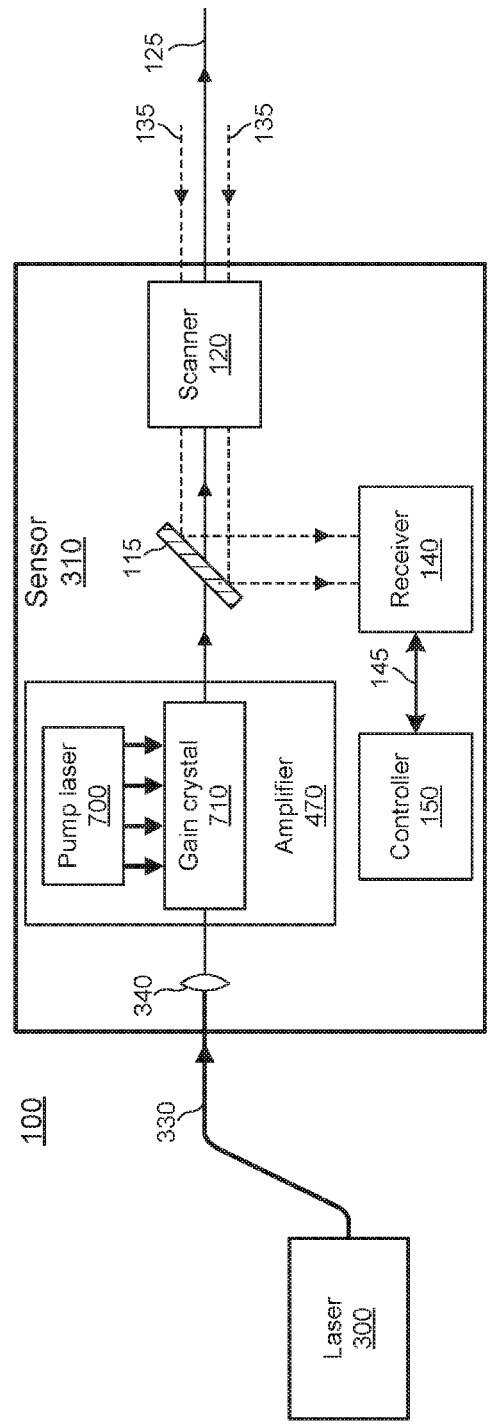

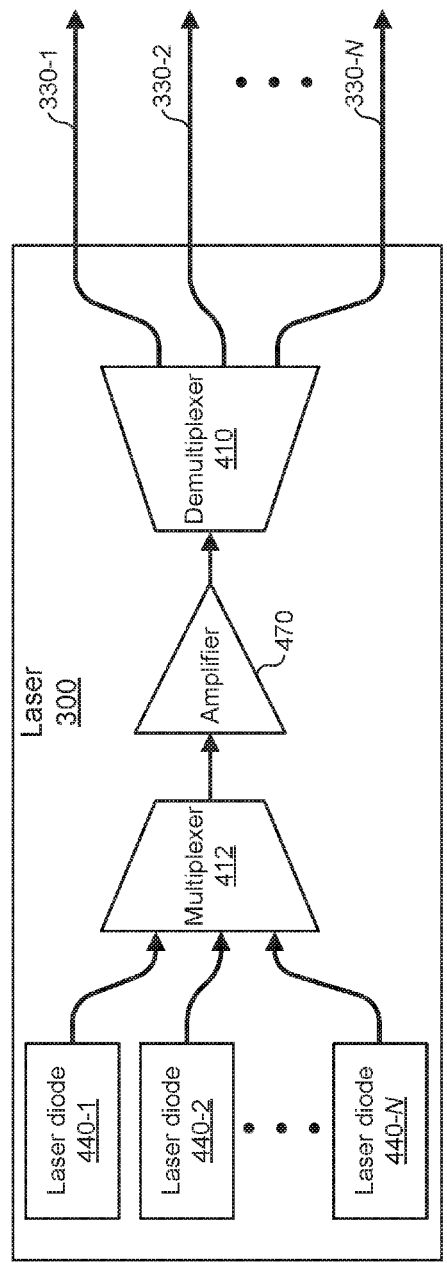
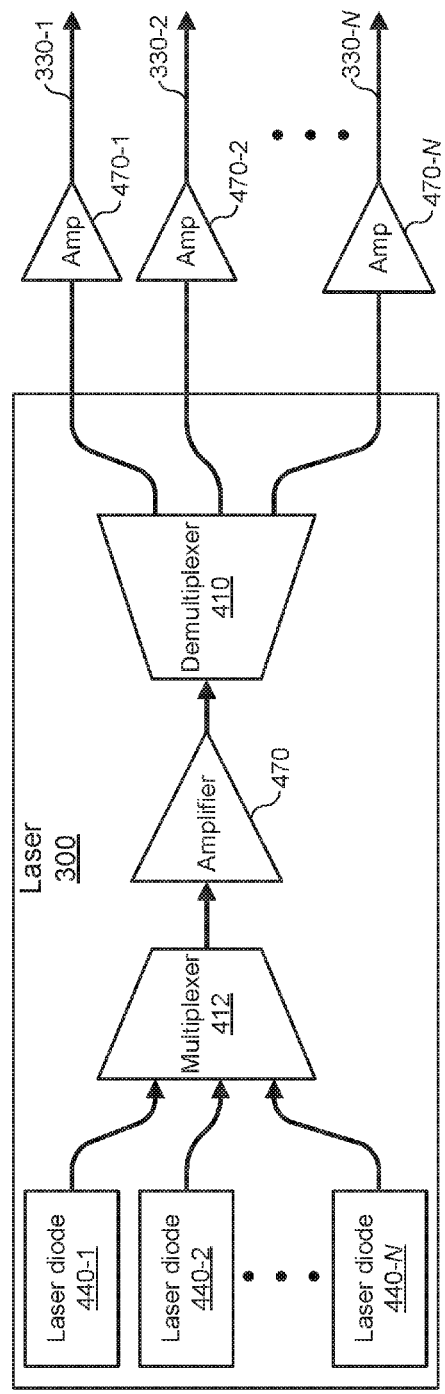

PULSED LASER FOR LIDAR SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. Namely, this application claims the benefit, under 35 U.S.C. § 119(e), of U.S. Provisional Patent Application 62/261,214, filed Nov. 30, 2015, the entirety of which is incorporated herein by reference.

BACKGROUND

Field

This disclosure generally relates to lidar systems.

Description of the Related Art

Light detection and ranging (lidar) is a technology that can be used to measure distances to remote targets. Typically, a lidar system includes a light source and a detector. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the detector. The system determines the distance to the target based on one or more characteristics associated with the returned light. For example, the system may determine the distance to the target based on the time of flight of a returned light pulse.

SUMMARY

In some embodiments, a laser system comprises: a seed laser configured to produce optical seed pulses; a first fiber-optic amplifier configured to amplify the seed pulses by a first amplifier gain to produce a first-amplifier output that comprises amplified seed pulses and amplified spontaneous emission (ASE); a first optical filter configured to remove from the first-amplifier output an amount of the ASE; and a second fiber-optic amplifier configured to receive the amplified seed pulses from the first optical filter and amplify the received pulses by a second amplifier gain to produce output pulses, wherein the output pulses have output-pulse characteristics comprising: a pulse repetition frequency of less than or equal to 100 MHz; a pulse duration of less than or equal to 20 nanoseconds; and a duty cycle of less than or equal to 1%.

BRIEF DESCRIPTION OF THE DRAWINGS

FIG. 25 illustrates an example lidar system where the sensor head includes an amplifier coupled to an output collimator.

FIG. 26 illustrates an example lidar system where the sensor head includes a free-space amplifier.

FIG. 29 illustrates an example laser that includes multiple laser diodes, a multiplexer, an amplifier, and a demultiplexer.

FIG. 30 illustrates an example laser where the laser is coupled to multiple optical links that each include an amplifier.

DETAILED DESCRIPTION

Figure 1:
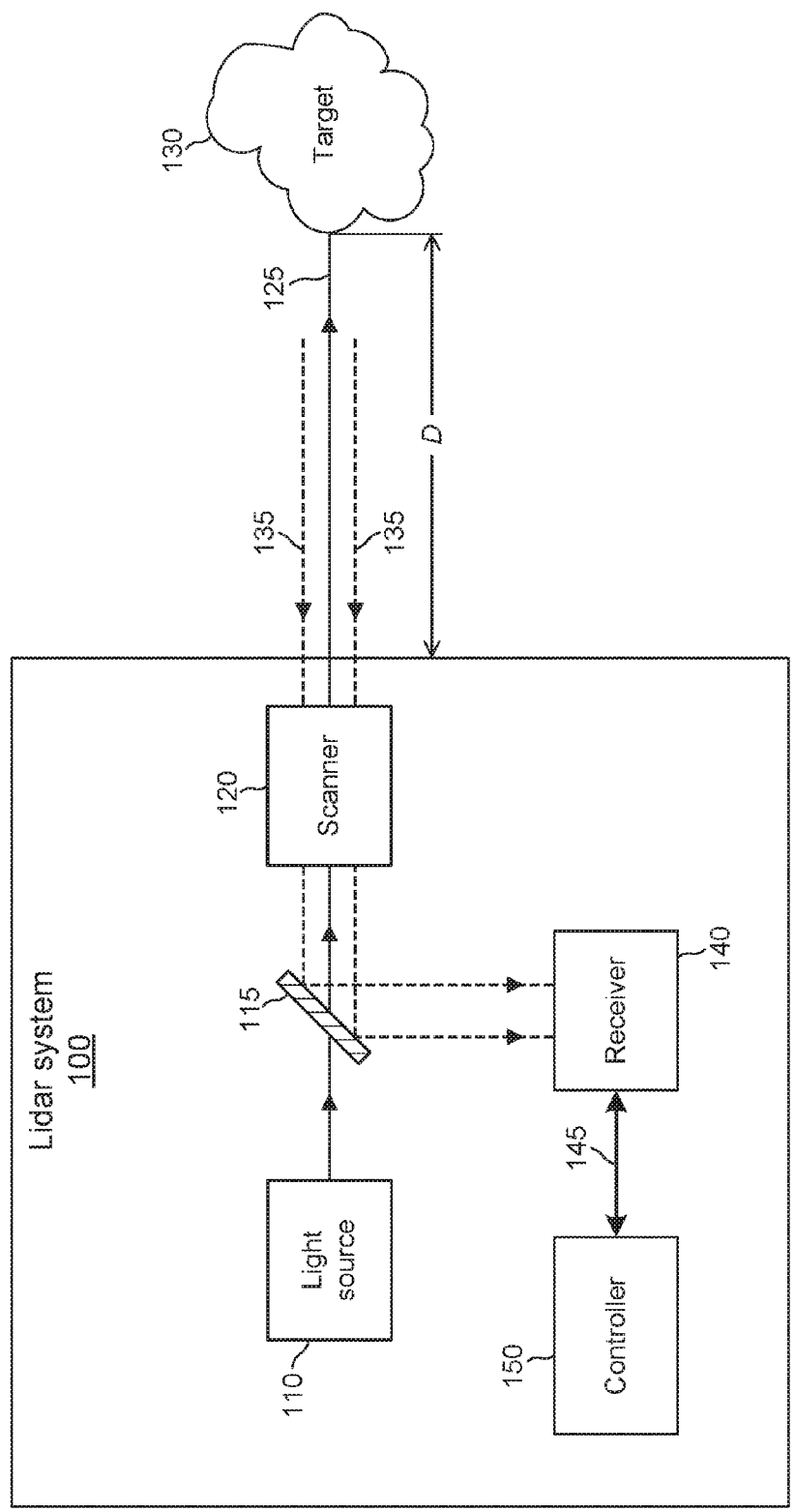
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, or a laser detection and ranging (LADAR or ladar) system. In particular embodiments, a lidar system 100 may include a light source 110, mirror 115, scanner 120, receiver 140, or controller 150. The light source 110 may be, for example, a laser which emits light having a particular operating wavelength in the infrared, visible, or ultraviolet portions of the electromagnetic spectrum. As an example, light source 110 may include a laser with an operating wavelength between approximately 1.2 μm and 1.7 μm. The light source 110 emits an output beam of light 125 which may be continuous-wave, pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is directed by mirror 115 to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (μJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, or 1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135. This electrical signal 145 may be sent to controller 150. In particular embodiments, controller 150 may include a processor, computing system (e.g., an ASIC or FPGA), or other suitable circuitry configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents the round-trip time for light to travel from the lidar system 100 to the target 130 and back to the lidar system 100), then the distance D from the target 130 to the lidar system 100 may be expressed as $D = c \cdot T/2$, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 μs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed laser. As an example, light source 110 may be a pulsed laser that produces pulses of light with a pulse duration or pulse width of approximately 10 picoseconds (ps) to 20 nanoseconds (ns). As another example, light source 110 may be a pulsed laser that produces pulses with a pulse duration of approximately 200-400 ps. As another example, light source 110 may be a pulsed laser that produces pulses at a pulse repetition frequency of approximately 100 kHz to 5 MHz or a pulse period (e.g., a time between consecutive pulses) of approximately 200 ns to 10 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency that can be varied from approximately 700 kHz to 3 MHz.

In particular embodiments, light source 110 may produce a free-space output beam 125 having any suitable average optical power, and the output beam 125 may have optical pulses with any suitable pulse energy or peak optical power. As an example, output beam 125 may have an average power of approximately 1 mW, 10 mW, 100 mW, 1 W, 10 W, or any other suitable average power. As another example, output beam 125 may include pulses with a pulse energy of approximately 0.1 μJ, 1 μJ, 10 μJ, 100 μJ, 1 mJ, or any other suitable pulse energy. As another example, output beam 125 may include pulses with a peak power of approximately 10 W, 100 W, 1 kW, 5 kW, 10 kW, or any other suitable peak power. An optical pulse with a duration of 400 ps and a pulse energy of 1 µJ has a peak power of approximately 2.5 kW. If the pulse repetition frequency is 500 kHz, then the average power of an output beam 125 with 1-µJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, or a vertical-cavity surface-emitting laser (VCSEL). As an example, light source 110 may include an aluminum-gallium-arsenide (AlGaAs) laser diode, an indium-gallium-arsenide (InGaAs) laser diode, or an indium-gallium-arsenide-phosphide (InGaAsP) laser diode. In particular embodiments, light source 110 may include a pulsed laser diode with a peak emission wavelength of approximately 1400-1600 nm. As an example, light source 110 may include a laser diode that is current modulated to produce optical pulses. In particular embodiments, light source 110 may include a pulsed laser diode followed by one or more optical-amplification stages. As an example, light source 110 may be a fiber-laser module that includes a current-modulated laser diode with a peak wavelength of approximately 1550 nm followed by a single-stage or a multi-stage erbium-doped fiber amplifier (EDFA). As another example, light source 110 may include a continuous-wave (CW) or quasi-CW laser diode followed by an external optical modulator (e.g., an electro-optic modulator), and the output of the modulator may be fed into an optical amplifier.

In particular embodiments, an output beam of light 125 emitted by light source 110 may be a collimated optical beam with any suitable beam divergence, such as for example, a divergence of approximately 0.1 to 3.0 milliradian (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a divergence of 1 mrad may have a beam diameter or spot size of approximately 10 cm at a distance of 100 m from lidar system 100. In particular embodiments, output beam 125 may be an astigmatic beam or may have a substantially elliptical cross section and may be characterized by two divergence values. As an example, output beam 125 may have a fast axis and a slow axis, where the fast-axis divergence is greater than the slow-axis divergence. As another example, output beam 125 may be an astigmatic beam with a fast-axis divergence of 2 mrad and a slow-axis divergence of 0.5 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce linearly polarized light, and lidar system 100 may include a quarter-wave plate that converts this linearly polarized light into circularly polarized light. The circularly polarized light may be transmitted as output beam 125, and lidar system 100 may receive input beam 135, which may be substantially or at least partially circularly polarized in the same manner as the output beam 125 (e.g., if output beam 125 is right-hand circularly polarized, then input beam 135 may also be right-hand circularly polarized). The input beam 135 may pass through the same quarter-wave plate (or a different quarter-wave plate) resulting in the input beam 135 being converted to linearly polarized light which is orthogonally polarized (e.g., polarized at a right angle) with respect to the linearly polarized light produced by light source 110. As another example, lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

In particular embodiments, lidar system 100 may include one or more optical components configured to condition, shape, filter, modify, steer, or direct the output beam 125 or the input beam 135. As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In particular embodiments, lidar system 100 may include a telescope, one or more lenses, or one or more mirrors to expand, focus, or collimate the output beam 125 to a desired beam diameter or divergence. As an example, the lidar system 100 may include one or more lenses to focus the input beam 135 onto an active region of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include mirror 115 (which may be a metallic or dielectric mirror), and mirror 115 may be configured so that light beam 125 passes through the mirror 115. As an example, mirror 115 (which may be referred to as an overlap mirror, superposition mirror, or beam-combiner mirror) may include a hole, slot, or aperture which output light beam 125 passes through. As another example, mirror 115 may be configured so that at least 80% of output beam 125 passes through mirror 115 and at least 80% of input beam 135 is reflected by mirror 115. In particular embodiments, mirror 115 may provide for output beam 125 and input beam 135 to be substantially coaxial so that the two beams travel along substantially the same optical path (albeit in opposite directions).

In particular embodiments, lidar system 100 may include a scanner 120 to steer the output beam 125 in one or more directions downrange. As an example, scanner 120 may include one or more scanning mirrors that are configured to rotate, tilt, pivot, or move in an angular manner about one or more axes. In particular embodiments, a flat scanning mirror may be attached to a scanner actuator or mechanism which scans the mirror over a particular angular range. As an example, scanner 120 may include a galvanometer scanner, a resonant scanner, a piezoelectric actuator, a polygonal scanner, a rotating-prism scanner, a voice coil motor, a DC motor, a stepper motor, or a microelectromechanical systems (MEMS) device, or any other suitable actuator or mechanism. In particular embodiments, scanner 120 may be configured to scan the output beam 125 over a 5-degree angular range, 20-degree angular range, 30-degree angular range, 60-degree angular range, or any other suitable angular range. As an example, a scanning mirror may be configured to periodically rotate over a 15-degree range, which results in the output beam 125 scanning across a 30-degree range (e.g., a Θ-degree rotation by a scanning mirror results in a 2Θ-degree angular scan of output beam 125). In particular embodiments, a field of regard (FOR) of a lidar system 100 may refer to an area or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first mirror and a second mirror, where the first mirror directs the output beam 125 toward the second mirror, and the second mirror directs the output beam 125 downrange. As an example, the first mirror may scan the output beam 125 along a first direction, and the second mirror may scan the output beam 125 along a second direction that is substantially orthogonal to the first direction. As another example, the first mirror may scan the output beam 125 along a substantially horizontal direction, and the second mirror may scan the output beam 125 along a substantially vertical direction (or vice versa). In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern (which may be referred to as an optical scan pattern, optical scan path, or scan path) may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternately, the pixels may have a particular nonuniform distribution (e.g., the pixels may be distributed across all or a portion of the 60°×20° FOR, and the pixels may have a higher density in one or more particular regions of the 60°×20° FOR).

In particular embodiments, receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). Receiver 140 may have an active region or an avalanche-multiplication region that includes silicon, germanium, or InGaAs. The active region of receiver 140 may have any suitable size, such as for example, a diameter or width of approximately 50-500 µm. In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel. A collection of pixels captured in succession (which may be referred to as a depth map, a point cloud, or a frame) may be rendered as an image or may be analyzed to identify or detect objects or to determine a shape or distance of objects within the FOR. As an example, a depth map may cover a field of regard that extends 60° horizontally and 15° vertically, and the depth map may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

In particular embodiments, one or more lidar systems 100 may be integrated into a vehicle. As an example, multiple lidar systems 100 may be integrated into a car to provide a complete 360-degree horizontal FOR around the car. As another example, 6-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective distances or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Figure 2:
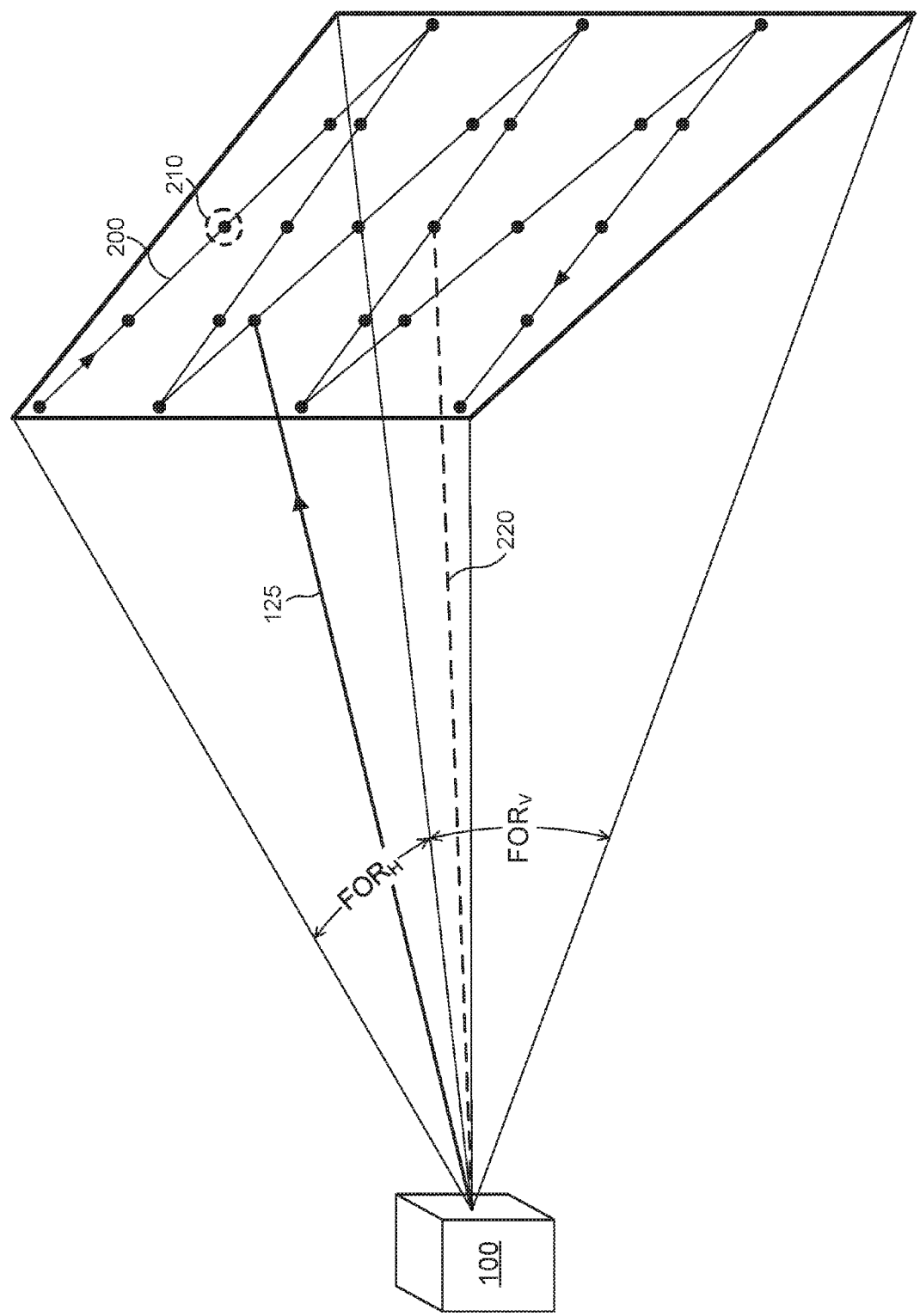
FIG. 2 illustrates an example scan pattern produced by a lidar system.

FIG. 2 illustrates an example scan pattern 200 produced by a lidar system 100. In particular embodiments, a lidar system 100 may be configured to scan output optical beam 125 along one or more particular scan patterns 200. In particular embodiments, a scan pattern 200 may have any suitable horizontal FOR ($FOR_H$) and any suitable vertical FOR ($FOR_V$). For example, a scan pattern 200 may have a field of regard (e.g., $FOR_H \times FOR_V$) of 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°. In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses and one or more corresponding distance measurements. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
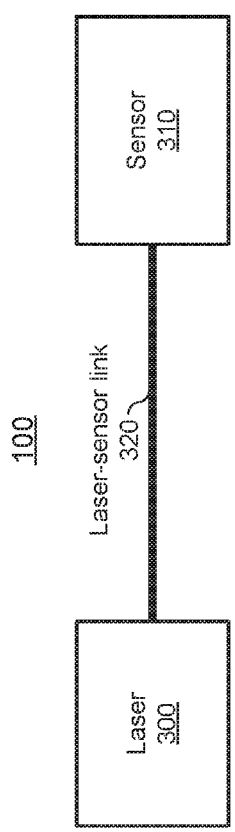
FIG. 3 illustrates an example lidar system that includes a laser, sensor, and laser-sensor link.

FIG. 3 illustrates an example lidar system 100 that includes a laser 300, sensor 310, and laser-sensor link 320. In particular embodiments, laser 300 may be configured to emit pulses of light and may be referred to as a laser system, laser head, or light source. In particular embodiments, laser 300 may include, may be part of, may be similar to, or may be substantially the same as light source 110 illustrated in FIG. 1 and described above. Additionally, the lidar system 100 in FIG. 3 may include components similar to those of lidar system 100 in FIG. 1 (e.g., mirror 115, scanner 120, receiver 140, or controller 150). In the example of FIG. 3, laser 300 is coupled to a remotely located sensor 310 by a laser-sensor link 320 (which may be referred to as a link). In particular embodiments, sensor 310 may be referred to as a sensor head and may include a mirror 115, scanner 120, receiver 140, or controller 150. As an example, laser 300 may include a pulsed laser diode (e.g., a pulsed DFB laser) followed by an optical amplifier, and light from the laser 300 may be conveyed by an optical fiber of laser-sensor link 320 to a scanner 120 in a remotely located sensor 310. A length of laser-sensor link 320 or a separation distance between laser 300 and sensor 310 may be approximately 0.5 m, 1 m, 2 m, 5 m, 10 m, 20 m, 50 m, 100 m, or any other suitable distance.

Figure 4:
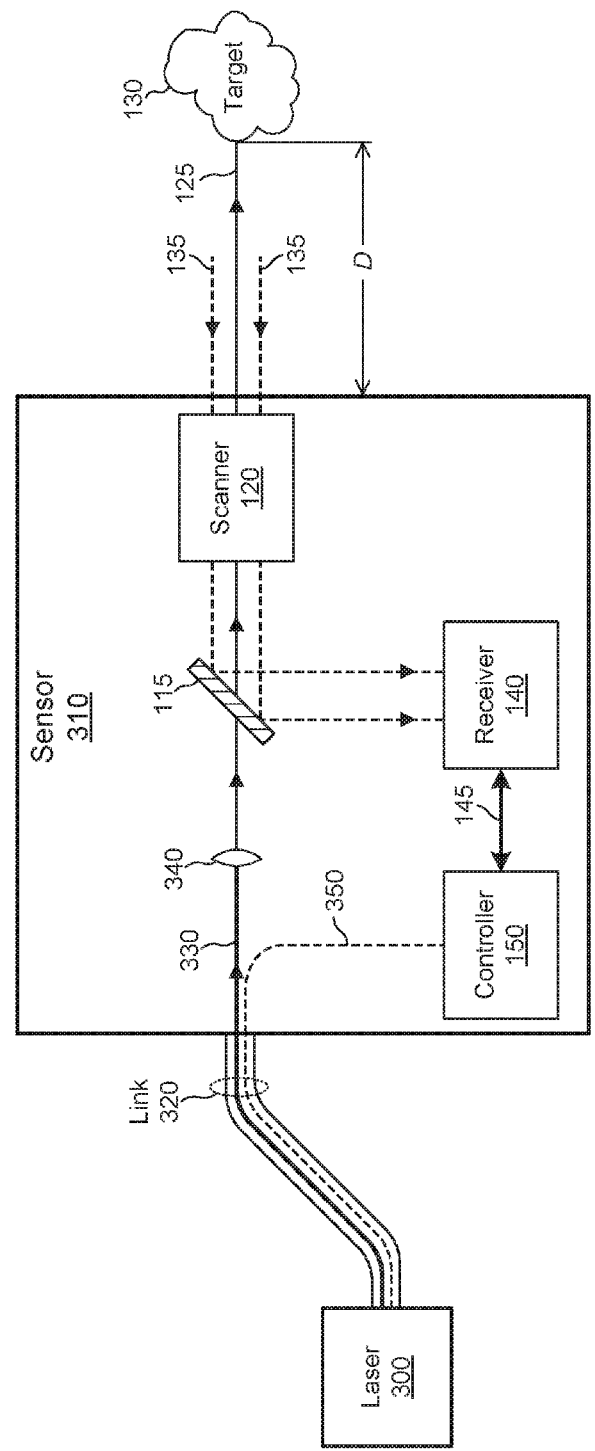
FIG. 4 illustrates an example lidar system where the laser-sensor link includes an optical link and an electrical link coupled between the laser and sensor.

FIG. 4 illustrates an example lidar system 100 where the laser-sensor link 320 includes an optical link 330 and an electrical link 350 coupled between the laser 300 and the sensor 310. The lidar system 100 in FIG. 4 includes a light source (e.g., laser 300) that is located remotely from a sensor head 310, where the sensor head 310 includes other lidar-system components (e.g., output collimator 340, mirror 115, scanner 120, receiver 140, and controller 150). In particular embodiments, a laser-sensor link 320 may refer to a cable harness, conduit, or assembly that provides an optical or electrical connection between a light source (e.g., laser 300) and a sensor head 310. A laser-sensor link 320 may have any suitable length (e.g., a length greater than or equal to 0.5 m, 1 m, 2 m, 5 m, 10 m, 20 m, 50 m, or 100 m) and may be used to send optical or electrical signals from laser 300 to sensor 310 or from sensor 310 to laser 300. A laser-sensor link 320 may include any suitable number of optical links 330 (e.g., 0, 1, 2, 3, 5, or 10 optical links 330) or any suitable number of electrical links 350 (e.g., 0, 1, 2, 3, 5, or 10 electrical links 350). In FIG. 4, the laser-sensor link 320 includes one optical link 330 from laser 300 to output collimator 340 and one electrical link 350 that connects laser 300 and controller 150. Each optical link 330 and each electrical link 350 of a laser-sensor link 320 may have any suitable length, such as for example, a length of approximately 0.5 m, 1 m, 2 m, 5 m, 10 m, 20 m, 50 m, or 100 m. As an example, laser 300 and sensor 310 may be located approximately 4 meters apart, and a fiber-optic cable 330 that conveys light from laser 300 to sensor 310 may have a length of greater than or equal to 4 meters.

In particular embodiments, an optical link 330 may include optical fiber (which may be referred to as fiber-optic cable or fiber) that conveys, carries, transports, or transmits light between a laser 300 and a sensor 310. As an example, optical link 330 (which may be referred to as a fiber-optic link or a fiber link) may include any suitable type of optical fiber, such as for example, single-mode (SM) fiber, multi-mode (MM) fiber, large-mode-area (LMA) fiber, polarization-maintaining (PM) fiber, photonic-crystal or photonic-bandgap fiber, gain fiber (e.g., rare-earth-doped optical fiber for use in an optical amplifier), or any suitable combination thereof. As another example, optical link 330 may include a glass SM fiber with a core diameter of approximately 8 μm and a cladding diameter of approximately 125 μm. As another example, optical link 330 may include a photonic-crystal fiber or a photonic-bandgap fiber in which light is confined or guided by an arrangement of air holes distributed along the length of a glass fiber. In particular embodiments, an optical link 330 may include a fiber-optic cable that is coupled to, attached to, or terminated at an output collimator 340. In FIG. 4, optical link 330 conveys optical pulses (which are emitted by laser 300) to sensor head 310, and the optical link 330 is terminated at output collimator 340. The output collimator 340 may include a lens or a fiber-optic collimator that receives light from a fiber-optic cable 330 and produces a free-space optical beam 125. In FIG. 4, output collimator 340 receives optical pulses conveyed from laser 300 by optical link 330 and produces a free-space optical beam 125 that includes the optical pulses. The output collimator 340 directs the free-space optical beam 125 through mirror 115 and to scanner 120.

In particular embodiments, an electrical link 350 may include electrical wire or cable that conveys or transmits electrical power or one or more electrical signals between laser 300 and sensor 310. In particular embodiments, an electrical link 350 may convey electrical power to sensor 310 from laser 300, or vice versa. As an example, laser 300 may include a power supply or a power conditioner that provides electrical power to the laser 300, and additionally, the power supply or power conditioner may provide power to one or more components of sensor 310 (e.g., scanner 120, receiver 140, or controller 150) via one or more electrical links 350.

In particular embodiments, electrical link 350 may convey one or more electrical signals from laser 300 to sensor 310, or vice versa. The electrical signals may include data or information in the form of an analog or digital signal. As an example, an electrical link 350 may include a coaxial cable or twisted-pair cable configured to transmit an analog or digital signal from receiver 140 or controller 150 to a controller or processor located in laser 300. As another example, an electrical link 350 may convey instructions or a drive signal for scanner 120 from a controller or processor located in laser 300 to sensor 310. As another example, all or part of a controller or processor may be located in laser 300, and one or more electrical links 350 may convey signals to or from scanner 120, receiver 140, or controller 150 located in sensor 310. As another example, an electrical link 350 may provide an interlock signal from sensor 310 to laser 300. If controller 150 detects a fault condition indicating a problem with the lidar system 100, the controller 150 may change a voltage on an interlock line (e.g., from 5 V to 0 V) indicating that laser 300 should shut down, stop emitting light, or reduce the power or energy of emitted light. A fault condition may be triggered by a failure of scanner 120, by a failure of receiver 140, or by a person or object coming within a threshold distance of sensor 310 (e.g., within 0.1 m, 0.5 m, 1 m, 5 m, or any other suitable distance).

In particular embodiments, sensor head 310 may include a scanner 120 configured to scan pulses of light across a field of regard of the sensor head 310. The scanned pulses of light may include pulses of light emitted by laser 300 and conveyed from the laser 300 to the sensor 310 by fiber-optic cable 330 of optical link 320. In particular embodiments, sensor head 310 may include a receiver 140 configured to detect at least a portion of the scanned pulses of light scattered or reflected by a target 130 located downrange from the sensor head 310. The target 130 may be at least partially contained within a field of regard of the sensor head 310 and located a distance D from the sensor head 310 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from a sensor head 310 of the lidar system 100. For a lidar system 100 with a 200-m maximum range ($R_{MAX}$=200 m), the time of flight corresponding to the maximum range is approximately $2 \cdot R_{MAX}/c \cong 1.33$ μs.

In particular embodiments, lidar system 100 may include one or more processors (e.g., controller 150) configured to determine a distance D from sensor 310 to a target 130 based at least in part on a time of flight for a pulse of light to travel from the sensor 310 to the target 130 and back to the sensor 310. As an example, a controller 150 may be located in laser 300 or in sensor 310, or parts of a controller 150 may be distributed between laser 300 and sensor 310. As another example, lidar system 100 may include two or more processors (e.g., one processor may be located in laser 300 and another processor may be located in sensor 310). A time-of-flight value or a distance from sensor 310 to target 130 may be determined by a controller 150 located in laser 300 or sensor 310. Alternately, a time-of-flight value or a distance to target 130 may be determined by a combination of devices located in laser 300 and sensor 310. As an example, each sensor head 310 of a lidar system 100 may include electronics (e.g., an electronic filter, transimpedance amplifier, threshold detector, or time-to-digital (TDC) converter) configured to receive or process a signal from receiver 140 or from an APD or SPAD of receiver 140. Additionally, laser 300 may include processing electronics configured to determine a time-of-flight value or a distance to target 130 based on a signal received from a sensor head 310 via an electrical link 350.

A lidar system 100 as described or illustrated herein may also include various elements described or illustrated in U.S. Provisional Patent Application No. 62/243,633, filed Oct. 19, 2015 and entitled "Lidar System with Improved Signalto-Noise Ratio in the Presence of Solar Background Noise" or U.S. Provisional Patent Application No. 62/251,672, filed Nov. 5, 2015 and entitled "Lidar System with Improved Scanning Speed for High-Resolution Depth Mapping," each of which is incorporated herein by reference.

Figure 5:
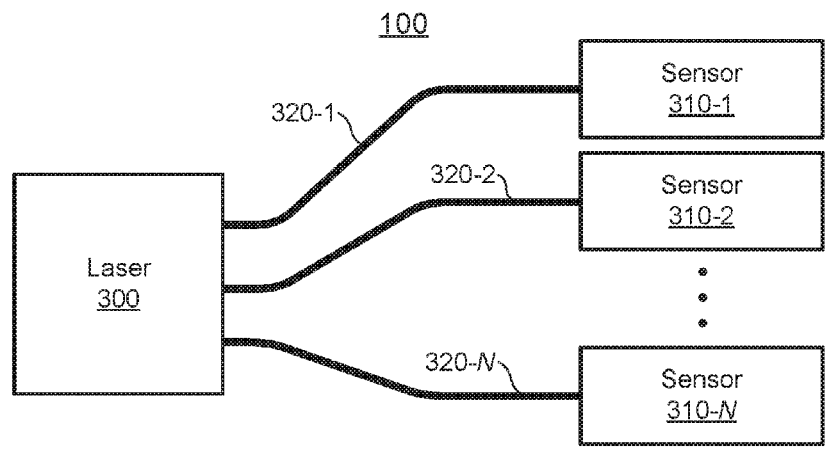
FIG. 5 illustrates an example lidar system with a laser coupled to multiple sensor heads by multiple respective laser-sensor links.

FIG. 5 illustrates an example lidar system 100 with a laser 300 coupled to multiple sensor heads (310-1, 310-2, ..., 310-N) by multiple respective laser-sensor links (320-1, 320-2, ..., 320-N). In particular embodiments, each laser-sensor link 320 may couple laser 300 to a corresponding sensor head 310, and each laser-sensor link 320 may include an optical link 330 configured to convey pulses of light from laser 300 to the corresponding sensor head 310. In FIG. 5, the laser-sensor links 320-1 through 320-N may each include a fiber-optic cable having a length greater than or equal to 1 meter. In particular embodiments, a lidar system 100 may include a laser 300 coupled to 1, 2, 4, 6, 8, 10, 20, or any other suitable number of sensor heads 310. In FIG. 5, lidar system 100 includes N laser-sensor links 320 which couple laser 300 to N respective sensor heads 310. In FIG. 5, laser-sensor link 320-1 couples laser 300 to sensor 310-1, laser-sensor link 320-2 couples laser 300 to sensor 310-2, and laser-sensor link 320-N couples laser 300 to sensor 310-N. In particular embodiments, each laser-sensor link 320 may be configured to convey at least a portion of pulses of light emitted by laser 300 to a corresponding sensor head 310. As an example, in FIG. 5, lidar system 100 may include six laser-sensor links 320 and six sensors 310 (e.g., N=6), and each pulse emitted by laser 300 may be split between each of the six sensor heads 310. As another example, each pulse emitted by laser 300 may be directed to a particular sensor head so that each sensor head receives one out of every six pulses emitted by laser 300 (e.g., the $1^{st}$, $7^{th}$, $13^{th}$, ... pulses may be conveyed to sensor 310-1; the $2^{nd}$, $8^{th}$, $14^{th}$, ... pulses may be conveyed to sensor 310-2; etc.).

Figure 6:
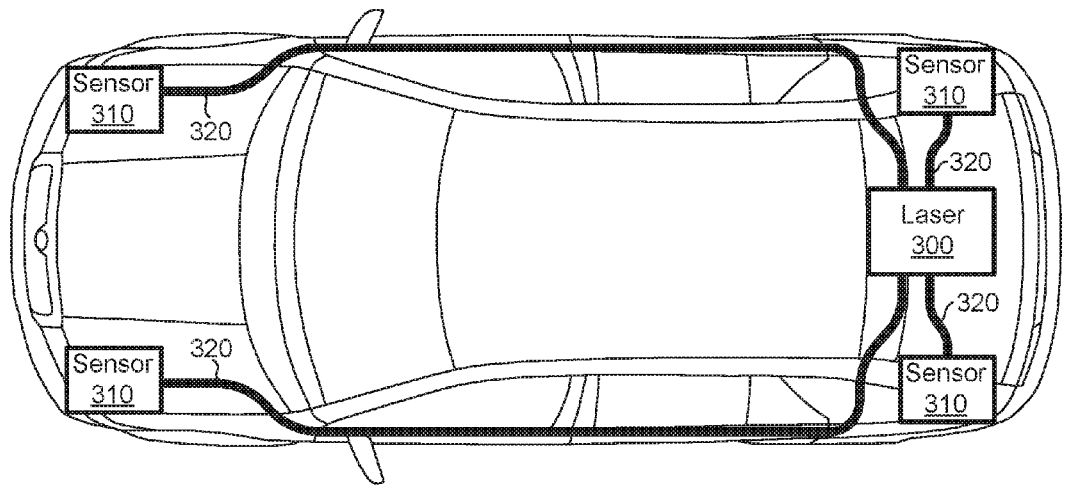
FIG. 6 illustrates an example vehicle with a lidar system that includes a laser with multiple sensor heads coupled to the laser by multiple laser-sensor links.

FIG. 6 illustrates an example vehicle with a lidar system that includes a laser 300 with multiple sensor heads 310 coupled to the laser 300 by multiple laser-sensor links 320. In particular embodiments, each laser-sensor link 320 may include one or more optical links 330 or one or more electrical links 350. As an example, each laser-sensor link 320 may include an optical link 330 configured to convey at least a portion of the pulses of light emitted by laser 300 to a corresponding sensor head 310. Additionally, each sensor head 310 may include a scanner 120 configured to scan the pulses of light conveyed from the laser 300 to the sensor head 310 by the corresponding optical link 330. As another example, each laser-sensor link 320 may include one or more electrical links 350 that convey electrical power or signals between laser 300 and a corresponding sensor head 310.

In particular embodiments, a lidar system 100 may be incorporated into a vehicle, and sensor heads 310 may be positioned or oriented to provide a greater than or equal to 30-degree view of an environment around the vehicle. As an example, a lidar system 100 with multiple sensor heads 310 may provide a horizontal field of regard around a vehicle of approximately 30°, 45°, 60°, 90°, 120°, 180°, 270°, or 360°. Each sensor head 310 may be attached to or incorporated into a bumper, fender, grill, side panel, spoiler, roof, headlight assembly, taillight assembly, rear-view mirror assembly, hood, trunk, window, or any other suitable part of a vehicle. In the example of FIG. 6, four sensor heads 310 are positioned at or near the four corners of the vehicle (e.g., the sensor heads may be incorporated into a light assembly, side panel, bumper, or fender), and laser 300 may be located within the vehicle (e.g., in or near the trunk). The four sensor heads 310 may each provide a 90° to 120° horizontal field of regard (FOR), and the four sensor heads 310 may be oriented so that together they provide a complete 360-degree view around the vehicle. As another example, a lidar system 100 may include six sensor heads 310 positioned on or around a vehicle, where each sensor head 310 provides a 60° to 90° horizontal FOR. As another example, a lidar system 100 may include eight sensor heads 310, and each sensor head 310 may provide a 45° to 60° horizontal FOR. As another example, a lidar system 100 may include six sensor heads 310, where each sensor head 310 provides a 70° horizontal FOR with an overlap between adjacent FORs of approximately 10°. As another example, a lidar system 100 may include two sensor heads 310 which together provide a forward-facing horizontal FOR of greater than or equal to 30°. In particular embodiments, data from each of multiple sensor heads 310 may be combined or stitched together to generate a point cloud that covers a greater than or equal to 30-degree horizontal view around a vehicle. As an example, laser 300 may include a controller or processor that receives data from each sensor head 310 (e.g., via a corresponding electrical link 350) and processes the received data to construct a point cloud covering a 360-degree horizontal view around a vehicle or to determine distances to one or more targets 130.

Figure 7:
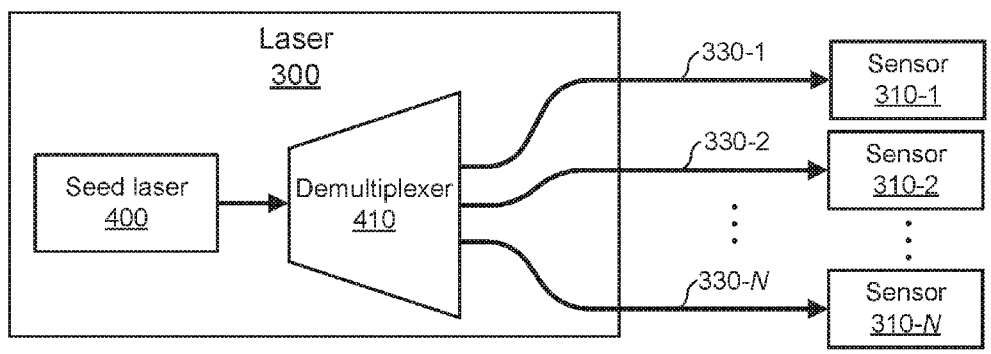
FIG. 7 illustrates an example laser with a seed laser and a demultiplexer that distributes light from the seed laser to multiple optical links.

FIG. 7 illustrates an example laser 300 with a seed laser 400 and a demultiplexer 410 that distributes light from the seed laser to multiple optical links (330-1, 330-2, ..., 330-N). Each optical link conveys light received from the demultiplexer 410 to a corresponding sensor head (e.g., optical link 330-1 conveys light to sensor head 310-1, etc.). In particular embodiments, demultiplexer 410 may include an optical-power splitter, an optical switch, a wavelength demultiplexer, or any suitable combination thereof. In particular embodiments, seed laser 400 may produce optical pulses, and laser 300 may also include one or more optical amplifiers (not illustrated in FIG. 7) to amplify the seed-laser pulses. In particular embodiments, a lidar system 100 may include N optical links (330-1, 330-2, ..., 330-N) coupled to N respective sensor heads (310-1, 310-2, ..., 310-N), and laser 300 may include a 1×N optical demultiplexer 410 configured to distribute pulses of light between the N optical links. The pulses of light distributed to the optical links may be pulses directly emitted by the seed laser 400 or pulses that are emitted by the seed laser 400 and then amplified by one or more optical amplifiers.

In particular embodiments, each optical link (330-1, 330-2, ..., 330-N) may be approximately the same length, or the optical links may have two or more different lengths. As an example, each optical link may include a fiber-optic cable with a length of approximately 20 m. As another example, the optical links may each include a fiber-optic cable with a particular or different length (e.g., two of the optical links may include a 5-m fiber, another two optical links may include a 10-m fiber, and one optical link may include a 20-m fiber). In particular embodiments, the sensor heads (310-1, 310-2, ..., 310-N) may emit optical pulses at substantially the same time or at different times with respect to each other. As an example, a demultiplexer 410 may split a single optical pulse into N optical pulses. The N optical pulses may be conveyed to the N sensor heads by fiber-optic cables having substantially the same length, and the pulses may be emitted by the sensor heads at approximately the same time. As another example, the N optical pulses may be conveyed to the N sensor heads by fiber-optic cables having two or more different lengths, and, due to the different propagation times associated with the different fiber lengths, the pulses may be emitted at different times. As another example, the demultiplexer 410 may direct different optical pulses to different sensor heads at different times, resulting in the pulses being emitted by the sensor heads at different times. In particular embodiments, since each sensor head may emit and receive pulses independent of other sensor heads, the operation of a lidar system 100 as described and illustrated herein may not specifically depend on whether the pulses are emitted in a time-synchronous fashion or the pulses are emitted without regard to the relative time synchronization.

In particular embodiments, demultiplexer 410 may include a 1×N fiber-optic power splitter with one fiber-optic input port and N fiber-optic output ports. As an example, an optical-power splitter may include one or more fused biconical taper (FBT) splitters which are assembled by placing two or more fibers adjacent to one another and then fusing the fibers together by applying heat. As another example, an optical-power splitter may include a planar lightwave circuit (PLC) made by fabricating optical waveguides on a glass substrate using a lithographic process. In particular embodiments, a power splitter may be a passive optical device (e.g., requiring no electronics or electrical power) configured to split each pulse of light received at an input port into N pulses of light which are then sent to each of the respective N output ports. A 1×N optical-power splitter may send each pulse of the N pulses to a corresponding optical link (330-1, 330-2, . . . , 330-N) for transmission to a corresponding sensor head (310-1, 310-2, . . . , 310-N).

In particular embodiments, a power splitter may split each received pulse of light substantially evenly into N pulses, where each of the N pulses has approximately 1/N of the energy or power of the received pulse of light. As an example, for a lidar system 100 with 8 sensor heads 310 (e.g., N=8), a demultiplexer 410 that includes a 1×8 power splitter may split a received pulse into 8 pulses, and each of those pulses may have approximately ⅛ of the pulse energy of the received pulse. If the received pulse has a pulse energy of 8 µJ, then each of the 8 pulses may have a pulse energy of approximately 1 µJ.

In particular embodiments, a power splitter may split each received pulse of light into N pulses with an unequal distribution of energy or power between the N pulses. As an example, for a lidar system 100 with 6 sensor heads 310, a power splitter may split each received optical pulse into 2 high-energy pulses, 2 medium-energy pulses, and 2 low-energy pulses. Each high-energy pulse may have approximately 25% of the energy of the received pulse, each medium-energy pulse may have approximately 15% of the energy of the received pulse, and each low-energy pulse may have approximately 10% of the energy of the received pulse. As another example, for a lidar system 100 with 8 sensor heads 310, a power splitter may split a received pulse into 4 high-energy pulses and 4 low-energy pulses. Each high-energy pulse may have approximately 15% to 20% of the energy of the received pulse, and each low-energy pulse may have approximately 5% to 10% of the energy of the received pulse. Splitting an optical pulse in an unequal manner may allow a lidar system 100 to supply higher-energy pulses to sensor heads 310 which are more critical to the lidar-system performance. As an example, the 4 high-energy pulses may be sent to sensor heads 310 that are substantially forward facing (e.g., facing in the direction of travel of a vehicle), and the 4 low-energy pulses may be sent to side-facing or rear-facing sensor heads 310. An optical pulse with a higher energy may provide a sensor head 310 with a correspondingly longer maximum range as compared to a lower-energy pulse. As an example, sensor heads 310 supplied with high-energy pulses may have a maximum range of approximately 200 m, while sensor heads 310 supplied with low-energy pulses may have a maximum range of approximately 100 m.

In particular embodiments, demultiplexer 410 may include a 1×N optical switch. As an example, demultiplexer 410 may include a fiber-optic switch that allows light received at an input fiber-optic port to be selectively directed to one of N output fiber-optic ports. A 1×N optical switch may employ a switching mechanism that is based on mechanical switching, piezoelectric switching, thermal switching, liquid-crystal switching, switching with a MEMS device, or switching between waveguides in a PLC. A laser 300 may emit optical pulses with a pulse repetition frequency f, and a 1×N optical switch may sequentially switch the emitted pulses between each of the N optical links 330 (e.g., each optical link 330 receives one pulse for every N pulses emitted by laser 300). Each sensor 310 may then perform lidar scanning with pulses having a pulse repetition frequency of approximately f/N. As an example, if laser 300 has a pulse repetition frequency of 3.6 MHz and lidar system 100 has 6 sensor heads 310, then each sensor head 310 will receive every sixth pulse resulting in a sensor-head pulse repetition frequency of approximately 600 kHz. A demultiplexer 410 that sequentially switches input light to one of N output ports may be referred to as a temporal demultiplexer.

In particular embodiments, demultiplexer 410 may include a wavelength demultiplexer, which may be referred to as a wavelength splitter, a demux, or a wavelength division multiplexer (WDM). As an example, demultiplexer 410 may include a 1×N fiber-optic wavelength demultiplexer that receives light at N different wavelengths and directs the light to one of N output ports based on wavelength. A wavelength demultiplexer may perform wavelength splitting using a prism, diffraction grating, holographic grating, arrayed waveguide grating, or one or more dichroic filters. In particular embodiments, a lidar system 100 may use any suitable number of different wavelengths split between any suitable number of sensor heads 310. As an example, laser 300 may produce pulses at N different wavelengths, and the pulses may be sent to N respective sensor heads 310 according to wavelength. As another example, laser 300 may produce pulses at N/2 different wavelengths, and the lidar system 100 may include N sensor heads 310 (e.g., each pulse at a particular wavelength may be split between two sensor heads 310).

In particular embodiments, the pulses of light emitted by laser 300 may have N different wavelengths, and demultiplexer 410 may include a wavelength demultiplexer that sends each pulse having a particular wavelength to a corresponding optical link 330 for transmission to a corresponding sensor head 310. As an example, laser 300 may include N laser diodes each configured to produce light at a particular wavelength, or laser 300 may include one wavelength-tunable laser configured to produce light at N different wavelengths. In particular embodiments, the N different wavelengths may have any suitable wavelength separation between adjacent wavelengths, such as for example a wavelength separation of approximately 0.8 nm, 1.6 nm, 4 nm, or 10 nm. As an example, laser 300 may produce pulses at four different wavelengths with a 1.6-nm wavelength separation (e.g., 1550.1 nm, 1551.7 nm, 1553.3 nm, and 1554.9 nm), and the demultiplexer 410 may include a 1×4 wavelength demultiplexer that sends each of the four different wavelengths to a corresponding optical link 330. A laser 300 may produce optical pulses at N different wavelengths (e.g., a repeating sequence of pulses at wavelengths $\lambda_1, \lambda_2, \ldots, \lambda_N$) with a pulse repetition frequency f. A 1×N wavelength demultiplexer may send each different wavelength to a particular sensor head 310 (e.g., each sensor head 310 receives one pulse for every N pulses emitted by laser 300), resulting in a sensor-head pulse repetition frequency of approximately f/N. As an example, if laser 300 has a pulse repetition frequency of 4.8 MHz and produces pulses at 8 different wavelengths (corresponding to 8 sensor heads 310), then each sensor head 310 will receive one out of eight pulses, resulting in a pulse repetition frequency for each sensor head 310 of approximately 600 kHz.

In particular embodiments, demultiplexer 410 may include a combination of one or more optical-power splitters, one or more optical switches, or one or more wavelength demultiplexers. As an example, demultiplexer 410 may include a 1×m optical-power splitter followed by m 1×N/m optical switches. The parameters N and m may each have any suitable positive integer value (e.g., 1, 2, 3, 4, 6, 8, or 10), where N is greater than m. If m=2 and N=8, then demultiplexer 410 includes a 1×2 power splitter followed by two 1×4 optical switches. As another example, demultiplexer 410 may include a 1×m optical switch followed by m 1×N/m optical-power splitters. If m=2 and N=6, then demultiplexer 410 includes a 1×2 optical switch followed by two 1×3 power splitters. The 1×2 optical switch may alternate between directing pulses to one of its two output ports. Every other pulse emitted by laser 300 may be directed to one of the two output ports, and each pulse is then split into three pulses by one of the 1×3 power splitters coupled to an output port of the switch. As another example, demultiplexer 410 may include a 1×m wavelength splitter followed by m 1×N/m optical-power splitters, and laser 300 may produce pulses at m different wavelengths. If m=4 and N=8, then demultiplexer 410 includes a 1×4 wavelength splitter followed by 4 1×2 optical-power splitters, and laser 300 may produce pulses at 4 different wavelengths. As another example, demultiplexer 410 may include a 1×m optical-power splitter followed by m 1×N/m wavelength splitters, and laser 300 may produce pulses at N/M different wavelengths. If m=4 and N=8, then demultiplexer 410 includes a 1×4 optical-power splitter followed by four 1×2 wavelength splitters. If laser 300 produces pulses at two different wavelengths, then each pulse may be split into four pulses by the power splitter, and each of the four pulses may be directed to one of two sensor heads 310 by the corresponding wavelength splitter.

Figure 8:
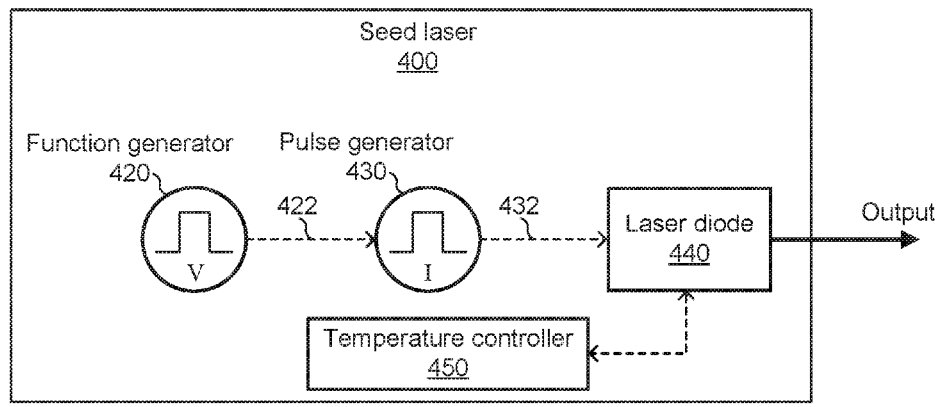
FIG. 8 illustrates an example seed laser that includes a laser diode driven by a pulse generator.

FIG. 8 illustrates an example seed laser 400 that includes a laser diode 440 driven by a pulse generator 430. Seed laser 400 or laser diode 440 in FIG. 8 may be referred to as a pulsed laser or a pulsed laser diode. In particular embodiments, a seed laser 400 may include a function generator 420, a pulse generator 430, a laser diode 440, or a temperature controller 450. In the example of FIG. 8, seed laser 400 includes function generator 420 coupled to pulse generator 430, which is in turn coupled to laser diode 440. Additionally, temperature controller 450 is coupled to laser diode 440. In particular embodiments, seed laser 400 may produce optical seed pulses, which are emitted at the seed-laser output (which may be a free-space output or a fiber-optic output). In particular embodiments, the optical seed pulses may have a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz), a pulse duration of less than or equal to 20 nanoseconds (e.g., approximately 200 ps, 400 ps, 500 ps, 800 ps, 1 ns, 2 ns, 4 ns, 8 ns, 10 ns, 15 ns, or 20 ns), a duty cycle of less than or equal to 1% (e.g., approximately 0.01%, 0.02%, 0.05%, 0.1%, 0.2%, 0.5%, or 1%), or an operating wavelength of between 1400 nm and 2050 nm. As an example, the seed pulses may have a pulse repetition frequency of 500-750 kHz, a pulse duration of less than or equal to 2 ns, and a duty cycle of less than or equal to 0.1%. As another example, the seed pulses may have a pulse repetition frequency of approximately 640 kHz, and a pulse duration of approximately 1 ns (which corresponds to a duty cycle of approximately 0.064%). A duty cycle may be determined from the ratio of pulse duration to pulse period or from the product of pulse duration and pulse repetition frequency. The laser diode 440 may have any suitable operating wavelength, such as for example, an operating wavelength of approximately 1400 nm, 1500 nm, 1550 nm, 1600 nm, or 2000 nm. In particular embodiments, the seed pulses may be relatively low-power optical pulses, and the seed-laser output may be coupled to one or more optical amplifiers configured to amplify the low-power pulses to produce amplified pulses of light which are emitted by laser 300. As an example, the seed pulses may have an average power of greater than or equal to 1 μW. As another example, the seed pulses may have an average power of between approximately 0.1 μW and 10 μW.

In particular embodiments, seed laser 400 may include a laser diode 440 that is electrically driven by pulse generator 430 to produce optical seed pulses. In the example of FIG. 8, function generator 420 supplies a voltage signal 422 to pulse generator 430, and pulse generator 430 drives laser diode 440 with a current signal 432. As an example, function generator 420 may produce a pulsed voltage signal with a pulse repetition frequency of between approximately 0.5 and 2 MHz and a pulse duration of approximately 500 ps. Pulse generator 430 may drive laser diode 440 with a pulsed current signal 432 that corresponds to the voltage signal 422 received from function generator 420. In particular embodiments, voltage signal 422 may include voltage pulses having any suitable shape, such as for example, square-shaped pulses, triangle-shaped pulses, Gaussian-shaped pulses, or pulses having an arbitrary shape or a combination of shapes. In particular embodiments, current signal 432 may have a DC offset or may include current pulses having any suitable shape, such as for example, square-shaped pulses, triangle-shaped pulses, Gaussian-shaped pulses, or pulses having an arbitrary shape or a combination of shapes. The pulses of current signal 432 may have a shape or duration similar to that of voltage signal 422. Additionally, laser diode 440 may emit optical pulses with a shape (e.g., square, triangle, Gaussian, or arbitrary) or duration that at least approximately corresponds to the shape or duration of the current pulses supplied by pulse generator 430.

In particular embodiments, laser diode 440 may be a Fabry-Perot laser diode, a DFB laser, or a DBR laser. As an example, laser diode 440 may be a DFB laser coupled to an optical fiber. Additionally, the light emitted by laser diode 440 may pass through an optical isolator that reduces the amount of back-reflected light that may be coupled back into the laser diode 440. In particular embodiments, seed laser 400 may include a single laser diode 440 having a substantially fixed operating wavelength. As an example, laser diode 440 may be a single-wavelength laser configured to operate at a particular operating wavelength with limited wavelength tunability. As another example, laser diode 440 may include a DFB laser with an operating wavelength between approximately 1400 nm and 1600 nm, and the DFB laser may be wavelength tunable over a range of approximately 4 nm (e.g., by adjusting the operating temperature of the laser diode 440).

In particular embodiments, laser diode 440 may operate without temperature control, or seed laser 400 may include a temperature controller 450 to stabilize the operating temperature of laser diode 440. As an example, the package or the semiconductor substrate of laser diode 440 may be thermally coupled to a thermoelectric cooler (TEC) driven by temperature controller 450 to adjust or stabilize the laser-diode operating temperature. The laser-diode operating temperature may be stabilized to within any suitable range of a target temperature set point, such as for example, within approximately ±0.01° C., ±0.05° C., ±0.1° C., ±0.5° C., or ±1° C. of a target temperature. Stabilization of the temperature of laser diode 440 may provide for the laser-diode operating wavelength to be substantially stable (e.g., the peak wavelength of laser diode 440 may vary by less than any suitable value, such as for example, less than approximately 0.1 nm, 0.5 nm, 1 nm, or 2 nm). If lidar system 100 includes a narrow-band optical filter, then the laser diode 440 may be temperature stabilized so as to match the laser-diode operating wavelength to the passband of the optical filter. In particular embodiments, the temperature controller 450 may be used to adjust the operating wavelength of laser diode 440 by adjusting the laser-diode set-point temperature. As an example, the laser diode 440 may include a DFB laser with an operating wavelength that may be temperature tuned from approximately 1548 nm to approximately 1552 nm by adjusting the temperature set-point of the laser.

In particular embodiments, seed laser 400 may include a wavelength-tunable laser configured to produce light at multiple wavelengths. As an example, a wavelength-tunable laser may produce optical pulses at multiple wavelengths of light corresponding to the multiple sensor heads 310 of a lidar system 100. In particular embodiments, laser diode 440 may be a wavelength-tunable laser. As an example, laser diode 440 may have an operating wavelength that may be tunable over any suitable wavelength range, such as for example, 1 nm, 10 nm, 20 nm, 50 nm, or 100 nm. As another example, laser diode 440 may be tunable from approximately 1400 nm to approximately 1440 nm or from approximately 1530 nm to approximately 1560 nm. In particular embodiments, laser diode 440 may be an external-cavity diode laser which includes a laser diode and a wavelength-selective element, such as for example, a diffraction grating or a grating structure integrated within the semiconductor structure of the laser diode. In particular embodiments, laser diode 440 may be configured to produce optical pulses at multiple wavelengths. As an example, laser diode 440 may produce sequences of N pulses having N different wavelengths. The pulses may be amplified and each pulse may be conveyed to one or more particular sensor heads 310 based on the wavelength of the pulse.

In particular embodiments, seed laser 400 may include a fiber laser. As an example, seed laser 400 may include a fiber laser configured to produce optical pulses, or seed laser 400 may include a CW fiber laser. As another example, seed laser 400 may include a wavelength-tunable fiber laser. As another example, seed laser 400 may include a mode-locked fiber laser that produces optical pulses at a pulse repetition frequency greater than or equal to 1 MHz. Additionally, the seed laser 400 may include a pulse picker that extracts individual pulses from the optical pulses produced by the seed laser 400. The pulse picker may include an electrically controlled electro-optic switch or acousto-optic modulator. As an example, a mode-locked fiber laser may produce optical pulses at a pulse repetition frequency of approximately 100 MHz, and a pulse picker (which may be located after the fiber laser) may "pick" or extract one pulse out of every 100 pulses produced by the fiber laser, resulting in a pulse repetition frequency of approximately 1 MHz. As another example, seed laser 400 may include a cavity-dumped fiber laser. The fiber laser may include an optical switch (e.g., an acousto-optic modulator or a Pockels cell) located in the laser cavity and configured to periodically select or "dump" a pulse out of the laser cavity. For example, the seed laser 400 may be a mode-locked fiber laser with a pulse repetition frequency of 75 MHz, and the cavity dumper may select 1 pulse out of every 100 pulses, resulting in an output pulse repetition frequency of approximately 750 kHz.

In particular embodiments, light source 110, laser 300, or seed laser 400 may include a diode-pumped solid-state laser (DPSS laser). As an example, seed laser 400 may include a Q-switched DPSS laser configured to produce optical pulses in a free-space output beam 125 that is coupled to scanner 120. A gain crystal of a DPSS laser may include neodymium-doped yttrium aluminum garnet (Nd:YAG), neodymium-doped yttrium aluminum borate (Nd:YAB), erbium-doped glass, or glass or YAB doped with erbium (e.g., Er:YAB) or doped with erbium and ytterbium (e.g., Er:Yb:YAB). The gain crystal may be pumped by a diode laser that produces a free-space pump beam coupled to the gain crystal. The pump laser may operate at any suitable wavelength, such as for example, approximately 908 nm, 915 nm, 940 nm, 960 nm, 976 nm, 980 nm, 1050 nm, 1064 nm, 1450 nm, or 1480 nm. A Q-switch of a DPSS laser may be an active Q-switch (e.g., an acousto-optic modulator or electro-optic modulator) or a passive Q-switch (e.g., a saturable-absorber material, such as for example, cobalt-doped spinel ($MgAl_2O_4$), glass doped with lead-sulfide (PbS) quantum dots, or vanadium-doped YAG).

Figure 9:
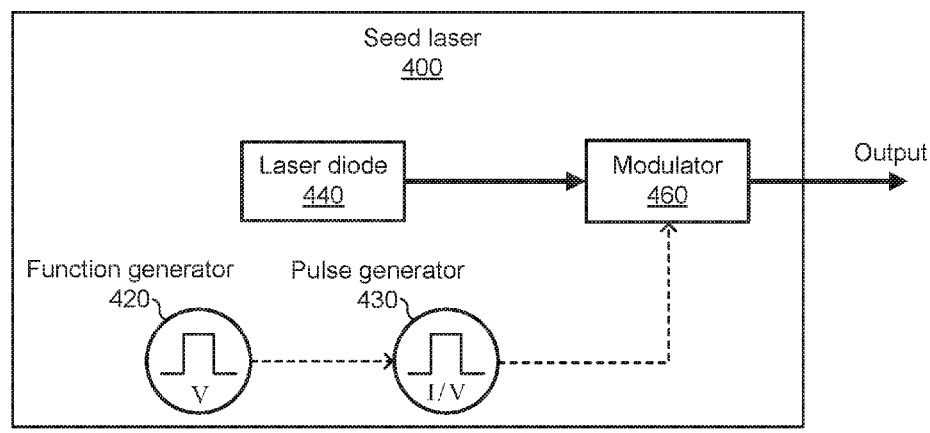
FIG. 9 illustrates an example seed laser that includes a laser diode and an optical modulator.

FIG. 9 illustrates an example seed laser 400 that includes a laser diode 440 and an optical modulator 460. In particular embodiments, seed laser 400 may include a laser diode 440 configured to produce CW light and an amplitude modulator 460 configured to receive the CW light and produce optical seed pulses from the received CW light. In particular embodiments, optical modulator 460 may be an electro-absorption modulator (EAM), an electro-optic modulator (EOM), a semiconductor optical amplifier (SOA) modulator, or an acousto-optic modulator (AOM). An EAM may include a semiconductor material configured to modulate the intensity of light through a change in optical absorption caused by an applied electric field. An EAM may be switched between a substantially absorbing state and a substantially transmissive state to produce optical pulses from CW light supplied by laser diode 440. An EOM may include an electro-optic material (e.g., lithium niobate, lithium tantalite, ammonium dihydrogen phosphate, potassium titanyl phosphate, potassium di-deuterium phosphate, β-barium borate, or a suitable organic polymer) that exhibits the electro-optic effect in which the material's refractive index changes in response to an applied electric field. As an example, the EOM may be a fiber-coupled device that includes an optical interferometer formed by waveguides fabricated into a lithium-niobate substrate, where the optical transmission through the device is modulated by changing the voltage applied across one arm of the interferometer. A SOA may include a semiconductor gain medium that is substantially opaque or absorbing when in an off state (e.g., when little or no electrical current is applied to the SOA) and that is transparent or amplifying when current above a threshold current is applied. By pulsing the current that drives the SOA, the SOA can produce output optical pulses from CW light supplied by laser diode 440. An AOM may include a piezoelectric transducer attached to an optical material, and the piezoelectric material may be used to excite sound waves in the optical material that diffract or deflect the direction of an optical beam.

In particular embodiments, modulator 460 may have an extinction ratio of greater than or equal to 10 dB, 20 dB, 30 dB, 40 dB, or any other suitable value. The extinction ratio is an on/off ratio that represents the amount of light transmitted through the modulator 460 in an on state versus an off state. As an example, if modulator 460 transmits 10 µW of average power in an on state and 10 nW of average power in an off state, then modulator 460 has an extinction ratio of 30 dB (which corresponds to 0.1% of optical leakage in the off state).

In particular embodiments, optical modulator 460 may be an external modulator coupled to laser diode 440 by optical fiber. As an example, optical modulator 460 may be a fiber-coupled EAM, EOM, or SOA configured to receive CW light from laser diode 440 on an input optical fiber and produce optical pulses on an output optical fiber. In particular embodiments, optical modulator 460 may be integrated into the semiconductor structure of laser diode 440 or integrated into the packaging of laser diode 440. As an example, laser diode 440 may have a semiconductor gain region configured to produce CW light, and the gain region may be adjacent to a SOA or EA region that modulates the CW light. In particular embodiments, laser diode 440 may be driven by a DC current source (not illustrated in FIG. 9) to produce CW light, and modulator 460 may be driven by a pulse generator 430 which in turn is triggered or driven by a function generator 420. In FIG. 9, function generator 420 may produce voltage pulses, and pulse generator 430 may drive the modulator 460 with voltage or current pulses that correspond to the pulses from the function generator 420. In particular embodiments, function generator 420 and pulse generator 430 may be two separate devices, or function generator 420 and pulse generator 430 may be integrated together into a single device.

Figure 10:
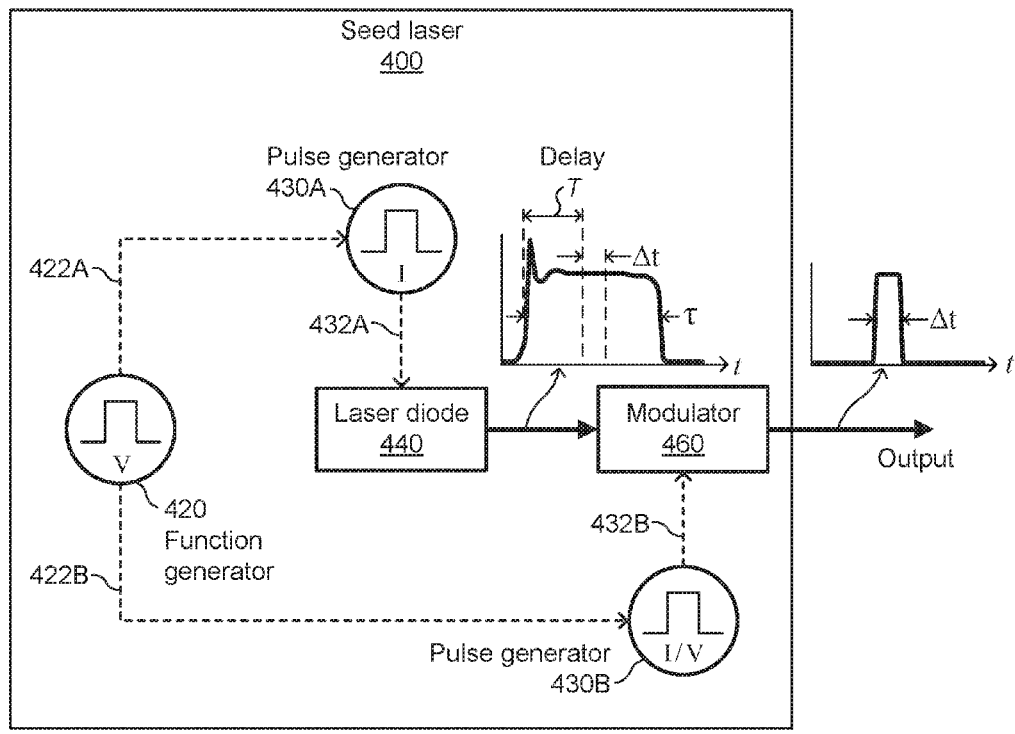
FIG. 10 illustrates an example seed laser that includes a laser diode driven by a pulse generator and an optical modulator driven by another pulse generator.

FIG. 10 illustrates an example seed laser 400 that includes a laser diode 440 driven by a pulse generator 430A and an optical modulator 460 driven by another pulse generator 430B. In particular embodiments, seed laser 400 may include a laser diode 440 configured to produce longer-duration optical pulses (e.g., $\tau \cong$ 2-20 ns duration) and an amplitude modulator 460 configured to receive the longer-duration pulses and produce shorter-duration seed pulses (e.g., $\Delta t \cong$ 0.2-2 ns duration) from the received pulses. In the example of FIG. 10, laser diode 440 produces optical pulses with a duration of $\tau$, and modulator 460 selectively transmits a portion of the laser-diode pulses to produce output optical seed pulses with a duration of $\Delta t$, where $\Delta t < \tau$ (e.g., $\tau \cong$ 5 ns and $\Delta t \cong$ 500 ps). In particular embodiments, the laser-diode pulses may have any suitable duration $\tau$ (e.g., 1 ns, 2 ns, 5 ns, 10 ns, or 20 ns), and the optical seed pulses may have any suitable duration $\Delta t$ (e.g., 100 ps, 200 ps, 400 ps, 600 ps, 1 ns, or 2 ns), where $\Delta t < \tau$.

In FIG. 10, function generator 420 supplies voltage signals 422A and 422B to pulse generators 430A and 430B, respectively. Function generator 420 may supply a pulsed voltage signal 422A to pulse generator 430A, and pulse generator 430A may drive laser diode 440 with a corresponding pulsed current signal 432A. Function generator 420 may also supply a pulsed voltage signal 422B to pulse generator 430B, and pulse generator 430B may drive modulator 460 with a corresponding pulsed voltage or current signal 432B. The pulsed signal 432A may include current pulses with a duration of approximately $\tau$, and the pulsed signal 432B may include current or voltage pulses with a duration of approximately $\Delta t$, where $\Delta t < \tau$ (e.g., $\tau \cong$ 5 ns and $\Delta t \cong$ 500 ps). Additionally, a rising edge of a pulse of signal 432B may be delayed by a delay time T with respect to a rising edge of a corresponding pulse of signal 432A. In particular embodiments, function generator 420 may be a single device with two outputs, or function generator 420 may include two separate function generators (e.g., a master function generator and a slave function generator, where the output of the slave function generator is triggered by or based on the output of the master). In particular embodiments, function generator 420 and pulse generators 430A and 430B may each be separate devices, or two or three of these devices may be integrated together into a single device.

In particular embodiments, seed laser 400 may include a laser diode 440 configured to produce optical pulses having a duration $\tau$. The seed laser 400 may also include an optical modulator 460 configured to receive the optical pulses from the laser diode 440 and selectively transmit a portion of each of the received optical pulses to produce output optical seed pulses, where each optical seed pulse has a duration less than $\tau$. In FIG. 10, the laser diode 440 produces an optical pulse with a duration $\tau$, and the modulator selects a portion of the laser-diode pulse to produce a seed pulse with a duration of $\Delta t$, where $\Delta t < \tau$. The selected portion of the laser-diode pulse may be delayed by delay T with respect to the rising edge of the laser-diode pulse. In FIG. 10, the selected portion of the laser-diode pulse includes the portion of the laser-diode pulse between the two vertical dashed lines having a $\Delta t$ separation, where one line is delayed by delay T with respect to the rising edge of the laser-diode pulse. As an example, the laser-diode pulse may have a duration $\tau$ of 5 ns, and the seed pulse may have a duration $\Delta t$ of 0.5 ns. If the delay time T is 2 ns, then modulator 460 may transmit the portion of the laser-diode pulse from approximately 2 ns to 2.5 ns after the rising edge of the laser-diode pulse.

As illustrated in FIG. 10, an optical pulse emitted by laser diode 440 may include one or more initial spikes or oscillations in intensity followed by a plateau region with a substantially uniform intensity. In particular embodiments, modulator 460 may transmit a portion of a plateau region of the laser-diode pulse, resulting in an emitted seed pulse that may be substantially uniform or stable (e.g., the seed pulse may exhibit little or no intensity spikes or oscillations). Additionally, the seed pulse may exhibit little or no substantial wavelength variation relative to the initial portion of the laser-diode pulse. The modulator 460 is driven to select a slice or portion of the laser-diode pulse by switching from an off state (or, absorptive state) to an on state (or, transmissive state) for a duration of time $\Delta t$. In particular embodiments, since laser diode 440 is operating in a pulsed mode (rather than a CW mode), the output seed pulses may exhibit little or no presence of leakage light during the time between successive seed pulses.

In particular embodiments, the modulator 460 may be driven in a digital fashion between on and off states. As an example, the modulator 460 may be driven from an absorbing state to a transmitting state and then back to an absorbing state, which may result in a seed pulse with a substantially square shape (as illustrated in the example of FIG. 10). In particular embodiments, the modulator 460 may be driven in an analog fashion to produce seed pulses with other suitable shapes, such as for example, triangular, Gaussian, or arbitrary shapes. As an example, the modulator 460 may be driven relatively gradually from an absorbing state to a transmitting state to produce a seed pulse with a gradually rising front edge. Similarly, the modulator 460 may be driven relatively gradually from a transmitting state to an absorbing state to produce a seed pulse with a gradually falling trailing edge.

Figure 11:
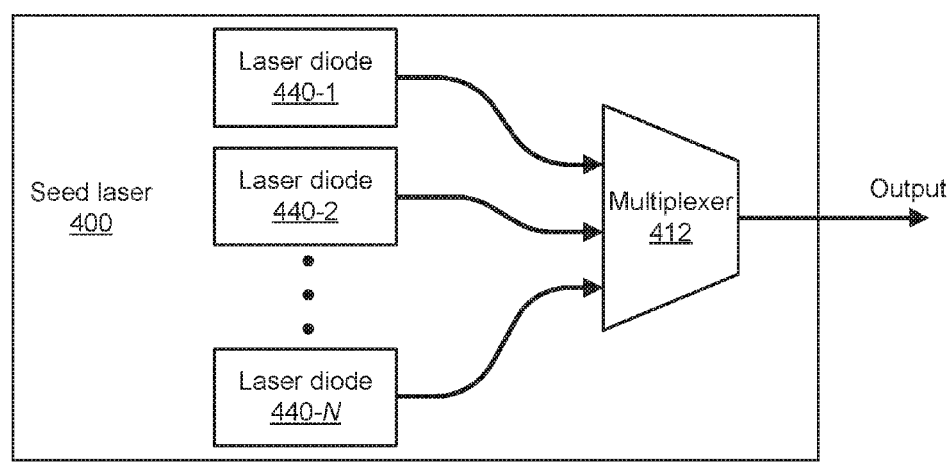
FIG. 11 illustrates an example seed laser with multiple laser diodes that are combined together by a multiplexer.

FIG. 11 illustrates an example seed laser 400 with multiple laser diodes (440-1, 440-2, . . . , 440-N) that are combined together by a multiplexer 412. In particular embodiments, seed laser 400 may include multiple laser diodes 440 configured to operate at multiple different wavelengths and an optical multiplexer 412 configured to combine the light produced by each laser diode 440 into a single output optical fiber. As an example, seed laser 400 may include N laser diodes 440 configured to operate at N different wavelengths. In particular embodiments, each laser diode 440 may be a pulsed laser diode driven by a separate pulse generator 430 (not illustrated in FIG. 10). As an example, N separate pulse generators 430 may each be driven or triggered by a separate function generator 420 (not illustrated in FIG. 10). The function generators 420 may operate independently or may be synchronized with respect to one another so that the pulses can be emitted with a particular time delay between successive pulses. As another example, the N pulse generators 430 may be driven by a single function generator 420 that has N trigger-signal outputs. Additionally, the function generator 420 may have N−1 electrical delays so that the pulses from each laser diode 440 can be synchronized or time-delayed with respect to one another. In particular embodiments, any suitable number of function generators 420, pulse generators 430, or electrical delays may be integrated together into a single device.

In particular embodiments, multiplexer 412 may be referred to as a wavelength combiner, a mux, or a wavelength division multiplexer (WDM). In particular embodiments, multiplexer 412 may be similar to demultiplexer 410 described above, where the direction of light in multiplexer 412 is reversed with respect to demultiplexer 410. As an example, multiplexer 412 may have N input ports coupled to N laser diodes 440, and multiplexer 412 may combine light from the input ports together into a single output port. In particular embodiments, a N×1 multiplexer 412 may perform wavelength combining using a prism, diffraction grating, holographic grating, arrayed waveguide grating, or one or more dichroic filters. In particular embodiments, seed laser 400 may include N optical amplifiers (not illustrated in FIG. 10). As an example, each laser diode 440 may be coupled to an optical amplifier located between the laser diode and the multiplexer 412. The optical amplifiers may be configured to amplify the light from each laser diode 440 separately prior to combining in multiplexer 412.

In particular embodiments, the N laser diodes 440 may produce optical pulses at N respective wavelengths, and each laser diode 440 may produce pulses at a pulse repetition frequency f. Additionally, the pulses produced by each of the laser diodes 440 may be synchronized so that after being combined together by multiplexer 412 the output seed pulses include N sets of time-interleaved pulses which are substantially evenly spaced in time. As an example, each laser diode 440 may emit pulses that are delayed with respect to pulses from a preceding laser diode 440 by a time delay of 1/(f×N). The pulses from the N laser diodes 440 may be combined by the N×1 multiplexer 412, resulting in an output seed-laser repetition frequency of f×N. As an example, seed laser 400 may include N=8 laser diodes 440, and each laser diode 440 may produce pulses at a f=640-kHz pulse repetition frequency with a time delay relative to pulses emitted by a preceding laser diode 440 of 1/(640 kHz×8)≅195 ns. This results in an output seed-laser repetition frequency of approximately 5.12 MHz with a pulse period of approximately 195 ns. In particular embodiments, the output seed-laser pulses may be sent to a fiber-optic amplifier for amplification. A fiber-optic amplifier may exhibit improved performance (e.g., reduced amplified spontaneous emission) when amplifying the output seed-laser pulses due to the higher pulse repetition frequency and higher duty cycle provided by combining pulses from multiple laser diodes 440 into a single pulse stream for amplification. Additionally, undesirable nonlinear effects in optical fiber may be reduced or avoided by interleaving the pulses in a time-synchronized manner so that the pulses do not overlap in time.

Figure 12:
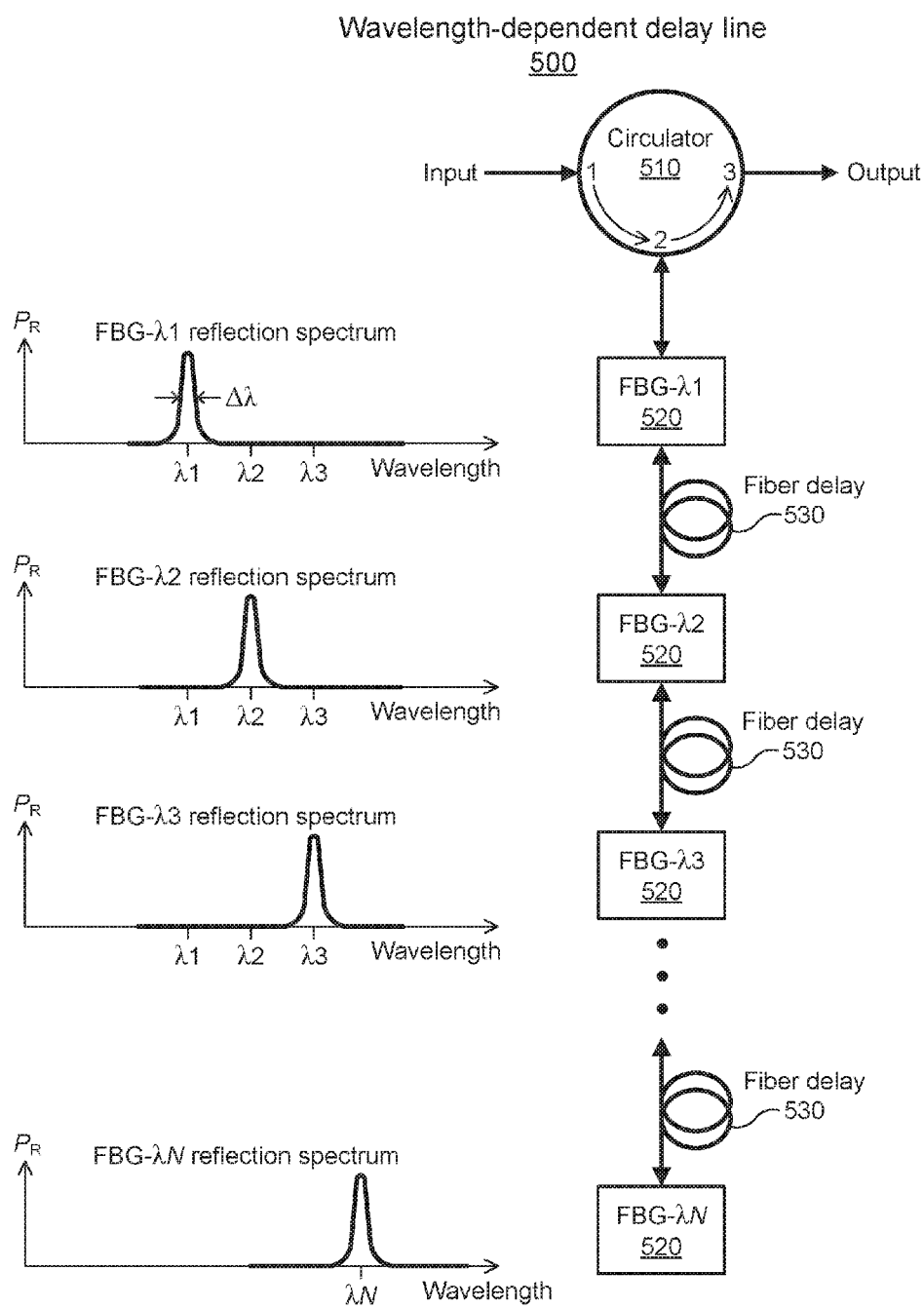
FIG. 12 illustrates an example wavelength-dependent delay line.

FIG. 12 illustrates an example wavelength-dependent delay line 500. In particular embodiments, a lidar system 100 may include a wavelength-dependent delay line 500 configured to receive input light that includes the N operating wavelengths of the lidar system 100 and produce time-delayed output light. The delay line 500 imparts a wavelength-dependent time delay so that the time-delayed output light includes the input light where each wavelength of input light experiences a particular time delay based on its wavelength. In the example of FIG. 12, the delay line 500 includes an optical circulator 510, N fiber Bragg gratings (FBGs) 520, and N−1 fiber delays 530. In particular embodiments, circulator 510 may be a three-port fiber-optic component that directs light that enters at one port out to another port. In FIG. 12, light entering at port 1 (the input of delay line 500) is directed to port 2, and light entering at port 2 is directed to port 3 (the output of delay line 500).

In particular embodiments, a FBG 520 may be a fiber-optic component that includes a periodic variation in the refractive index of the fiber core (e.g., a distributed Bragg reflector, an apodized grating, or a chirped fiber Bragg grating) which acts as a wavelength-specific reflector. Each FBG 520 corresponds to a particular operating wavelength of the lidar system 100 and is configured to reflect that particular operating wavelength and transmit the other wavelengths of the lidar system 100. As an example, laser 300 or seed laser 400 may produce optical pulses at N different wavelengths (e.g., wavelengths $\lambda_1$, $\lambda_2$, $\lambda_N$), and delay line 500 may include N FBGs 520 corresponding to each of the N wavelengths. FIG. 12 includes example reflection spectra for each of the FBGs 520 where the x-axis corresponds to wavelength and the y-axis corresponds to reflected optical power ($P_R$). FBG-$\lambda$1 reflects light at wavelength $\lambda$1 (over a $\Delta\lambda$ bandwidth) and transmits light at other wavelengths. Similarly, FBG-$\lambda$2, FBG-$\lambda$3, and FBG-$\lambda$N each reflect light at wavelengths $\lambda$2, $\lambda$3, and $\lambda$N, respectively. Each FBG 520 may have any suitable reflectively (e.g., reflectivity greater than or equal to 50%, 75%, 90%, 95%, 99%, or 99.9%) over any suitable bandwidth (e.g., $\Delta\lambda$ may be approximately 0.1 nm, 0.2 nm, 0.5 nm, 1 nm, 5 nm, 10 nm, or 20 nm). As an example, FBG-$\lambda$1 may have a reflectivity of greater than 99% over a 0.5-nm bandwidth centered at 1550.1 nm.

In particular embodiments, delay line 500 may include multiple FBGs 520 arranged in series and separated from one another by a fiber delay 530, where fiber delay 530 is a particular length of optical fiber corresponding to a particular round-trip delay time $\Delta T$. The length L of fiber delay 530 may be related to a time delay $\Delta T$ between pulses reflected by successive FBGs 520 based on the expression $2 \cdot L = \Delta T \cdot c/$ n, where n is the refractive index experienced by light traveling through the fiber delay 530. As an example, a time delay of approximately 195 ns can be achieved with an optical fiber having a refractive index of 1.44 and a length of 20.3 m. In FIG. 12, light with wavelength λ1 is reflected by FBG-λ1 and proceeds to the output of delay line 500. Light with wavelength λ2 passes through FBG-λ1, is reflected by FBG-λ2, and then proceeds to the output with a time delay (relative to the λ1-wavelength light) of approximately ΔT. Light with wavelength λ3 passes through FBG-λ1 and FBG-λ2, is reflected by FBG-λ3, and then proceeds to the output with a time delay (relative to the λ1-wavelength light) of approximately 2·ΔT. Light with wavelength λN passes through the first N−1 FBGs, is reflected by FBG-λN, and then proceeds to the output with a time delay (relative to the λ1-wavelength light) of approximately (N−1)·ΔT. Any light that falls outside the reflection bands of the N FBGs 520 may pass through the FBGs 520. This outside-band light (which may include undesirable noise or amplified spontaneous emission from an optical amplifier) may be prevented from propagating through the delay line 500 and effectively filtered out from the lidar system 100.

In particular embodiments, a wavelength-dependent delay line 500 may be included in a seed laser 400 or an optical amplifier, or a wavelength-dependent delay line 500 may be located between a seed laser 400 and an optical amplifier or between two optical amplifiers. In particular embodiments, a wavelength-dependent delay line 500 may be used in a lidar system 100 to separate one broadband pulse of light into N time-delayed pulses of light. As an example, a seed laser 400 (or a seed laser 400 followed by an optical amplifier) may be configured to produce broadband pulses of light with a spectral bandwidth that covers the N operating wavelengths of a lidar system 100. As an example, a lidar system 100 may operate with N=8 wavelengths of light (e.g., wavelengths $\lambda_1, \lambda_2, \ldots \lambda_8$), and each pulse produced by seed laser 400 may have an optical spectrum that includes or spans the 8 wavelengths. The seed-laser pulses may be sent to the input of delay line 500, which may produce 8 pulses at the output, where each of the 8 pulses corresponds to one of the 8 lidar-system operating wavelengths. The 8 pulses may be time delayed with respect to one another according to the length of the respective fiber delays 530. As an example, delay line 500 may receive broadband input pulses with a pulse repetition frequency f, and the output pulses may have a pulse repetition frequency of f×N and a time delay ΔT between successive output pulses of approximately 1/(f×N). In particular embodiments, each fiber delay 530 may have approximately the same length so that successive output pulses have substantially the same time delay with respect to one another. In particular embodiments, undesirable nonlinear effects in optical fiber may be reduced or avoided by separating a broadband input pulse into multiple output pulses, since the multiple output pulses are separated in time and have reduced peak powers compared to the input pulse.

In particular embodiments, a wavelength-dependent delay line 500 may be used in a lidar system 100 to separate N time-coincident pulses of light into N time-delayed pulses of light. As an example, seed laser 400 may include N laser diodes 400 configured to produce pulses at N different wavelengths with little or no substantial time delay between the pulses. The seed-laser pulses may be triggered by a signal from a single-output function generator 420 so that the pulses are emitted at substantially the same time. The N time-coincident pulses may be passed through a delay line 500 to produce N pulses separated from one another by a particular time delay according to wavelength.

Figure 13:
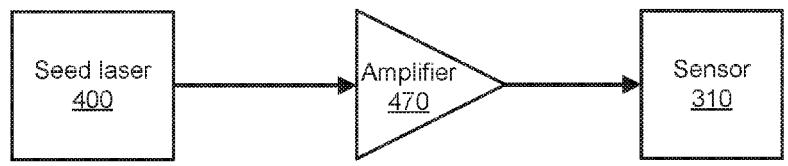
FIG. 13 illustrates an example lidar system that includes a seed laser, amplifier, and sensor.

FIG. 13 illustrates an example lidar system 100 that includes a seed laser 400, amplifier 470, and sensor 310. In particular embodiments, a lidar system 100 may include one or more seed lasers 400, one or more amplifiers 470, or one or more sensors 310. In particular embodiments, seed laser 400 may include (1) a laser diode (e.g., a DFB laser) driven by a pulse generator 430, (2) a wavelength-tunable laser configured to produce light at multiple wavelengths, (3) multiple laser diodes 440 configured to produce light at multiple respective wavelengths, or (4) any other suitable laser source. In particular embodiments, seed laser 400 may produce low-power optical pulses, and one or more optical amplifiers 470 may be configured to amplify the low-power pulses to produce amplified pulses of light. The amplified pulses of light may correspond to optical pulses emitted by laser 300. As an example, amplifier 470 may receive optical seed pulses having an average power of greater than or equal to 1 microwatt, and the amplified output pulses from the amplifier 470 may have an average power of greater than or equal to 1 mW. As another example, amplifier 470 may receive optical seed pulses having a pulse energy of greater than or equal to 1 pJ, and the amplified output pulses from the amplifier 470 may have a pulse energy of greater than or equal to 0.1 µJ.

In particular embodiments, an amplifier 470 may be referred to as a fiber amplifier, optical amplifier, fiber-optic amplifier, optical amp, or amp. In particular embodiments, all or part of an amplifier 470 may be included in a laser 300, an optical link 330, or a sensor head 310. In particular embodiments, an amplifier 470 may include any suitable number of optical-amplification stages. As an example, an amplifier 470 of a lidar system 100 may include 1, 2, 3, 4, or 5 optical-amplification stages. In particular embodiments, amplifier 470 may include a single-pass amplifier in which light makes one pass through the amplifier 470. In particular embodiments, amplifier 470 may include a double-pass amplifier in which light makes two passes through the amplifier gain medium. In particular embodiments, amplifier 470 may act as a preamplifier (e.g., an amplifier that amplifies seed pulses from a laser diode 440 or a seed laser 400), a mid-stage amplifier (e.g., an amplifier that amplifies light from another amplifier), or a booster amplifier (e.g., an amplifier that sends output light to a scanner 120 or a sensor head 310). A preamplifier may refer to the first amplifier in a series of two or more amplifiers, a booster amplifier may refer to the last amplifier in a series of amplifiers, or a mid-stage amplifier may refer to any amplifier located between a preamplifier and a booster amplifier.

In particular embodiments, amplifier 470 may provide any suitable amount of optical power gain, such as for example, a gain of approximately 5 dB, 10 dB, 20 dB, 30 dB, 40 dB, 50 dB, 60 dB, or 70 dB. As an example, amplifier 470 (which may include two or more separate amplification stages) may receive pulses with a 1-µW average power and produce amplified pulses with a 5-W average power, corresponding to an optical power gain of approximately 67 dB. As another example, amplifier 470 may include two or more amplification stages each having a gain of greater than or equal to 20 dB, corresponding to an overall gain of greater than or equal to 40 dB. As another example, amplifier may include three amplification stages having gains of approximately 30 dB, 20 dB, and 10 dB, respectively, corresponding to an overall gain of approximately 60 dB.

Figure 14:
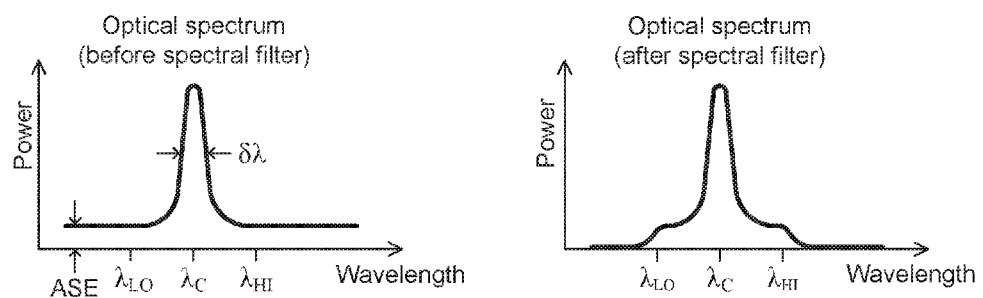
FIG. 14 illustrates an example spectrum of an optical signal before and after passing through a spectral filter.

FIG. 14 illustrates an example spectrum of an optical signal before and after passing through a spectral filter. In particular embodiments, a spectral filter, which may be referred to as an optical filter, may include an absorptive filter, dichroic filter, long-pass filter, short-pass filter, or band-pass filter. In particular embodiments, a spectral filter may be substantially transmissive to light over a particular range of wavelengths (e.g., a pass-band) and may substantially block (e.g., through absorption or reflection) the transmission of light outside of the pass-band range. As an example, a spectral filter may be a dichroic filter (which may be referred to as a reflective, thin-film, or interference filter) which includes a substantially transparent optical substrate (e.g., glass or fused silica) with a series of thin-film optical coatings configured to transmit light over a particular wavelength range and reflect other wavelengths of light. As another example, a spectral filter may include a FBG 520 configured to transmit light over a particular pass-band and substantially block light outside of the pass-band. In the example of FIG. 14, the spectral filter is a band-pass filter with a center wavelength of $\lambda_C$ and a pass-band from $\lambda_{LO}$ to $\lambda_{HI}$, which corresponds to a filter bandwidth of $\lambda_{HI}$-$\lambda_{LO}$.

In particular embodiments, a spectral filter may have an optical transmission (within a pass-band) of greater than or equal to 50%, 70%, 80%, 90%, 95%, 99%, or any other suitable transmission value. Additionally, a spectral filter may have an optical transmission of less than or equal to 50%, 20%, 10%, 1%, 0.5%, 0.1%, or any other suitable transmission value for wavelengths outside the pass-band. The optical transmission outside the pass-band may also be expressed in terms of decibels (dB) of attenuation. For example, the filter attenuation for wavelengths outside the pass-band may be greater than or equal to 3 dB, 10 dB, 15 dB, 20 dB, 30 dB, or any other suitable attenuation value. An attenuation value of 20 dB corresponds to blocking approximately 99% of the incident light power and transmission of approximately 1% of incident light. In particular embodiments, a spectral filter may transmit light at one or more operating wavelengths of a lidar system 100 and block or attenuate light away from the transmitted wavelengths by greater than or equal to 3 dB, 10 dB, 15 dB, 20 dB, 30 dB, or any other suitable attenuation value. The light that is away from the transmitted wavelengths may refer to light with a wavelength outside of a pass-band of the spectral filter. As an example, a spectral filter may transmit greater than or equal to 90% of incident light within a spectra-filter pass-band and may block or attenuate light outside of the pass-band by 20 dB. As another example, a spectral filter may have a filter attenuation of greater than or equal to 20 dB for wavelengths between approximately [$\lambda_{LO}$-100 nm] and $\lambda_{LO}$ and wavelengths between approximately $\lambda_{HI}$ and [$\lambda_{HI}$+100 nm].

In particular embodiments, a spectral filter may have any suitable filter bandwidth, such as for example, a filter bandwidth of 0.1 nm, 0.2 nm, 0.5 nm, 1 nm, 2 nm, 5 nm, or 10 nm. As an example, a spectral filter may have a pass-band with a 1-nm bandwidth that is centered about center wavelength 1554.9 nm. In particular embodiments, an optical filter may have a relatively narrow pass-band (e.g., a spectral-filter bandwidth of less than or equal to 0.05 nm, 0.1 nm, 0.2 nm, 0.5 nm, or 1 nm), and a laser diode 440 of the lidar system 100 may be temperature stabilized so that the laser-diode operating wavelength is matched to the spectral-filter pass-band. In particular embodiments, an optical filter may have a relatively broad pass-band (e.g., a spectral-filter bandwidth of greater than or equal to 1 nm, 2 nm, 5 nm, 10 nm, 20 nm, or 50 nm), and a laser diode 440 may not require temperature stabilization to maintain its operating wavelength within the spectral-filter pass-band.

In particular embodiments, an optical spectrum before passing through a spectral filter may include a signal spectrum along with background optical noise, which may include amplified spontaneous emission (ASE) originating from an amplifier 470. In FIG. 14, the signal spectrum, which may represent the spectrum for a series of optical pulses, is centered at wavelength $\lambda_C$ and has a bandwidth of $\delta\lambda$. The signal spectrum is contained within the pass-band of the spectral filter and passes through the filter with little or no attenuation (e.g., ≤10% attenuation). Similarly, the optical pulses associated with the signal spectrum may pass through the filter with little or no attenuation or distortion to their shape. In FIG. 14, the optical spectrum before passing through the spectral filter includes a broadband offset associated with ASE. In particular embodiments, an ASE spectrum may extend over a wavelength range of approximately 20 nm, 40 nm, 60 nm, or 80 nm (e.g., from approximately 1510 nm to approximately 1590 nm). The portion of the ASE that falls outside the spectral-filter pass-band may be substantially attenuated, as indicated by the after-spectral-filter spectrum illustrated in FIG. 14 where wavelengths less than $\lambda_{LO}$ and greater than $\lambda_{HI}$ are attenuated after passing through the spectral filter. In particular embodiments, a spectral filter may be used to reduce or substantially remove unwanted optical signals or noise (e.g., ASE) from a laser 300, seed laser 400, or amplifier 470 of a lidar system 100. As an example, an optical filter may be located at or near an output of an optical amplifier 470, and the filter may be configured to remove any suitable amount of the ASE from the amplifier output 470, such as for example, 50%, 60%, 80%, 90%, 95%, or 99% of the ASE. As another example, an optical filter with a 1-nm bandwidth that receives a signal with background optical noise that extends over approximately 50 nm may remove approximately 94% to 98% of the background noise from the signal.

In particular embodiments, a spectral filter may have a single pass-band (e.g., 1550-1552 nm) or two or more distinct pass-bands (e.g., 1550-1552 nm and 1555-1557 nm). As an example, for a lidar system 100 with N operating wavelengths, a spectral filter may have N pass-bands corresponding to each of the N operating wavelengths. In particular embodiments, the center wavelength $\lambda_C$ or the bandwidth $\delta\lambda$ of a spectral filter may be substantially fixed. In particular embodiments, a spectral filter may have an adjustable center wavelength $\lambda_C$ or an adjustable bandwidth $\delta\lambda$. As an example, the center wavelength of a spectral filter may be dynamically changed to match the changing wavelength of a wavelength-tunable seed laser 400 or laser diode 440.

Figure 15:
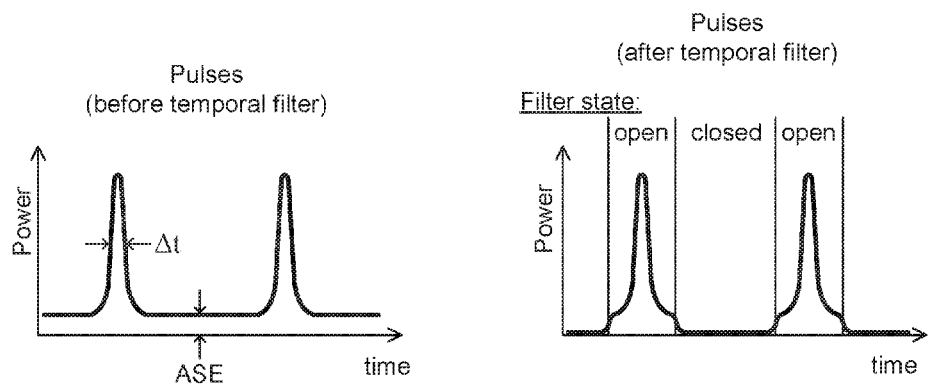
FIG. 15 illustrates example optical pulses before and after the pulses pass through a temporal filter.

FIG. 15 illustrates example optical pulses before and after the pulses pass through a temporal filter. In particular embodiments, optical pulses from a laser diode 440, seed laser 400, laser 300, or amplifier 470 may be passed through a temporal filter to reduce or remove inter-pulse noise (e.g., optical noise located temporally between successive pulses). In particular embodiments, a temporal filter may have a transmitting state (which may be referred to as an "on" or "open" state) and a non-transmitting state (which may be referred to as an "off" or "closed" state). A temporal filter in the transmitting state may be substantially transmissive or may allow light to propagate through the filter with minimal attenuation (e.g., the filter may have an optical transmission of greater than or equal to 70%, 80%, 90%, 95%, or 99%). In the non-transmitting state, the filter may be substantially opaque or blocking (e.g., the filter may have an optical transmission less than or equal to 20%, 10%, 2%, 1%, 0.5%, or 0.1%). As an example, when a temporal filter is in a non-transmitting state, an optical signal (e.g., ASE) may be substantially prevented from being transmitted through the filter (e.g., the optical signal may experience an attenuation of greater than or equal to 10 dB, 20 dB, 30 dB, 40 dB, or any other suitable attenuation value).

In particular embodiments, a temporal filter may be configured to be in a transmitting state when an optical pulse is present and to be in a non-transmitting state otherwise. As an example, an optical amplifier 470 may receive and amplify pulses from a seed laser 400, and a temporal filter located at the output of the amplifier 470 may be switched between transmitting and non-transmitting states according to when an amplified seed pulse is present. The temporal filter may receive a trigger signal from seed laser 400 or function generator 420 indicating when the filter should switch from non-transmitting to transmitting or from transmitting to non-transmitting. In the example of FIG. 15, the pulses before passing through a temporal filter have a pulse width of Δt and an amount of ASE offset noise (e.g., ASE produced by an amplifier 470). After passing through the temporal filter, the pulses retain their duration and overall shape, and the amount of ASE noise between successive pulses is reduced. When a pulse is present (e.g., when a pulse is incident on or traveling through the temporal filter), the filter is in the open state, and when there is no pulse present, the filter switches to the closed state. In particular embodiments, a temporal filter may be configured to be open for a duration of time that is greater than or equal to the pulse duration Δt. As an example, a temporal filter may be configured to be open for a period of time approximately equal to Δt, 2Δt, 3Δt, 5Δt, or 10Δt. As another example, a temporal filter may be open for a 2Δt window of time, where the window is approximately centered on the time when the pulse is present.

In particular embodiments, a temporal filter, which may be referred to as an optical filter, may include an optical switch, a SOA device, or an electro-absorption (EA) device. As an example, a temporal filter may include an on/off optical switch that employs any suitable switching mechanism (e.g., mechanical switching, piezoelectric switching, thermal switching, liquid-crystal switching, switching with a MEMS device, or switching between waveguides in a PLC) to selectively switch between allowing light to pass through the switch and blocking or preventing light from being transmitted through the switch. As another example, a temporal filter may include a SOA device that is substantially opaque or absorbing when in a non-transmitting state (e.g., when little or no electrical current is applied to the SOA device) and that is transparent or amplifying when current above a threshold current is applied. As another example, a temporal filter may include an EA device that blocks or transmits light through a change in optical absorption caused by an electric field applied to a semiconductor material.

In particular embodiments, an optical filter may include a spectral filter, a temporal filter, or a combination of a spectral filter and a temporal filter. As an example, an optical filter may include a series combination of a spectral filter and a temporal filter (e.g., a spectral filter followed by a temporal filter, or vice versa). In particular embodiments, lidar system 100 may include one or more spectral filters or one or more temporal filters. As an example, one or more spectral or temporal filters may be included in laser 300, sensor 310, optical link 330, seed laser 400, or amplifier 470. As another example, one or more optical filters may be located at an input or output of an amplifier 470. In particular embodiments, a lidar system 100 may include one or more optical filters, where each optical filter is configured to reduce an amount of ASE light produced by one or more optical amplifiers 470. As an example, one or more optical filters may be located at the output of an amplifier 470 to reduce the amount of ASE from the amplifier 470 that propagates beyond the amplifier 470. In particular embodiments, a lidar system 100 may include an optical amplifier 470 that includes one or more optical filters, where each optical filter is configured to reduce an amount of ASE light produced by the optical amplifier 470. In particular embodiments, a lidar system 100 that includes one or more optical filters may exhibit a reduced amount of optical or electrical noise relative to a lidar system without optical filters. In particular embodiments, a laser system or amplifier 470 that includes one or more optical filters or optical isolators may be substantially prevented from producing unwanted light (e.g., through Q-switching or self lasing) when no optical pulse is present. As an example, during a time between successive optical pulses, one or more optical filters or isolators may prevent an amplifier 470 from emitting a Q-switched pulse.

Figure 16:
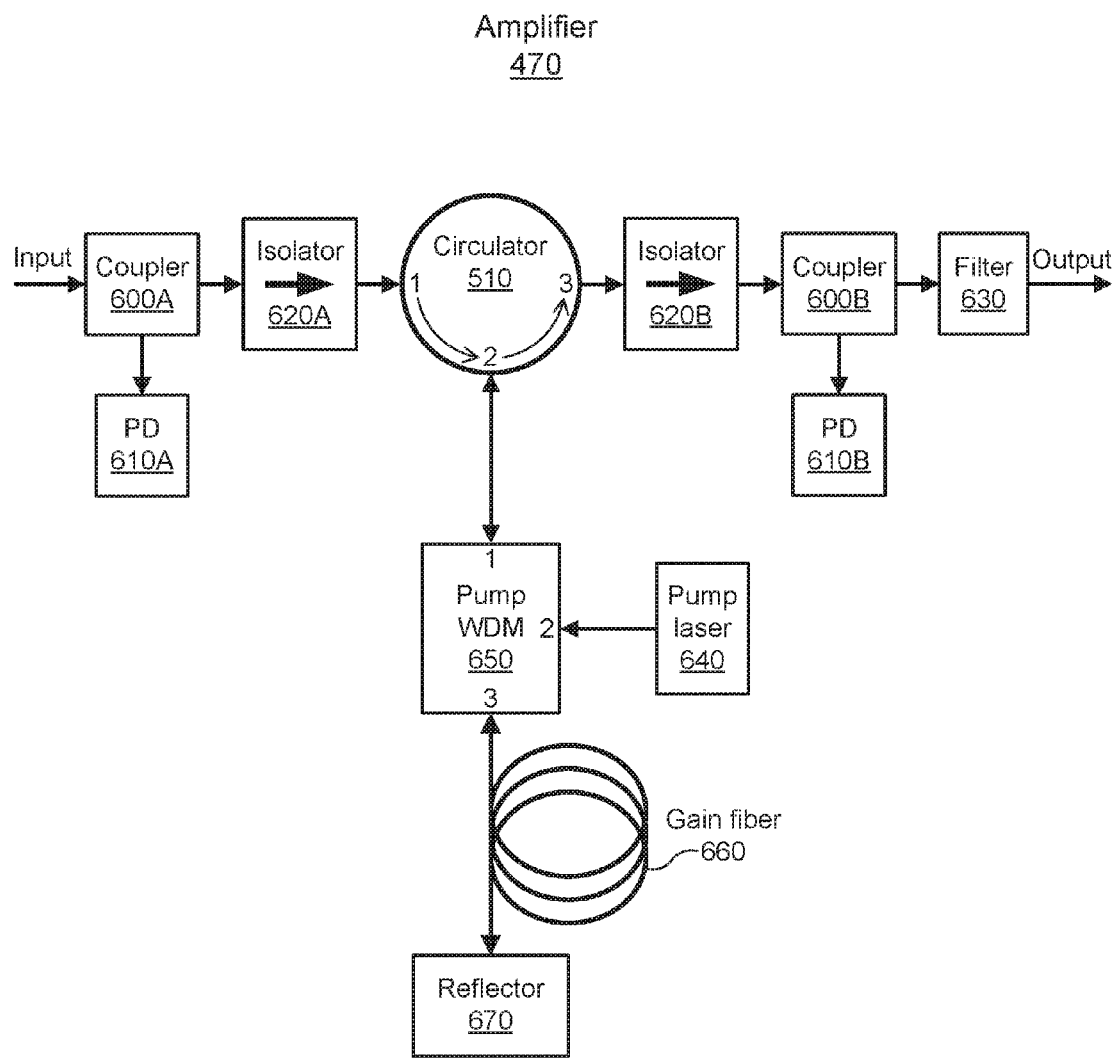
FIG. 16 illustrates an example double-pass fiber-optic amplifier.

FIG. 16 illustrates an example double-pass fiber-optic amplifier 470. In particular embodiments, an optical amplifier 470 may receive light at its input, amplify the input light, and send the amplified light to an output. The received input light may include optical pulses from a seed laser 400 or from a previous amplification state (e.g., two or more amplifiers 470 may be coupled together in series). The amplified output light may be sent to another amplifier 470 (e.g., to provide another stage of amplification), a demultiplexer 410 (e.g., for distribution to multiple optical links 330 or multiple sensor heads 310), an optical link 330, or a sensor head 310. In particular embodiments, an amplifier 470 may be part of a master oscillator power amplifier (MOPA) or master oscillator fiber amplifier (MOFA) in which a master oscillator (e.g., a seed laser 400) sends relatively low-power optical pulses to one or more optical amplifiers 470 for amplification. As an example, an amplifier 470 may receive pulses with an input pulse energy ($E_{in}$) of approximately 10 pJ and produce amplified pulses with an output pulse energy ($E_{out}$) of approximately 10 nJ. The optical gain (G) of the amplifier 470 in decibels, which may be determined from the expression $G=10 \log(E_{out}/E_{in})$, is approximately 30 dB. As another example, an amplifier 470 may receive input pulses with a peak power ($P_{in}$) of approximately 10 W and produce amplified output pulses with a peak power ($P_{out}$) of approximately 1 kW. The optical gain (G) of the amplifier 470, which may be determined from the expression $G=10 \log(P_{out}/P_{in})$, is approximately 20 dB.

In particular embodiments, an optical amplifier 470 may include one or more circulators 510, one or more couplers (600A, 600B), one or more photodiodes (PD 610A, PD 610B), one or more isolators (620A, 620B), one or more filters 630, one or more pump lasers 640, one or more pump WDMs 650, one or more gain fibers 660, or one or more reflectors 670. The double-pass amplifier 470 illustrated in FIG. 16 includes an input coupler 600A and photodiode (PD) 610A, an input isolator 620A, a circulator 510, a pump laser 640 and pump WDM 650, a gain fiber 660, a reflector 670, an output isolator 620B, an output coupler 600B and PD 610B, and an output filter 630. In the example of FIG. 16, after passing through the coupler 600A and isolator 620A, the input light is directed from port 1 to port 2 of circulator 510 and then travels through pump WDM 650 and gain fiber 660. The light is reflected by reflector 670 and travels back through gain fiber 660 and pump WDM 650. During the two passes through the gain fiber 660, the input light undergoes amplification through a process of stimulated emission. The amplified light is directed from port 2 to port 3 of the circulator where it then travels through isolator 620B, coupler 600B, and filter 630. The amplified light is directed to the output of amplifier 470, at which point the amplified output light may be sent to another amplifier 470, a demultiplexer, an optical link 330, or a sensor head 310.

In particular embodiments, a fiber-optic amplifier 470 may include a gain fiber 660 that is optically pumped (e.g., provided with energy) by a pump laser 640. The optically pumped gain fiber 660 provides optical gain to particular wavelengths of light traveling through the gain fiber 660. The pump light and the light to be amplified may both propagate substantially through the core of the gain fiber 660. The gain fiber 660 may be an optical fiber doped with rare-earth ions, such as for example erbium (Er), neodymium (Nd), ytterbium (Yb), praseodymium (Pr), holmium (Ho), thulium (Tm), dysprosium (Dy), any other suitable rare-earth element, or any suitable combination thereof. The rare-earth dopants absorb light from the pump laser 640 and are "pumped" or promoted into excited states that provide amplification to particular wavelengths of light through stimulated emission. The rare-earth ions in excited states may also emit photons through spontaneous emission, resulting in the production of ASE light by amplifier 470. In particular embodiments, an amplifier 470 with erbium-doped gain fiber 660 may be referred to as an erbium-doped fiber amplifier (EDFA) and may be used to amplify light having wavelengths between approximately 1520 nm and approximately 1600 nm. In particular embodiments, a gain fiber 660 may be doped with a combination of erbium and ytterbium dopants and may be referred to as a Er:Yb co-doped fiber, Er:Yb:glass fiber, Er:Yb fiber, Er:Yb-doped fiber, or erbium/ytterbium-doped fiber. An amplifier 470 with Er:Yb co-doped gain fiber may be referred to as an erbium/ytterbium-doped fiber amplifier (EYDFA). An EYDFA may be used to amplify light having wavelengths between approximately 1520 nm and approximately 1620 nm. In particular embodiments, a gain fiber 660 doped with ytterbium may be part of a ytterbium-doped fiber amplifier (YDFA). A YDFA may be used to amplify light having wavelengths between approximately 1000 nm and approximately 1130 nm. In particular embodiments, a gain fiber 660 doped with thulium may be part of a thulium-doped fiber amplifier (TDFA). A TDFA may be used to amplify light having wavelengths between approximately 1900 nm and approximately 2100 nm.

In particular embodiments, a fiber-optic amplifier 470 may refer to an amplifier where light is amplified while propagating through a gain fiber 660 (e.g., the light is not amplified while propagating as a free-space beam). In particular embodiments, an amplifier 470 where the light being amplified makes one pass through a gain fiber 660 may be referred to as a single-pass amplifier 470 (as described below), and an amplifier 470 where the light being amplified makes two passes through a gain fiber 660 (as illustrated in FIG. 16) may be referred to as a double-pass amplifier 470. In particular embodiments, the length of gain fiber 660 in an amplifier 470 may be 0.5 m, 1 m, 2 m, 4 m, 6 m, 10 m, 20 m, or any other suitable gain-fiber length. In particular embodiments, gain fiber 660 may be a SM or LMA optical fiber with a core diameter of approximately 7 µm, 8 µm, 9 µm, 10 µm, 12 µm, 20 µm, 25 µm, or any other suitable core diameter. The numerical aperture (NA), composition, or refractive indices of the components of an optical fiber may be configured so that the optical fiber remains in single-mode operation for the wavelength of light propagating through the fiber. In the example of FIG. 16 (as well as some of the other figures described herein), a line or an arrow between two optical components may represent a fiber-optic cable. As an example, coupler 600A and isolator 620A may be coupled together by a fiber-optic cable represented by the arrow that connects the two components. As another example, the input and output illustrated in FIG. 16 may each represent a fiber-optic cable.

In particular embodiments, pump laser 640 may produce light at any wavelength suitable to provide optical excitation to the dopants of gain fiber 660. As an example, pump laser 640 may be a fiber-coupled laser diode with an operating wavelength of approximately 908 nm, 915 nm, 940 nm, 960 nm, 976 nm, 980 nm, 1050 nm, 1064 nm, 1450 nm, or 1480 nm. As another example, an erbium-doped or erbium/ytterbium-doped gain fiber 660 may be pumped with a 976-nm laser diode. In particular embodiments, pump laser 640 may be operated as a CW light source and may produce any suitable amount of average optical pump power, such as for example, approximately 100 mW, 500 mW, 1 W, 2 W, 5 W, or 10 W of pump power. In particular embodiments, light from pump laser 640 may be coupled into gain fiber 660 via a pump wavelength-division-multiplexer (WDM) 650. A pump WDM 650 may refer to a three-port device that combines input-amplifier light at port 1 having a particular wavelength with pump light at port 2 having a different wavelength and sends the combined light out port 3. As an example, the input-amplifier light may have a wavelength of approximately 1530-1565 nm and may be combined by pump WDM 650 with pump-laser light having a wavelength of approximately 975-985 nm. The combined light is then coupled to gain fiber 660, where the pump-laser light pumps the gain fiber 660, and the input-amplifier light is amplified. The input-amplifier light makes a first pass through the gain fiber, is reflected by reflector 670, and then makes a second pass through the gain fiber 660. The amplified light then passes through pump WDM 650 and back to port 2 of the circulator 510 where it is sent to port 3.

In particular embodiments, reflector 670 may include a mirror or a FBG 520. As an example, reflector 670 may include a metallic or dielectric mirror configured to receive light from gain fiber 660 and reflect the received light back into the gain fiber 660. As another example, reflector 670 may include one or more FBGs 520 configured to reflect light corresponding to one or more operating wavelengths of lidar system 100 and transmit or attenuate light that is away from the reflected wavelengths. For example, reflector 670 may include a FBG 520 that reflects light between approximately 1400 nm to approximately 1440 nm and transmits light over the wavelength ranges of approximately 1300-1400 nm and approximately 1440-1540 nm. In particular embodiments, a double-pass amplifier 470 may include a circulator 510, a gain fiber 660 having a first end and a second end, and a FBG 520, where the first end of the gain fiber 660 is coupled to the circulator 510 and the second end is coupled to the FBG 520. In FIG. 16, the upper end of gain fiber 660 is coupled to port 2 of circulator 510 via pump WDM 650, and the lower end of gain fiber 660 is coupled to reflector 670, which may include one or more FBGs 520.

In particular embodiments, reflector 670 may include a FBG 520 that reflects light at the wavelength of the input light that is received and amplified by amplifier 470. As an example, amplifier 470 may receive pulses of light having a wavelength of approximately 1552 nm, and reflector 670 may include a FBG 520 configured to reflect light at 1552 nm. The FBG 520 may be similar to the FBGs 520 described above with respect to FIG. 12. The FBG 520 may have any suitable reflectively (e.g., reflectivity greater than or equal to 50%, 75%, 90%, 95%, 99%, or 99.9%) over any suitable bandwidth (e.g., Δλ, may be approximately 0.1 nm, 0.2 nm, 0.5 nm, 1 nm, 5 nm, 10 nm, or 20 nm). As an example, reflector 670 may include a FBG 520 with a reflectivity of greater than or equal to 99% over a 2-nm bandwidth centered at 1552 nm. As another example, reflector 670 may include a FBG 520 with a reflectivity of greater than or equal to 90% over a 10-nm bandwidth centered at 1550 nm. In particular embodiments, a reflector 670 may include a FBG 520 with a relatively narrow reflectivity range (e.g., the bandwidth Δλ, may be less than or equal to 0.1 nm, 0.2 nm, 0.5 nm, 1 nm, or 2 nm), and lidar system 100 may include a laser diode 440 that is temperature stabilized so that its operating wavelength matches the reflectivity range of the FBG 520.

In particular embodiments, reflector 670 may include a FBG 520 that reflects light at one or more operating wavelengths and transmits or attenuates light that is away from the one or more operating wavelengths. As an example, the FBG 520 may reflect light from approximately 1555 nm to approximately 1560 nm, and the FBG 520 may transmit light at wavelengths outside that range. In particular embodiments, outside of its range of reflectivity, a FBG 520 may have a reflectivity of less than or equal to 50%, 20%, 10%, 5%, 2%, 1%, 0.5%, or less than any suitable reflectivity value. As an example, a FBG 520 with a reflectivity range of 1555-1560 nm may have a reflectivity of less than or equal to 50% (or, a transmission of greater than or equal to 50%) over the ranges of approximately 1455-1555 nm and approximately 1560-1660 nm. In particular embodiments, out-of-band light (e.g., light that is outside the reflectivity range of a FBG 520) may be substantially transmitted through the FBG 520. In FIG. 16, a reflector 670 that includes a FBG 520 may transmit out-of-band light (e.g., optical noise, such as for example, ASE produced in gain fiber 660) so that the light is dumped out of the reflector 670 and is not reflected back into the gain fiber 660. In particular embodiments, a reflector 670 that includes a FBG 520 may act as a spectral filter by removing greater than or equal to 50%, 60%, 80%, 90%, 95%, or 99% of the out-of-band light received by the reflector 670. As an example, greater than or equal to 90% of ASE light that is produced in the gain fiber 660 and that propagates to reflector 670 may be transmitted through the reflector 670 and effectively removed from the amplifier 470. In particular embodiments, reflector 670 may include a FBG 520 that reflects light at a pump-laser wavelength (e.g., 976 nm). Light from pump laser 640 that is not absorbed in the gain fiber 660 may be reflected by reflector 670 to make a second pass through the gain fiber 660. This may result in an improvement in pumping efficiency since a greater fraction of pump-laser light may be absorbed by configuring the pump light to make two passes through the gain fiber 660.

In particular embodiments, reflector 670 may include two or more FBGs 520 coupled together in series. As an example, reflector 670 may include a wavelength-dependent delay line similar to the wavelength-dependent delay line 500 described above. In particular embodiments, a reflector 670 with a wavelength-dependent delay line may include N FBGs 520 and N−1 fiber delays 530 connected together in series as illustrated in FIG. 12. As an example, reflector 670 may include a wavelength-dependent delay line that separates a broadband pulse of light into N time-delayed pulses of light or that separates N time-coincident pulses of light into N time-delayed pulses of light. As another example, the input light to the amplifier 470 may include N time-coincident pulses of light having N different wavelengths, and the output light from the amplifier 470 may include N amplified pulses that are time delayed with respect to one another according to wavelength.

In particular embodiments, coupler 600A may be a fiber-optic splitter or tap coupler that splits off a portion of input light and sends it to PD 610A. The remaining light that is not split-off propagates on to isolator 620A. Similarly, coupler 600B may be a tap coupler that splits off a portion of output light and sends it to PD 610B with the remaining light proceeding to filter 630. The tap coupler 600A or 600B may couple approximately 0.5%, 1%, 2%, 3%, 5%, 10%, or any other suitable percentage of light to PD 610A or PD 610B, respectively. As an example, input coupler 600A may split off approximately 10% of the input light and direct it to PD 610A and send the remaining approximately 90% of input light on to the isolator 620A. As another example, output coupler 600B may split off approximately 1% of the amplified light and direct it to PD 610B and send the remaining approximately 99% of the amplified light on to the filter 630. In particular embodiments, an amplifier 470 may include an input coupler 600A, an output coupler 600B, or both an input coupler 600A and an output coupler 600B.

In particular embodiments, PD 610A or 610B may be a silicon, germanium, or InGaAs PN or PIN photodiode. In particular embodiments, coupler 600A and PD 610A may be used to monitor the light coming into the amplifier 470, and coupler 600B and PD 610B may be used to monitor the light after amplification. As an example, PD 610A may receive the split-off input light from coupler 600A, and PD 610A may generate an electrical signal based on the received light. Similarly, PD 610B may receive the split-off output light from coupler 600B, and PD 610B may generate an electrical signal based on the output light. The electrical signal from PD 610A or PD 610B may be sent to a processor or controller 150 for monitoring the status of the input or output light, respectively. If a voltage or current of the electrical signal from PD 610A drops below a particular predetermined threshold level, then a processor or controller 150 may determine that there is insufficient light coming into the amplifier 470. The amplifier 470 may be shut down or disabled (e.g., the pump laser 640 may be turned off or the amount of light it produces may be reduced) to avoid possible damage to the amplifier 470. If a voltage or current of the electrical signal from PD 610B drops below a particular predetermined threshold level, then a processor or controller 150 may determine that there is a problem with amplifier 470 (e.g., there may be a broken optical fiber, pump laser 640 may be failing, or one of the other components in amplifier 470 may be failing). In particular embodiments, signals from PD 610A or PD 610B may be used to adjust or monitor the gain or output power of amplifier 470. As an example, a ratio of signals from PDs 610A and 610B may be used to determine the gain of amplifier 470, and the amplifier gain may be adjusted by changing the pump-laser current (which changes the amount of pump power provided by pump laser 640). As another example, a signal from PD 610B may be used to determine the output power of amplifier 470, and the amplifier output power may be adjusted by changing the current supplied to pump laser 640.

In particular embodiments, amplifier 470 may include an input optical isolator 620A or an output optical isolator 620B. An optical isolator (620A, 620B) may include a Faraday rotator, and the operation of an optical isolator may be based on the Faraday effect where the polarization of light traveling through the isolator is rotated in the same direction regardless of the direction of travel of the light. In particular embodiments, an optical isolator (620A, 620B) may be a fiber-coupled device configured to reduce or attenuate backward-propagating light. Backward-propagating light may originate from ASE light from a gain fiber 660 or from optical reflections at one or more optical interfaces of the components in amplifier 470, and the backward-propagating light may destabilize or cause damage to a seed laser 400, laser diode 440 or amplifier 470. Isolators 620A and 620B in FIG. 16 are configured to allow light to pass in the direction of the arrow drawn in the isolator and block light propagating in the reverse direction. In FIG. 16, a laser diode 440 may provide the input light to amplifier 470, and isolator 620A may significantly reduce the amount of backward-propagating light that travels back to the laser diode 440. The output of amplifier 470 in FIG. 16 may be coupled to a second amplifier, and isolator 620B may reduce the amount of light that propagates back into the amplifier 470.

In FIG. 16, input isolator 620A may allow light to propagate from coupler 600A to port 1 of circulator 510, but any light propagating in the reverse direction may be attenuated. As an example, back-reflected light propagating from port 1 of circulator 510 to isolator 620A may be attenuated by greater than or equal to 5 dB, 10 dB, 20 dB, 30 dB, 40 dB, 50 dB, or any other suitable attenuation value. As another example, if isolator 620A attenuates back-reflected light by greater than or equal to 30 dB, then less than or equal to 0.1% of light propagating from port 1 of circulator 510 may be transmitted through the isolator 620A and to coupler 600A. In particular embodiments, circulator 510 may perform an optical isolation function. As an example, amplifier 470 may not include isolator 620A or 620B, and circulator 510 may include one or more optical elements that act as an input or output optical isolator.

In particular embodiments, an amplifier 470 may include an optical filter 630. The output optical filter 630 in FIG. 16 may be configured to remove greater than or equal to 50% of the optical noise propagating toward the amplifier output (e.g., the optical noise may include ASE produced by the gain fiber 660). In particular embodiments, amplifier 470 may include an optical filter 630 located at the amplifier input, an optical filter 630 located at the amplifier output, or optical filters 630 located at both the input and output of amplifier 470. In particular embodiments, amplifier 470 may include an optical filter 630 that includes a spectral filter (as described above with respect to FIG. 14) or a temporal filter (as described above with respect to FIG. 15). As an example, amplifier 470 may include an optical filter 630 located at the input to amplifier 470, and the optical filter 630 may include a spectral filter, a temporal filter, or a combination of spectral and temporal filters. An input optical filter 630 may reduce the amount of optical noise (e.g., ASE from a previous amplifier stage) at the input to an amplifier 470. In the example of FIG. 16, amplifier 470 includes an optical filter 630 located at the output of amplifier 470. An output optical filter 630 (which may include a spectral filter, a temporal filter, or a combination of spectral and temporal filters) may reduce the amount of optical noise accompanying the amplified optical pulses that propagate out of amplifier 470. The optical noise may include ASE from gain fiber 660 that is coupled to port 3 of circulator and toward the amplifier output. As an example, optical filter 630 in FIG. 16 may remove greater than or equal to 80% of the ASE from the output of amplifier 470.

Figure 17:
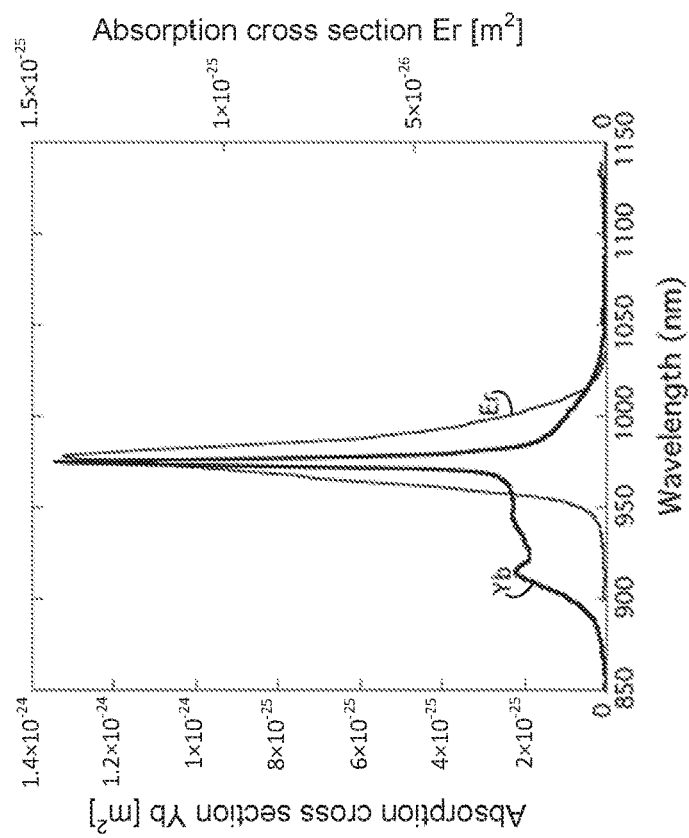
FIG. 17 illustrates example absorption spectra for erbium and ytterbium ions incorporated into a glass host (e.g., fused silica).

FIG. 17 illustrates example absorption spectra for erbium and ytterbium ions incorporated into a glass host (e.g., fused silica). Erbium exhibits an absorption spectrum that extends from approximately 950 nm to approximately 1020 nm. Ytterbium exhibits an absorption spectrum that extends from approximately 890 nm to approximately 1020 nm. The erbium and ytterbium ions have a peak absorption between approximately 970 nm and approximately 985 nm. As an example, an erbium-doped or ytterbium-doped fiber amplifier 470 may be pumped with a pump laser 640 having a wavelength of approximately 976 nm or 980 nm.

Figure 18:
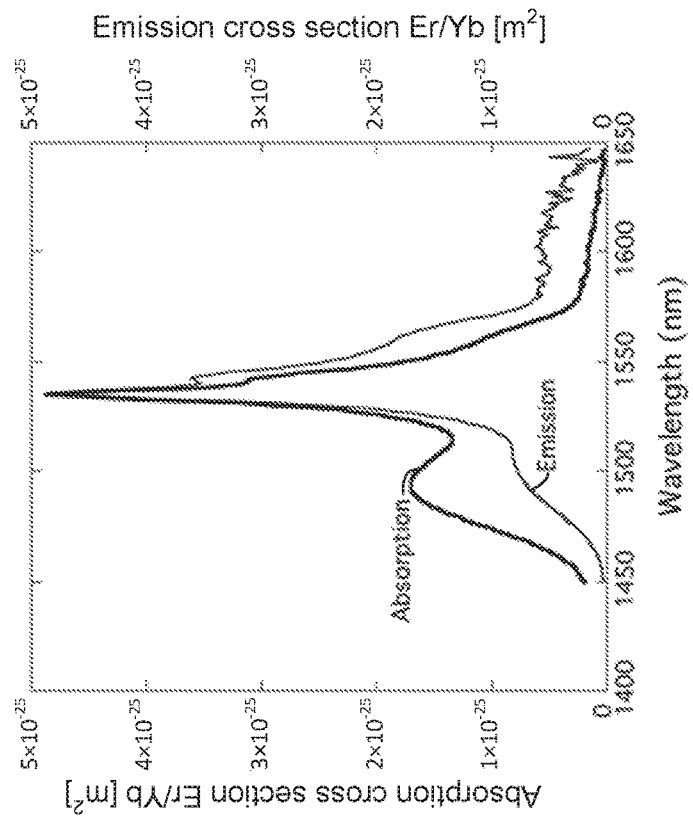
FIG. 18 illustrates example absorption and emission spectra for a glass host doped with a combination of erbium and ytterbium.

FIG. 18 illustrates example absorption and emission spectra for a glass host doped with a combination of erbium and ytterbium. The erbium/ytterbium emission spectra extends from approximately 1470 nm to approximately 1630 nm. As an example an EYDFA with Er:Yb-doped gain fiber may be used to amplify light having wavelengths between approximately 1470 nm and approximately 1630 nm.

Figure 19:
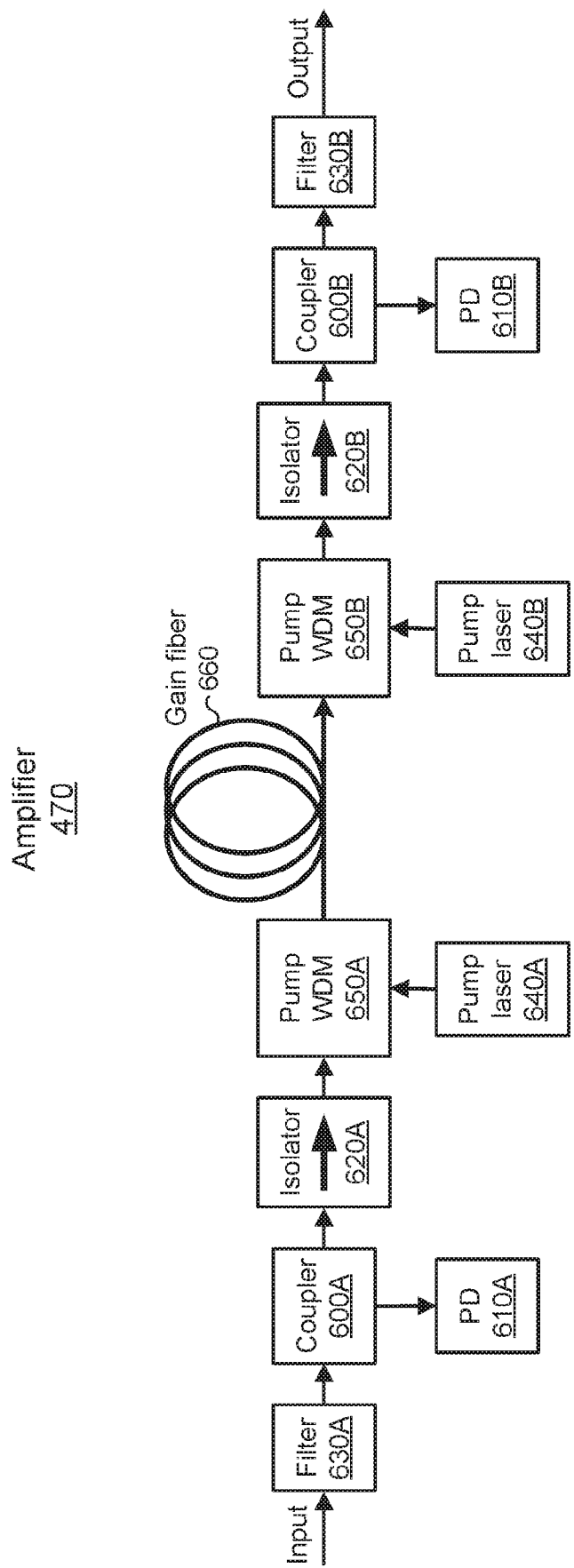
FIG. 19 illustrates an example single-pass fiber-optic amplifier.

FIG. 19 illustrates an example single-pass fiber-optic amplifier 470. In FIG. 19, input light makes a single pass through the gain fiber 660, and after passing through the output of amplifier 470, the amplified output light may be sent to another amplifier 470, a demultiplexer, an optical link 330, or a sensor head 310. In particular embodiments, a single-pass amplifier 470 may include one or more optical filters (e.g., 630A or 630B), couplers (e.g., 600A or 600B), photodiodes (e.g., 610A or 610B), isolators (e.g., 620A or 620B), gain fibers 660, pump lasers (e.g., 640A or 640B), or pump WDMs (e.g., 650A or 650B). The single-pass amplifier 470 illustrated in FIG. 19 has an input that includes an input filter 630A, an input coupler 600A and PD 610A, and an input isolator 620A. The optical gain for the amplifier 470 is provided by pump lasers 640A and 640B which are coupled to gain fiber 660 through pump WDMs 650A and 650B, respectively. The gain fiber 660 in FIG. 19 may be an erbium-doped or erbium/ytterbium-doped gain fiber 660. The single-pass amplifier 470 illustrated in FIG. 19 has an output that includes an output isolator 620B, an output coupler 600B and PD 610B, and an output filter 630B.

In particular embodiments, an amplifier 470 may include 1, 2, 3, or any other suitable number of pump lasers 640. The double-pass amplifier 470 in FIG. 16 includes one pump laser 640, and the single-pass amplifier 470 in FIG. 19 includes two pump lasers (640A, 640B). In particular embodiments, a double-pass amplifier 470 may include one pump laser 640 (as illustrated in FIG. 16), or a double-pass amplifier 470 may include two pump lasers 640 (e.g., one pump laser coupled to each end of the gain fiber 660). In particular embodiments, a single-pass amplifier 470 may have one pump laser (e.g., pump laser 640A or 640B), or a single-pass amplifier 470 may have two pump lasers (e.g., pump lasers 640A and 640B). In particular embodiments, a pump laser may be co-propagating or counter-propagating with respect to the light that is amplified by an amplifier 470. In FIG. 19, pump laser 640A is a co-propagating pump laser (e.g., the pump-laser light propagates in the same direction as the light that is amplified by the amplifier 470), and pump laser 640B is a counter-propagating pump laser (e.g., the pump-laser light propagates in the opposite direction to the light that is amplified). In particular embodiments, one pump laser may be used to provide pump light to both ends of a gain fiber 660. As an example, pump laser 640A in FIG. 19 may be split (e.g., with a 3-dB fiber-optic power splitter) into two fibers, where one fiber is coupled to pump WDM 650A and the other fiber is coupled to pump WDM 650B. In particular embodiments, two or more pump lasers with different wavelengths may be combined together using a wavelength combiner or a WDM device. As an example, light from a pump laser operating at 974 nm may be combined with light from a pump laser operating at 976 nm, and the combined 974-nm/976-nm pump light may be coupled into a gain fiber 660. In particular embodiments, an amplifier 470 that includes multiple pump lasers may provide higher pump power to a gain fiber 660 or may provide redundant pump-laser sources in case one of the pump lasers fails.

Figure 20:
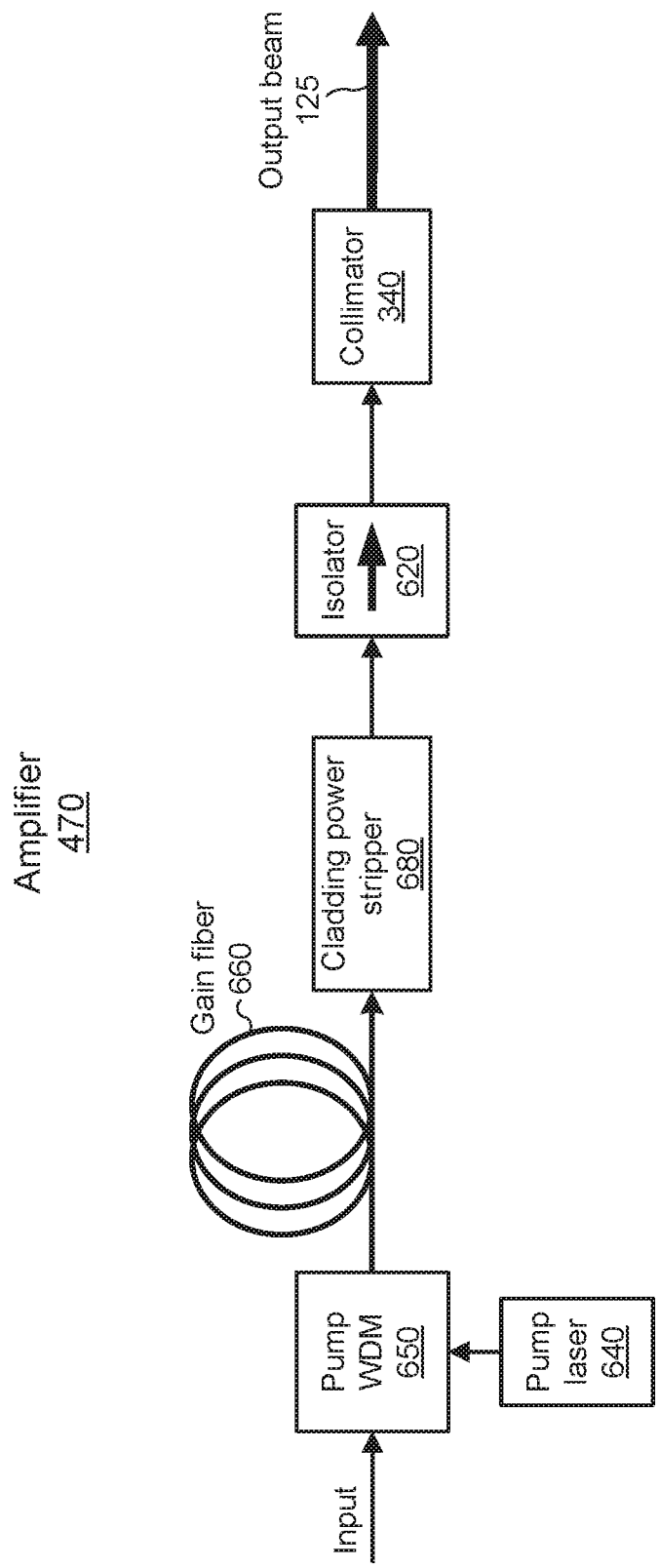
FIG. 20 illustrates an example booster amplifier that produces a free-space output beam.

FIG. 20 illustrates an example booster amplifier 470 that produces a free-space output beam 125. In particular embodiments, a booster amplifier 470 may refer to an amplifier that sends an output beam 125 to a scanner 120 or a sensor head 310, or a booster amplifier 470 may refer to an amplifier that provides a final amplification stage in a series of two or more amplifiers. As an example, booster amplifier 470 in FIG. 20 may receive optical pulses that have been amplified by one or more previous amplifiers (e.g., a single-stage amplifier 470 or a double-stage amplifier 470), and the booster amplifier 470 may produce a free-space output beam 125 that is directed to a scanner 120 or a sensor head 310. As another example, booster amplifier 470 may receive unamplified optical pulses (e.g., from a pulsed laser diode), and booster amplifier 470 may provide a single stage of optical amplification prior to sending a free-space output beam 125 to a scanner 120. In particular embodiments, a booster amplifier 470 may include an output collimator 340 configured to receive amplified optical pulses produced in gain fiber 660 and produce a free-space optical beam 125 that includes the amplified optical pulses. As an example, the booster amplifier 470 in FIG. 20 may be a fiber-optic amplifier that is terminated at output collimator 340, and output collimator 340 may produce a free-space output beam 125.

In particular embodiments, a booster amplifier 470 may provide any suitable amount of optical power gain, such as for example, a gain of approximately 3 dB, 5 dB, 7 dB, 10 dB, 15 dB, 20 dB, or 30 dB. As an example, a booster amplifier 470 may receive pulses with a 100-mW average power and produce amplified pulses with a 1-W average power, corresponding to an optical gain of approximately 10 dB. In particular embodiments, a booster amplifier 470 may include a single pump laser 640 (e.g., a co-propagating or counter-propagating pump laser) or two or more pump lasers 640 (e.g., a co-propagating pump and a counter-propagating pump). As an example, a booster amplifier 470 may include a counter-propagating pump laser 640 located on the output side of the amplifier 470. In FIG. 20, the booster amplifier 470 includes a co-propagating pump laser 640 (along with a pump WDM 650) located on the input side of the amplifier 470.

In particular embodiments, a booster amplifier 470 may include a gain fiber 660 that is a double-clad gain fiber 660. In particular embodiments, a double-clad gain fiber 660 may include a core, inner cladding, and outer cladding, where the core is doped with a rare-earth material. As an example, the core may be doped with erbium, or the double-clad gain fiber 660 may be a Er:Yb co-doped fiber where the core is doped with a combination of erbium and ytterbium. The refractive indices of the core, inner cladding, and outer cladding may be configured so that the pump-laser light is confined to propagate primarily in the inner cladding, and the amplified light is confined to propagate primarily in the core. In particular embodiments, a double-clad gain fiber 660 may have a core with any suitable diameter, such as for example, a diameter of approximately 7 µm, 8 µm, 9 µm, 10 µm, 12 µm, 20 µm, or 25 µm. In particular embodiments, gain fiber 660 may be a double-clad photonic-crystal fiber that includes a core doped with rare-earth material where the core is surrounded by an arrangement of holes that extend along the length of the gain fiber 660.

In particular embodiments, amplifier 470 may include a cladding power stripper 680, which may also be referred to as a cladding mode stripper. A cladding power stripper 680 may be used to absorb or remove light from the inner cladding or outer cladding in a double-clad gain fiber 660. As an example, cladding power stripper 680 may be located on the opposite side of the gain fiber 660 from the pump laser 640, and the cladding power stripper 680 may remove residual, unabsorbed pump-laser light that propagates through the gain fiber 660 without being absorbed in the gain fiber 660. As an example, the residual pump-laser light may be removed from the inner cladding of the gain fiber 660 to prevent the residual pump light from accompanying the amplified pulses as they exit the amplifier 470. Additionally, the cladding power stripper 680 may remove ASE produced by the gain fiber 660 that propagates in the inner or outer cladding.

Figure 21:
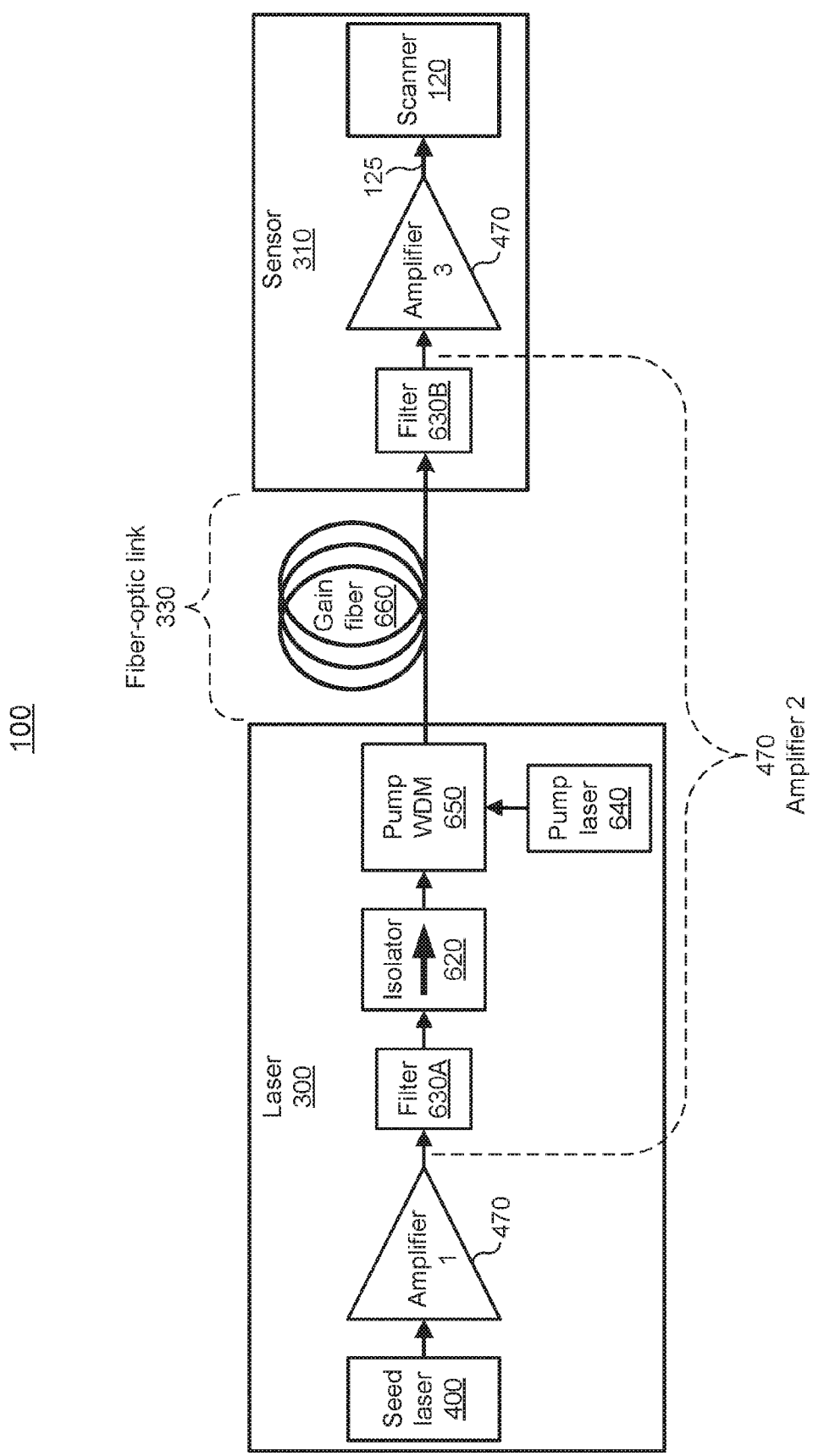
FIG. 21 illustrates an example lidar system that includes three amplifiers.

FIG. 21 illustrates an example lidar system 100 that includes three amplifiers 470 (amplifier 1, amplifier 2, and amplifier 3). In the example of FIG. 21, lidar system 100 includes laser 300, fiber-optic link 330, and sensor 310. Laser 300 includes seed laser 400, amplifier 1, and the input portion of amplifier 2, and fiber-optic link 330 includes the gain fiber 660 of amplifier 2. The sensor head 310 includes amplifier 3 and scanner 120 along with the output portion (e.g., filter 630B) of amplifier 2. In particular embodiments, amplifier 1 may be a double-pass amplifier (e.g., similar to the double-pass amplifier 470 illustrated in FIG. 16), and amplifier 2 may be a single-pass amplifier (e.g., similar to the single-pass amplifier 470 illustrated in FIG. 19). Amplifier 1 may act as a preamplifier and amplify seed pulses from seed laser 400. Amplifier 2 may act as a mid-stage amplifier that receives and amplifies the pulses from amplifier 1. Amplifier 3 may act as a booster amplifier (e.g., similar to the booster amplifier 470 illustrated in FIG. 20) that provides a final amplification stage and produces a free-space output beam 125 that is sent to scanner 120. In particular embodiments, light may be coupled into or out of an amplifier 470 by an optical fiber (e.g., a SM fiber, MM fiber, PM fiber, LMA fiber, photonic-crystal fiber, or photonic-bandgap fiber), or light may be coupled into or out of an amplifier by a free-space beam (e.g., an amplifier output may be terminated by a free-space collimator 340).

In particular embodiments, a lidar system 100 may include a laser 300 with one or more optical amplifiers 470, and the lidar system 100 may include multiple optical links 330. Each optical link 330 may include a gain fiber 660 of an optical amplifier 470, where the gain fiber 660 is distributed along part of or substantially all of the optical link 330. In FIG. 21, laser 300 includes amplifier 1, and optical link 330 includes the gain fiber 660 of amplifier 2. In FIG. 21, gain fiber 660 is part of the fiber-optic link 330, and gain fiber 660 amplifies optical pulses while the pulses are conveyed from laser 300 to sensor 310. In particular embodiments, each optical link 330 of a lidar system 100 may include a gain fiber 660 of a fiber-optic amplifier 470, where the gain fiber 660 is configured to amplify pulses of light received from a seed laser 400, a laser diode 440, or a previous amplifier 470. In FIG. 21, the gain fiber 660 amplifies pulses of light while the light propagates from laser 300 to a corresponding sensor head 310. Additionally, the gain fiber 660 forms at least part of the optical link 330 between laser 300 and a corresponding sensor head 310.

In particular embodiments, one or more components of an amplifier 470 may be located in one or more different parts of lidar system 100, and the amplifier 470 may be referred to as a distributed amplifier 470. As an example, a distributed amplifier 470 may include one or more filters 630, isolators 620, couplers 600, PDs 610, pump lasers 640, pump WDMs 650, or gain fibers 660 located at least in part in laser 300, fiber-optic link 330, or sensor head 310. As another example, a distributed amplifier 470 may include one pump laser 640 located in laser 300 or sensor 310 (e.g., the pump laser 640 may be co-propagating or counter-propagating). As another example, a distributed amplifier 470 may include one pump laser 640 located in laser 300 and another pump laser 640 located in sensor 310. In the example of FIG. 21, amplifier 2 is a distributed amplifier 470 where input filter 630A, input isolator 620, pump laser 640, and pump WDM 650 are located in laser 300, and output filter 630B is located in sensor 310.

In particular embodiments, a lidar system 100 may include multiple sensor heads 310, where each sensor head includes one or more optical amplifiers 470 (e.g., a preamplifier, a mid-stage amplifier, or a booster amplifier), which may be referred to as sensor-head amplifiers 470. A sensor-head amplifier 470 may be configured to receive pulses of light from a corresponding optical link 330 and amplify the received pulses of light. The sensor-head amplifier 470 may amplify pulses of light conveyed to the sensor head 310 by an optical link 330, and after amplifying the pulses, the sensor-head amplifier 470 may direct the amplified pulses of light to a scanner 120 for scanning across a field of regard of the sensor head 310. In FIG. 21, sensor head 310 includes filter 630B, amplifier 3, and scanner 120. Amplifier 3 is a sensor-head amplifier 470 that receives pulses from fiber-optic link 330 via filter 630B, amplifies the received pulses, and sends the amplified pulses to scanner 120. In particular embodiments, a sensor-head amplifier 470 may be a fiber-optic amplifier or a free-space amplifier.

In particular embodiments, a lidar system 100 may include a laser system (which may be referred to as a light source) that is contained within a part of the lidar system 100 (e.g., within laser 300), or a lidar system 100 may include a distributed laser system that is contained within two or more parts of the lidar system 100. As an example, a laser system that produces and amplifies optical pulses may be located within laser 300 or within sensor head 310. As another example, one or more parts of a distributed laser system that produces and amplifies optical pulses may be located or contained within laser 300, fiber-optic link 330, or sensor head 310. FIG. 21 illustrates a distributed laser system that includes seed laser 400, amplifier 1, amplifier 2, and amplifier 3, where parts of the laser system are located in laser 300, fiber-optic link 330, and sensor head 310.

In particular embodiments, a lidar system 100 may include a laser system that includes: a seed laser 400; a first fiber-optic amplifier 470; a first optical filter 630A; and a second fiber-optic amplifier 470. In particular embodiments, the laser system may also include a second optical filter 630B, or the laser system may also include a third fiber-optic amplifier 470. The seed laser 400 may produce optical seed pulses which are amplified by the first amplifier 470 with a first amplifier gain (e.g., 10 dB, 20 dB, 30 dB or 40 dB) to produce a first-amplifier output that includes amplified seed pulses and ASE. The first optical filter 630A (which may include a spectral filter, a temporal filter, or a combination of a spectral filter and temporal filter) may remove from the first-amplifier output an amount of the ASE (e.g., remove approximately 50%, 60%, 70%, 80%, 90%, 95%, or 99% of the ASE). The second amplifier 470 may receive the amplified seed pulses from the first optical filter and amplify the received pulses by a second amplifier gain (e.g., 10 dB, 20 dB, 30 dB or 40 dB) to produce output pulses. In particular embodiments, the output pulses may be sent to a third amplification stage, to a demultiplexer 410, to a fiber-optic link 330, or to a scanner 120 of a sensor 310. In particular embodiments, the laser system may include a second optical filter 630B (which may include a spectral filter, a temporal filter, or a combination of a spectral filter and a temporal filter) that receives the output pulses from the second amplifier 470 and removes an amount of ASE produced by the second amplifier 470 (e.g., removes approximately 50%, 60%, 70%, 80%, 90%, 95%, or 99% of the ASE). In particular embodiments, the laser system may include a third amplifier 470 that receives the output pulses from the second amplifier 470 and amplifies the pulses by a third amplifier gain (e.g., 10 dB, 20 dB, 30 dB or 40 dB). In particular embodiments, the amplified pulses from the third amplifier 470 may be sent to a fourth amplification stage, to a demultiplexer 410, to a fiber-optic link 330, or to a scanner 120 of a sensor 310.

In particular embodiments, the optical seed pulses produced by a seed laser 400 may have an average power of greater than or equal to 1 µW, and the output pulses from a second amplifier 470 may have an average power of greater than or equal to 1 mW. In particular embodiments, the first amplifier gain and the second amplifier gain together may correspond to an overall optical power gain of greater than or equal to 40 dB (e.g., the sum of the first amplifier gain and the second amplifier gain may be greater than or equal to 40 dB). As an example, the first amplifier gain may be approximately equal to 10 dB, 20 dB, or 30 dB, and the second amplifier gain may be approximately equal to 10 dB, 20 dB, or 30 dB. As another example, the first amplifier gain may be approximately equal to 30 dB, and the second amplifier gain may be approximately equal to 20 dB, corresponding to an overall gain of approximately 50 dB.

In particular embodiments, the first fiber-optic amplifier 470 of a laser system may include a single-pass amplifier (e.g., with an erbium-doped or erbium/ytterbium-doped gain fiber 660), and the second fiber-optic amplifier 470 may include another single-pass amplifier (e.g., with an erbium-doped or erbium/ytterbium-doped gain fiber 660). In particular embodiments, the first fiber-optic amplifier 470 of a laser system may include a double-pass amplifier (e.g., with a circulator 510, a gain fiber 660, and one or more FBGs 520), and the second fiber-optic amplifier 470 may include a single-pass amplifier (e.g., with an erbium-doped or erbium/ytterbium-doped gain fiber 660). Additionally, the laser system may also include a third fiber-optic amplifier 470, where the third amplifier 470 is a booster amplifier (e.g., with a double-clad gain fiber 660 that includes erbium dopants or erbium and ytterbium dopants). In particular embodiments, the first fiber-optic amplifier 470 may include a single-pass or double-pass amplifier, and the second fiber-optic amplifier 470 may include a booster amplifier that sends a free-space output beam 125 to a scanner 120 of a sensor 310 (e.g., the first amplifier 470 may be located in laser 300 and the second amplifier 470 may be located in sensor 310). The lidar system 100 in FIG. 21 may be referred to as having a laser system that includes seed laser 400, amplifier 1, amplifier 2, and amplifier 3. Amplifiers 1, 2, and 3 may correspond to the first, second, and third amplifiers, respectively, as described above. Additionally, filters 630A and 630B in FIG. 21 may correspond to the first and second optical filters as described above.

In particular embodiments, the output pulses produced by a laser system with two or three stages of amplification may have output-pulse characteristics that include one or more of the following: a pulse repetition frequency of less than or equal to 100 MHz (e.g., approximately 500 kHz, 640 kHz, 750 kHz, 1 MHz, 2 MHz, 4 MHz, 5 MHz, 10 MHz, 20 MHz, 50 MHz, or 100 MHz); a pulse duration of less than or equal to 20 nanoseconds (e.g., approximately 200 ps, 400 ps, 500 ps, 800 ps, 1 ns, 2 ns, 4 ns, 8 ns, 10 ns, 15 ns, or 20 ns); a duty cycle of less than or equal to 1% (e.g., approximately 0.01%, 0.02%, 0.05%, 0.1%, 0.2%, 0.5%, or 1%); an operating wavelength of between 1400 nm and 2050 nm; a pulse energy of greater than or equal to 10 nanojoules (e.g., approximately 10 nJ, 50 nJ, 100 nJ, 500 nJ, 1 µJ, 2 µJ, 5 µJ, or 10 µJ); a peak pulse power of greater than or equal to 1 watt (e.g., approximately 1 W, 10 W, 50 W, 100 W, 200 W, 500 W, 1 kW, 2 kW, or 10 kW); or an average power of less than or equal to 50 watts (e.g., approximately 50 W, 20 W, 10 W, 5 W, 2 W, 1 W, 0.5 W, or 0.1 W). As an example, a laser system may produce an output beam 125 with a pulse repetition frequency of between approximately 500 kHz and approximately 750 kHz, and the pulses may have a pulse duration between approximately 500 ps and approximately 5 ns. As another example, a laser system may produce pulses with a pulse repetition frequency of approximately 750 kHz and a pulse duration of approximately 1 ns, corresponding to a duty cycle of approximately 0.075%. As another example, a laser system may produce pulses with a pulse repetition frequency of approximately 1 MHz and a pulse duration of approximately 5 ns, corresponding to a duty cycle of approximately 0.5%. As another example, a laser system may produce pulses with a pulse duration of approximately 10 ns and a pulse energy of approximately 100 nJ, which corresponds to pulses with a peak power of approximately 10 W. As another example, a laser system may produce pulses with a pulse duration of approximately 700 ps and a pulse energy of approximately 1 µJ, which corresponds to pulses with a peak power of approximately 1.4 kW. As another example, a laser system may produce pulses with a pulse energy of approximately 2 µJ and a pulse repetition frequency of approximately 1 MHz, corresponding to an average power of approximately 2 W. As another example, a laser system may produce an output beam 125 with an average power of less than or equal to 50 W, where the output beam 125 includes ASE that makes up less than or equal to 1%, 5%, 10%, or 25% of the average power, and the optical pulses in the output beam 125 make up greater than or equal to 99%, 95%, 90%, or 75% of the average power, respectively.

In particular embodiments, an optical amplifier 470 may include any suitable number or type of optical components having any suitable arrangement. In particular embodiments, an amplifier 470 may include some, none, or all of the components illustrated in FIG. 16, 19, 20, or 21. In particular embodiments, an amplifier 470 may include 0, 1, 2, or any other suitable number of couplers and associated PDs. As an example, an amplifier 470 may include only one coupler with an associated PD (e.g., an input coupler 600A and PD 610A or an output coupler 600B and PD 610B), or an amplifier 470 may include both an input coupler 600A and an output coupler 600B (along with associated PDs 610A and 610B), as illustrated in FIG. 16. As another example, an amplifier 470 may include a coupler and PD configured to tap off and monitor light from a pump laser 640. As another example, an amplifier 470 may include neither an input coupler 600A nor an output coupler 600B. In particular embodiments, an amplifier 470 may include 0, 1, 2, or any other suitable number of optical isolators. As an example, an amplifier 470 may include an input isolator 620A or an output isolator 620B, or an amplifier 470 may include both an input isolator 620A and an output isolator 620B, as illustrated in FIG. 16. An amplifier 470 may not have an input isolator 620A if it receives input optical pulses produced by a laser diode 440 that includes an optical isolator in its package. In particular embodiments, an amplifier 470 may include 0, 1, 2, or any other suitable number of optical filters 630. As an example, an amplifier 470 may include only one optical filter 630 (e.g., a filter located at an input or output of amplifier 470), or an amplifier 470 may include optical filters 630 located at both the input and output of amplifier 470.

In particular embodiments, an amplifier 470 may include any suitable optical components arranged in any suitable order. As an example, an amplifier 470 may include a filter 630 followed by an isolator (620A, 620B), or vice versa. In particular embodiments, an amplifier input may include a filter 630, coupler 600A, isolator 620A, or any other suitable component arranged in any suitable order. As an example, an amplifier input may include a coupler 600A followed by an isolator 620A, or an amplifier input may include an isolator 620A followed by a coupler 600A. Additionally, an amplifier input may include a filter 630 located before or after a coupler 600A or isolator 620A. The amplifier 470 in FIG. 16 has an input that includes coupler 600A followed by isolator 620A. In particular embodiments, an amplifier output may include an isolator 620B, coupler 600B, PD 610 B, filter 630, or any other suitable component arranged in any suitable order. For example, an amplifier output may include an isolator 620B followed by a filter 630, or vice versa. In FIG. 16, the amplifier output includes isolator 620B followed by coupler 600B, which is followed by filter 630.

In particular embodiments, two or more optical components may be combined together into a single fiber-optic package. As an example, rather than having a discrete or separate coupler 600A and isolator 620A, the two components may be combined together into a single package that includes a coupler 600A and an isolator 620A. The package may have three fiber-optic ports: one input port, one output port, and one port for split-off light to be sent to a PD 610A. As another example, a coupler 600A, isolator 620A, and PD 610A may be combined together into a single package. As another example, isolator 620A and pump WDM 650A may be packaged together in a single package. As another example, pump WDM 650B and tap coupler 600B may be combined together into a single package. As another example, isolator 620A, pump WDM 650A, and tap coupler 600A may be combined together into a single package. As another example, isolator 620 and collimator 340 may be combined together into a single package.

In particular embodiments, all or most of the optical components of an amplifier 470 may be packaged together within a single housing, where a housing may refer to a box, case, or enclosure that holds or contains the amplifier components. As an example, the components illustrated in FIG. 16 or FIG. 19 may be packaged together in a single housing, and the housing may have an input fiber and an output fiber. The housing may also include one or more electrical connections for conveying electrical power or electrical signals to or from the amplifier 470. As another example, the components illustrated in FIG. 20 may be packaged together in a single housing, and the housing may have an input fiber and may produce a free-space output beam 125. In particular embodiments, the optical components for two or more amplifiers 470 may be packaged together within a single housing. As an example, a housing may contain the optical components for a double-pass amplifier (e.g., amplifier 470 of FIG. 16) and the optical components for a single-pass amplifier (e.g., amplifier 470 of FIG. 19). The two amplifiers may be coupled together forming a two-stage optical amplifier. In particular embodiments, the optical components for a laser 300 may be packaged together within a single housing. As an example, the seed laser 400 and amplifier 1 illustrated in FIG. 21 may be packaged together into a single housing. As another example, the seed laser 400, amplifier 1, and input portion of amplifier 2 illustrated in FIG. 21 may be packaged together into a single housing. In particular embodiments, a seed laser 400 and one or more amplifier stages 470 may be packaged together into a single housing. As an example, a seed laser 400, a first-stage amplifier (e.g., amplifier 470 of FIG. 16), and a second-stage amplifier (e.g., amplifier 470 of FIG. 19) may be packaged together within a single housing. Additionally, the two amplifiers 470 may include an optical filter 630 that is disposed between the amplifiers.

In particular embodiments, a conventional laser system with one or more fiber-optic amplifiers may exhibit optical nonlinearities associated with the propagation of relatively short-duration or relatively high peak-power optical pulses in optical fiber. As an example, optical nonlinearities such as self-phase modulation (SPM), Raman effects (e.g., Raman scattering), or four-wave mixing (FWM) may cause a reduction in gain of an amplifier 470, temporal or spectral distortion of optical pulses, or the generation of unwanted light (e.g., light at different wavelengths from the optical pulses). In particular embodiments, a lidar system 100 as described or illustrated herein may provide a reduction or mitigation of effects associated with optical nonlinearities. As an example, a laser system with a fiber-optic link 330 that includes a gain fiber 660 to amplify pulses on the way to a sensor head 310 may reduce the need for additional optical fiber that may contribute to unwanted nonlinear-optical effects in the fiber. As another example, use of optical fiber with larger core diameters (e.g., LMA fiber) may reduce the optical intensity in the optical fiber, which may lead to a reduction in nonlinear-optical effects. As another example, a lidar system 100 with a sensor head 310 that includes a booster amplifier 470 may exhibit reduced nonlinear-optical effects since the final amplification stage is located in the sensor head 310 and the optical pulses may not need to propagate through additional optical fiber after being amplified by the booster amplifier 470.

In particular embodiments, a laser system as described or illustrated herein may allow the production of optical pulses having a substantially lower duty cycle, lower pulse repetition frequency, longer pulse period, or higher pulse energy than a conventional laser system. As an example, a laser system as described or illustrated herein may include one or more optical isolators 620 or optical filters 630, which may impede or prevent an optical amplifier 470 of the laser system from emitting unwanted spurious light (e.g., spurious light may be produced through Q-switching or self-lasing). An optical isolator 620 may prevent the emission of spurious light by blocking ASE or reflected light from propagating backwards through an amplifier 470, and an optical filter 630 may prevent the emission of spurious light by removing unwanted optical noise from a laser system. The emission of spurious light may be inhibited during the time between successive optical pulses propagating through and being amplified by an amplifier 470. By preventing the production of spurious light between pulses, a laser system as described or illustrated herein may be able to operate with a lower duty cycle or lower pulse repetition frequency than a conventional laser system.

Figure 22:
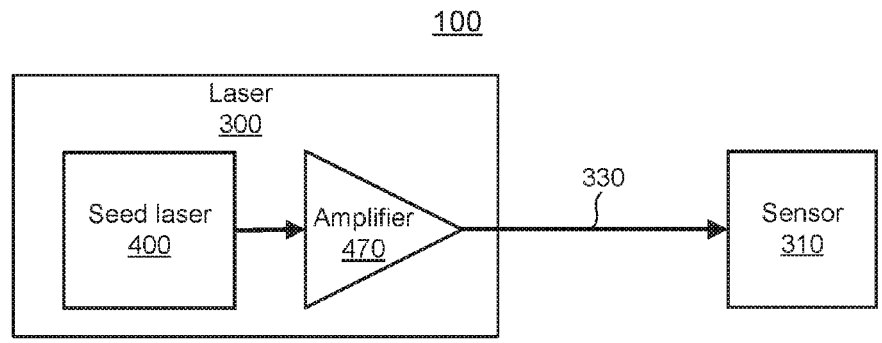
FIG. 22 illustrates an example lidar system with a laser that includes a seed laser and an amplifier.

FIG. 22 illustrates an example lidar system 100 with a laser 300 that includes a seed laser 400 and an amplifier 470. In particular embodiments, laser 300 may include a seed laser 400 and one or more amplifiers 470 that amplify optical pulses produced by the seed laser 400. As an example, laser 300 may include a seed laser 400 that produces optical pulses which are amplified by one amplifier 470 located in laser 300. The amplified pulses may also be amplified by one or more additional amplifiers 470 located in laser 300, optical link 330, or sensor head 310. As an example, amplifier 470 in laser 300 may be a single-pass amplifier or a double-pass amplifier, and the lidar system 100 may include one or more additional single-pass or double-pass amplifiers or a booster amplifier with a double-clad gain fiber 660.

Figure 23:
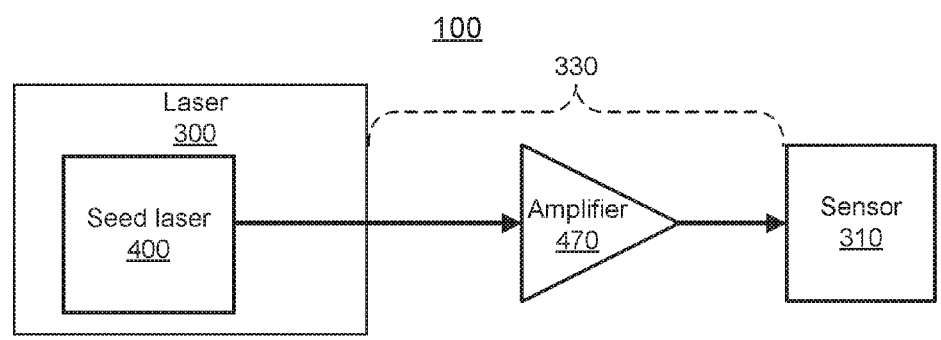
FIG. 23 illustrates an example lidar system with an optical link that includes an amplifier.

FIG. 23 illustrates an example lidar system 100 with an optical link 330 that includes an amplifier 470. In particular embodiments, an amplifier 470 may be referred to as being located or included in an optical link 330 if a gain fiber 660 of the amplifier is located in the optical link 330. As an example, optical link 330 may include the gain fiber 660 of an amplifier 470, and laser 300 or sensor 310 may include one or more other components of the amplifier 470 (e.g., coupler 600A or 600B, PD 610A or 610B, isolator 620, filter 630, pump laser 640, or pump WDM 650). In particular embodiments, seed laser 400 may be located in laser 300 and may produce optical pulses which are amplified by an amplifier 470 located in optical link 330. As an example, the seed-laser pulses may be split by a demultiplexer 410 and coupled to multiple optical links 330 of a lidar system 100, and each optical link 330 may include an amplifier 470. The seed-laser pulses may also be amplified by one or more additional amplifiers located in laser 300 or sensor 310. As an example, laser 300 may include an amplifier 470, and the amplifier 470 in optical link 330 may act as a booster amplifier. As another example, the amplifier in optical link 330 may act as a preamplifier or a mid-stage amplifier, and the sensor head 310 may include a booster amplifier 470 that produces a free-space output beam 125.

Figure 24:
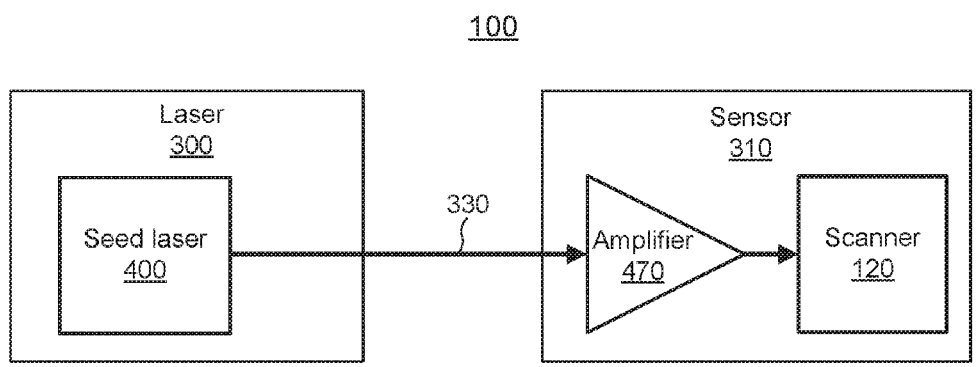
FIG. 24 illustrates an example lidar system with a sensor head that includes an amplifier.

FIG. 24 illustrates an example lidar system 100 with a sensor head 310 that includes an amplifier 470. In particular embodiments, a sensor head 310 of a lidar system 100 may include an optical amplifier 470 that receives optical pulses from a corresponding optical link 330 and amplifies the received pulses. In particular embodiments, seed laser 400 may be located in laser 300 and may produce optical pulses which are amplified by an amplifier 470 located in sensor head 310. The sensor-head amplifier 470 in FIG. 24 may act as a booster amplifier that produces a free-space output beam 125. Additionally, prior to reaching the sensor-head booster amplifier 470, the seed-laser pulses may be amplified by one or more additional preamplifiers or mid-stage amplifiers located in laser 300, optical link 330, or sensor head 310.

In particular embodiments, a gain fiber 660 of an amplifier 470 may be located in a sensor head 310, and the pump laser 640 of the amplifier 470 may be located in laser 300. As an example, light from a pump laser 640 located in laser 300 may be sent to the sensor head 310 via an optical fiber that is separate from the optical link 330. As another example, light from a pump laser 640 may be combined with optical pulses produced in laser 300, and the combined pump light and pulses may be sent to a sensor head 310 via the same optical link 330. For example, the optical link 330 may include a double-clad fiber configured to convey both the pump light and the optical pulses produced in laser 300 to the sensor head 310. The double-clad fiber, which may include a core, inner cladding, and outer cladding, may not include rare-earth dopants and may not perform optical amplification. The optical pulses produced in laser 300 may propagate substantially in the core of the double-clad fiber, and the pump light may propagate substantially in the inner cladding. The gain fiber in the sensor head 310 may be a double-clad gain fiber 660 that is pumped by the pump light and amplifies the optical pulses from the laser 300.

In particular embodiments, a lidar system 100 may include a laser system with a combination of two or more of the configurations illustrated in FIGS. 22-24. As an example, a laser system may include two optical amplifiers 470 having any suitable configuration, such as for example: a first amplifier 470 located in laser 300 and a second amplifier 470 located in optical link 330 or sensor head 310; a first amplifier 470 located in optical link 330 and a second amplifier located 470 in sensor head 310; two amplifiers 470 located in laser 300; or two amplifiers 470 located in sensor head 310. As another example, a laser system may include three optical amplifiers 470 having any suitable configuration, such as for example: a first amplifier 470 located in laser 300, a second amplifier 470 located in optical link 330, and a third amplifier 470 located in sensor head 310; two amplifiers 470 located in laser 300 and a third amplifier 470 located in optical link 330 or sensor head 310; one amplifier 470 located in laser 300 and two amplifiers 470 located in sensor head 310; three amplifiers 470 located in laser 300; or three amplifiers 470 located in sensor head 310. In particular embodiments, the amplifiers 470 may have one or more optical filters 630 disposed between two amplifiers 470 or located at an amplifier input or output.

In particular embodiments, a laser system may be part of a lidar system 100 that includes a laser 300, an optical link 330, and a sensor head 310. The laser system may include a seed laser 400, a first fiber-optic amplifier 470, and a second fiber-optic amplifier 470. The seed laser 400 may produce optical pulses which are amplified by the first and second amplifiers 470. The seed laser 400 may be located in the laser 300, and the optical link 330 may couple the laser 300 to the sensor head 310. The first amplifier 470 may be located in the laser 300, the optical link 330, or the sensor head 310. The second amplifier 470 may be located in the laser 300, the optical link 330, or the sensor head 310. As an example, the first amplifier 470 and the second amplifier 470 may both be located in the laser 300. As another example, the first amplifier 470 may be located in the laser 300, and the second amplifier 470 may include a gain fiber 660 distributed along a length of the optical link 330. As another example, the first amplifier 470 may be located in laser 300, and the second amplifier 470 may be a booster amplifier located in the sensor head 310. As another example, the first amplifier 470 may be located in the optical link 330, and the second amplifier 470 may be located in the sensor head 310 (e.g., the second amplifier 470 may be a booster amplifier that produces a free-space output beam 125). As another example, the first and second amplifiers 470 may be located in the laser 300, and the laser system may also include a third fiber-optic amplifier 470 that is also located in the laser 300. As another example, the first and second amplifiers 470 may be located in the laser 300, and the laser system may also include a third fiber-optic amplifier 470 that includes a gain fiber 660 distributed along a length of the optical link 330. As another example, the first and second amplifiers 470 may be located in the laser 300, and the laser system may also include a third amplifier 470 located in the sensor head (e.g., the third amplifier 470 may be a fiber-optic amplifier or a free-space amplifier). As another example, the first amplifier 470 may be located in the laser 300, the second amplifier 470 may include a gain fiber 660 distributed along a length of the optical link 330, and the laser system may also include a third amplifier 470 located in the sensor head.

FIG. 25 illustrates an example lidar system 100 where the sensor head 310 includes an amplifier 470 coupled to an output collimator 340. In particular embodiments, a lidar system 100 may include a sensor head 310 with a fiber-optic amplifier 470. The fiber-optic amplifier 470 may be a booster amplifier with a double-clad gain fiber 660 that amplifies pulses from a previous optical amplifier 470. The previous optical amplifier 470 may be located in the sensor head 310, in optical link 330, or in laser 300. In the example of FIG. 25, the sensor-head amplifier 470 may be a booster amplifier with a fiber-optic output that is terminated at output collimator 340. The output collimator 340 may produce a free-space output beam 125 that is directed through mirror 115 and to scanner 120.

FIG. 26 illustrates an example lidar system 100 where the sensor head 310 includes a free-space amplifier 470. In particular embodiments, a free-space amplifier 470 may refer to an optical amplifier that amplifies a free-space optical beam (e.g., the beam that is amplified is not propagating through an optical fiber). In FIG. 26, the free-space amplifier 470 receives optical pulses in a free-space optical beam from collimator 340, and the free-space amplifier 470 amplifies the optical pulses and sends the amplified output pulses to mirror 115 and scanner 120. The free-space amplifier 470 may act as a booster amplifier that amplifies a free-space input beam and produces an amplified free-space output beam 125. In particular embodiments, a free-space amplifier 470 may include a pump laser 700 and a gain crystal 710. As an example, the pump laser 700 may produce a free-space pump beam that is directed or coupled into the gain crystal 710. The pump laser 700 may have any suitable operating wavelength, such as for example, approximately 908 nm, 915 nm, 940 nm, 960 nm, 976 nm, 980 nm, 1050 nm, 1064 nm, 1450 nm, or 1480 nm. The gain crystal 710 may include any suitable material configured to absorb light from the pump laser 700 and provide gain to a free-space optical beam that passes through the gain crystal 710. As an example, the gain crystal 710 may include neodymium-doped yttrium aluminum garnet (Nd:YAG), neodymium-doped yttrium aluminum borate (Nd:YAB), erbium-doped glass, or glass or YAB doped with erbium (e.g., Er:YAB) or doped with erbium and ytterbium (e.g., Er:Yb:YAB).

Figure 27:
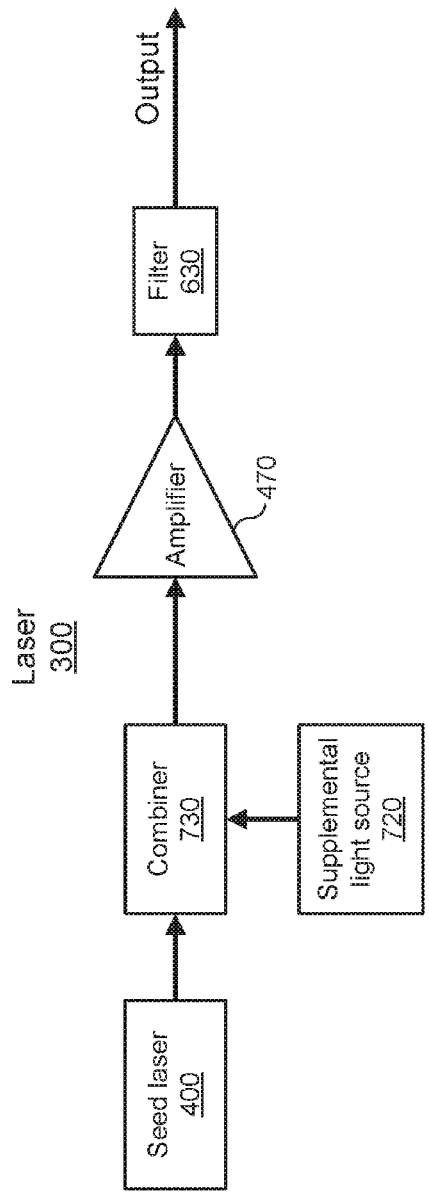
FIG. 27 illustrates an example laser where the seed laser is combined with a supplemental light source.

FIG. 27 illustrates an example laser 300 where the seed laser 400 is combined with a supplemental light source 720. In particular embodiments, a laser system may include one or more seed lasers 400 that produce optical pulses and one or optical amplifiers 470 that amplify the seed-laser pulses. The laser system may also include a supplemental light source 720 that is combined with the one or more seed lasers 400 before proceeding to an amplifier 470. In particular embodiments, the supplemental light source 720 may include a laser diode or a light-emitting diode (LED). Light from the supplemental light source 720 may be combined with light from the seed laser 400 by a combiner 730, which may include a wavelength combiner or an optical switch. As an example, the wavelength of the supplemental light source 720 may be different from the seed-laser wavelength, and the combiner 730 may include a wavelength combiner that combines the two wavelengths together onto a single fiber-optic output which is coupled to amplifier 470. For example, the seed-laser wavelength may be approximately 1550 nm, and the supplemental-light-source wavelength may be approximately 1530 nm. As another example, combiner 730 may include a 2×1 optical switch configured so that light from either the seed laser 400 or the supplemental light source 720 is sent to the amplifier 470. The optical switch may be synchronized to the seed laser 400 so that when the seed laser 400 emits a pulse, the optical switch directs the pulse to the amplifier 470, and between seed-laser pulses, the optical switch may direct light from the supplemental light source 720 to the amplifier 470.

In particular embodiments, light from the supplemental light source 720 may impede or prevent an optical amplifier 470 from spontaneously emitting spurious light (e.g., emitting an optical pulse through Q-switching or self-lasing). The supplemental light source 720 may suppress or prevent the optical amplifier 470 from emitting spurious optical pulses during times between when a seed-laser pulse is present (e.g., during a time after a first seed-laser pulse is amplified and prior to the receipt of a subsequent second seed-laser pulse). Additionally, light from the supplemental light source 720 may reduce the amount of ASE emitted by the amplifier 470. Light from the supplemental light source 720 may be amplified by the amplifier 470, which may prevent the gain in the amplifier 470 from building up to a level where spurious light may be produced or where excessive ASE is emitted.

In particular embodiments, a laser system may include a filter 630 that removes ASE light produced by the amplifier 470 or removes light from the supplemental light source 720 that was amplified by the amplifier 470. As an example, the filter 630 may be a spectral filter that removes or attenuates light at the wavelength of the supplemental light source 720. Additionally, the filter 630 may also remove or attenuate ASE light. As another example, the filter 630 may be an optical switch that is synchronized to the seed laser 400 or the supplemental light source 720. When an amplified seed-laser pulse is present, the optical switch may switch to an open or transmitting state that allows the pulse to propagate to the output. During times between seed-laser pulses, the optical switch may switch to a non-transmitting state to block light from the supplemental light source 720 as well as ASE light from the amplifier 470. In particular embodiments, the supplemental light source 720 may be configured to emit light in a CW mode or in a pulsed mode. As an example, the supplemental light source 720 may be operated in a pulsed mode in which the supplemental light source 720 is turned on in between seed-laser pulses and turned off when a seed-laser pulse is present. Additionally, the filter 630 may be an optical switch configured to block the transmission of light during times when the supplemental light source 720 is turned on, and when an amplified seed-laser pulse is present, the optical switch may change to a transmitting state to allow the pulse to propagate to the output.

Figure 28:
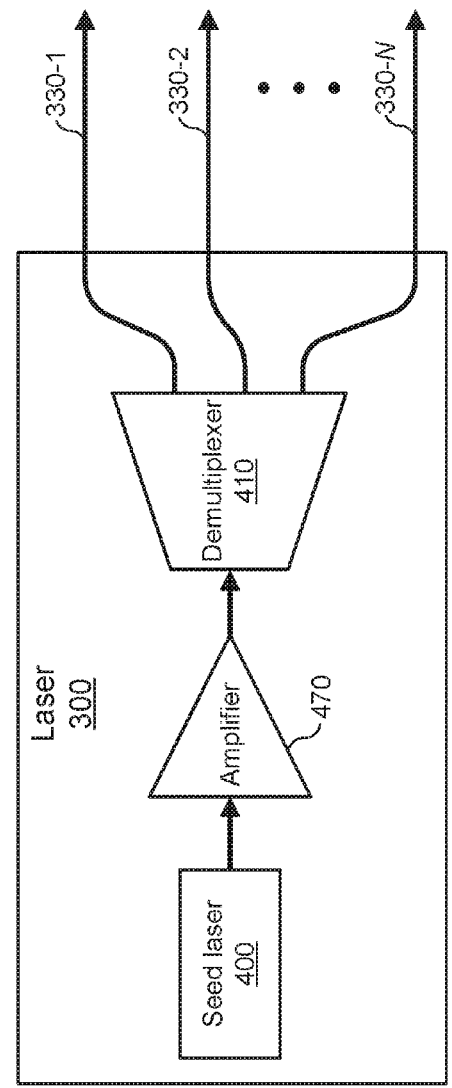
FIG. 28 illustrates an example laser that includes a seed laser, amplifier, and demultiplexer.

FIG. 28 illustrates an example laser 300 that includes a seed laser 400, amplifier 470, and demultiplexer 410. In particular embodiments, laser 300 may include a seed laser 400, one or more optical amplifiers 470, and one or more demultiplexers 410. As an example, optical pulses from seed laser 400 may be amplified by two or more amplifiers 470 coupled in series before proceeding to demultiplexer 410. In the example of FIG. 28, light from the seed laser 400 is amplified by amplifier 470 prior to being sent to demultiplexer 410 for distribution to the N optical links (330-1, 330-2, . . . , 330-N). In particular embodiments, laser 300 may include a 1×N optical demultiplexer configured to receive amplified seed-laser pulses from amplifier 470 and distribute the amplified seed-laser pulses between N optical links (330-1, 330-2, . . . , 330-N) coupled to N respective sensor heads 310. In particular embodiments, laser 300 may include one or more optical amplifiers located after the demultiplexer 410. As an example, laser 300 may include N optical amplifiers (not illustrated in FIG. 28) located after the demultiplexer 410, where each amplifier is configured to amplify light prior to sending the light to a corresponding optical link 330.

FIG. 29 illustrates an example laser 300 that includes multiple laser diodes (440-1, 440-2, . . . , 440-N), a multiplexer 412, an amplifier 470, and a demultiplexer 410. In particular embodiments, laser 300 may include one or more laser diodes 440, one or more multiplexers 412, one or more optical amplifiers 470, and one or more demultiplexers 410. In the example of FIG. 29, optical pulses from N laser diodes (440-1, 440-2, . . . , 440-N) are combined together into a single optical fiber by multiplexer 412, and the combined optical pulses are amplified by amplifier 470. After amplification, demultiplexer 410 receives the amplified laser-diode pulses from amplifier 470 and distributes the amplified pulses between the N optical links (330-1, 330-2, . . . , 330-N). In particular embodiments, there may be two or more optical amplifiers 470 located between multiplexer 412 and demultiplexer 410. In particular embodiments, the N laser diodes (440-1, 440-2, . . . , 440-N) may produce optical pulses at N different wavelengths, and multiplexer 412 may be a wavelength combiner that combines the N wavelengths of the N respective laser diodes together into a single optical fiber coupled to amplifier 470. After the pulses are amplified by the optical amplifier 470, the demultiplexer 410 may separate the pulses by wavelength and send them to a corresponding optical link. As an example, pulses from laser diode 440-1 may be directed by the demultiplexer 410 to optical link 330-1, pulses from laser diode 440-2 may be directed to optical link 330-2, and pulses from laser diode 440-N may be directed to optical link 330-N. As another example, laser 300 may include 6 laser diodes operating at 6 different wavelengths between approximately 1530 nm and approximately 1560 nm. Each laser diode may be a pulsed laser diode that produces pulses with a pulse repetition frequency of approximately 700 kHz. The laser-diode pulses may be synchronized and time delayed with respect to one another, and when the pulses are interleaved together by multiplexer 412, the combined pulses may have a pulse repetition frequency of approximately 4.2 MHz. After amplification by amplifier 470, the 4.2-MHz stream of amplified pulses may be separated by demultiplexer 410 into 6 streams of pulses, each stream having a particular wavelength and a pulse repetition frequency of approximately 700 kHz.

FIG. 30 illustrates an example laser 300 where the laser 300 is coupled to multiple optical links (330-1, 330-2, . . . , 330-N) that each include an amplifier (470-1, 470-2, . . . , 470-N). In particular embodiments, each optical link of a lidar system 100 may include a gain fiber 660 of a fiber-optic amplifier 470, where the gain fiber amplifies pulses while propagating from laser 300 to a corresponding sensor head 310. In particular embodiments, laser 300 may include one or more laser diodes 440, one or more multiplexers 412, one or more optical amplifiers 470, and one or more demultiplexers 410. In the example of FIG. 30, optical pulses from N laser diodes (440-1, 440-2, . . . , 440-N) are combined together by multiplexer 412, and the combined optical pulses are amplified by amplifier 470. After amplification, demultiplexer 410 distributes the amplified pulses between the N optical links (330-1, 330-2, . . . , 330-N). Each of the N optical links includes a gain fiber 660 of an amplifier 470, and the pulses are amplified as they propagate along each optical link 330 to a corresponding sensor head 310.

In particular embodiments, a lidar system 100 may include one or more multiplexers 412 or one or more demultiplexers 410 configured to combine or distribute optical pulses in any suitable manner. The multiplexers 412 or demultiplexers 410 may be located at any suitable location within the lidar system 100. As an example, a demultiplexer 410 may be located after one or more optical amplifiers 470 and may be configured to distribute amplified pulses among two or more optical links 330. Additionally, each of the optical links 330 may also include an optical amplifier 470. As another example, a multiplexer 412 may be located before an optical amplifier 470 and may be configured to combine light from multiple laser diodes 440. The laser diodes 440 may be coupled directly to the multiplexer 412, or the light from each laser diode 440 may be amplified separately prior to being combined by the multiplexer 412.

Figure 31:
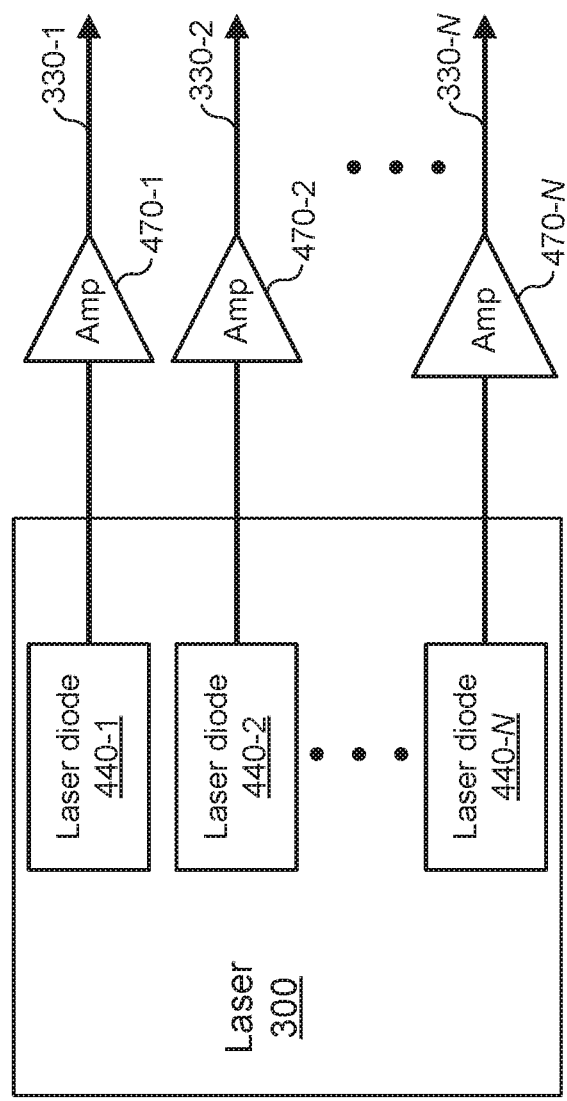
FIG. 31 illustrates an example laser with multiple laser diodes coupled to multiple respective optical links that each include an amplifier.

FIG. 31 illustrates an example laser 300 with multiple laser diodes (440-1, 440-2, ..., 440-N) coupled to multiple respective optical links (330-1, 330-2, ..., 330-N) that each include an amplifier (470-1, 470-2, ..., 470-N). In particular embodiments, laser 300 may include multiple laser diodes (440-1, 440-2, ..., 440-N), where each laser diode is separately coupled to a corresponding optical link. In the example of FIG. 31, the N laser diodes (440-1, 440-2, ..., 440-N) are individually coupled to N respective optical links (330-1, 330-2, ..., 330-N), and each optical link includes an optical amplifier. In particular embodiments, laser 300 may also include N optical amplifiers 470 (not illustrated in FIG. 31), where each amplifier is configured to amplify the pulses produced by a particular laser diode before the pulses are coupled to a corresponding optical link.

Figure 32:
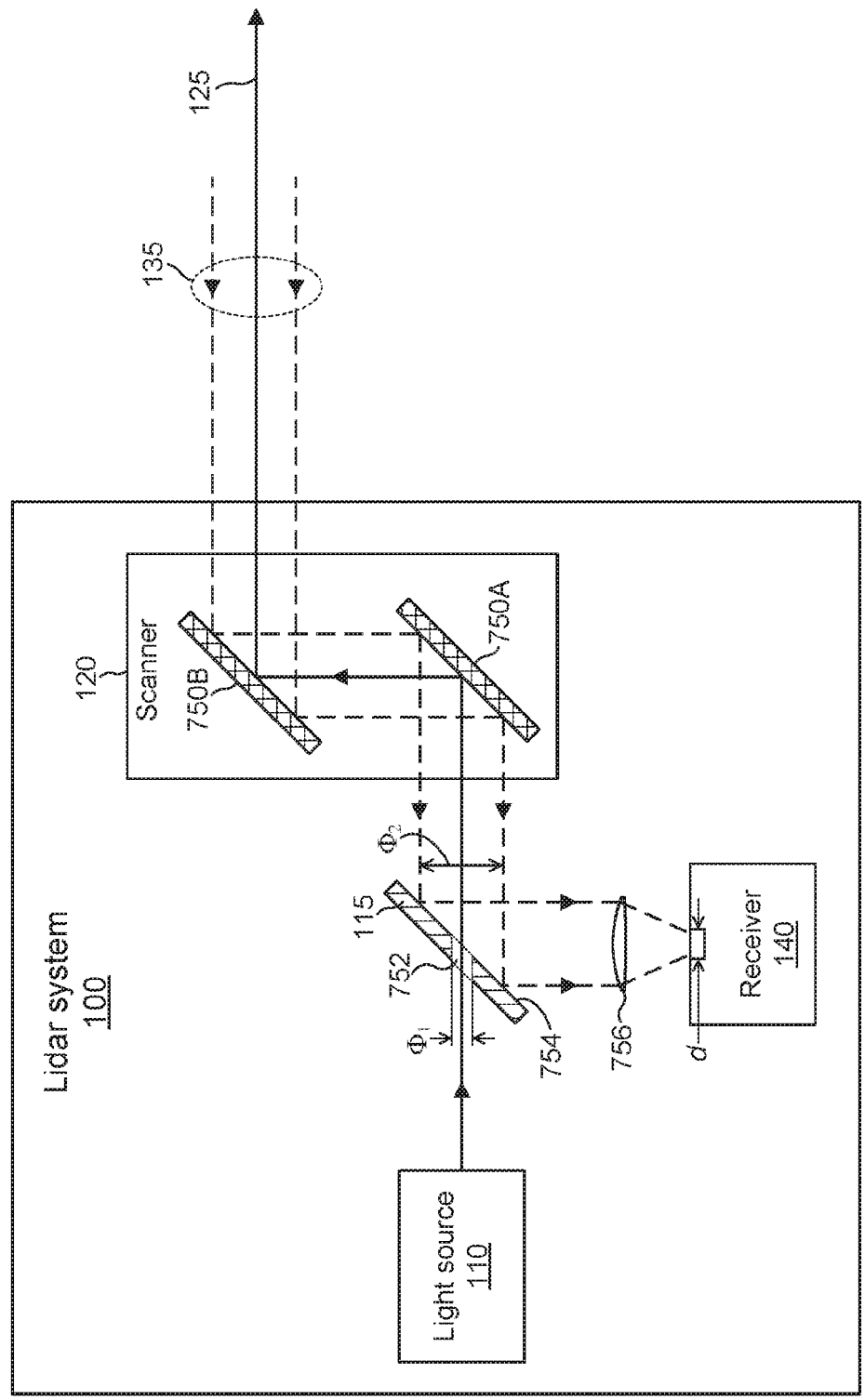
FIG. 32 illustrates an example lidar system with an example overlap mirror.

FIG. 32 illustrates an example lidar system 100 with an example overlap mirror 115. In particular embodiments, a lidar system 100 may include a light source 110 configured to emit pulses of light and a scanner 120 configured to scan at least a portion of the emitted pulses of light across a field of regard. As an example, the optical pulses produced by light source 110 may pass through aperture 752 of overlap mirror 115 and then may be coupled to scanner 120. As another example, optical pulses produced by light source 110 may pass through a demultiplexer 410 (not illustrated in FIG. 32) which sends a portion of the pulses to scanner 120. The portion of the pulses sent to scanner 120 may include a fraction of the pulses emitted by light source 110 (e.g., 1 out of every 6 pulses emitted by light source 110) or may include a fraction of each pulse emitted by light source 110 (e.g., each pulse may be split into 6 pulses, and one of the 6 split pulses may be sent to the scanner 120. In particular embodiments, a lidar system 100 may include a receiver 140 configured to detect at least a portion of the scanned pulses of light scattered by a target 130 located a distance from the lidar system 100. As an example, a pulse of light that is directed downrange from lidar system 100 by scanner 120 (e.g., as part of output beam 125) may scatter off a target 130, and a portion of the scattered light may propagate back to the lidar system 100 (e.g., as part of input beam 135) and be detected by receiver 140.

In particular embodiments, light source 110, scanner 120, and receiver 140 may be packaged together within a single housing. As an example, a lidar-system enclosure may contain a light source 110, overlap mirror 115, scanner 120, and receiver 140 of a lidar system 100. Additionally, the lidar-system enclosure may include a controller 150, or a controller 150 may be located remotely from the enclosure. The lidar-system enclosure may also include one or more electrical connections for conveying electrical power or electrical signals to or from the enclosure. In particular embodiments, light source 110 may be located remotely from scanner 120 and receiver 140. As an example, scanner 120 and receiver 140 may be part of a sensor head 310 located remotely from light source 110. The sensor head 310 may be coupled to the light source 110 by an optical link 330 which conveys at least a portion of the pulses of light emitted by the light source 110 to the sensor head 310. In particular embodiments, a lidar system 100 may include multiple sensor heads 310, where each sensor head 310 includes a respective scanner 120 and receiver 140. The light source 110 may be coupled to each sensor head 310 by a respective optical link 330 which conveys a respective portion of the pulses of light emitted by the light source 110 from the light source 110 to each sensor head 310.

In particular embodiments, light source 110 may include a seed laser 400 configured to produce optical seed pulses and one or more optical amplifiers 470 that amplify the optical seed pulses to produce the pulses of light emitted by the light source 110. The seed laser 400 may include one or more laser diodes 440, such as for example, one or more Fabry-Perot laser diodes, DFB lasers, or DBR lasers. In particular embodiments, light source 110 may include a laser diode 440 without any optical-amplification stages located after the laser diode 440. As an example, light source 110 may include a pulsed laser diode (e.g., a pulsed Fabry-Perot laser diode, DFB laser, or DBR laser) that is coupled to a scanner 120 without the emitted pulses from the pulsed laser diode being amplified.

In particular embodiments, light source 110 may include an eye-safe laser. An eye-safe laser may refer to a laser with an emission wavelength, average power, peak power, peak intensity, pulse energy, beam size, beam divergence, or exposure time such that emitted light from the laser presents little or no possibility of causing damage to a person's eyes. As an example, light source 110 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, light source 110 may include an eye-safe laser (e.g., a Class 1 or a Class I laser) configured to operate at any suitable wavelength between approximately 1400 nm and approximately 2100 nm. As an example, light source 110 may include an eye-safe laser with an operating wavelength between approximately 1400 nm and approximately 1600 nm. As another example, light source 110 may include an eye-safe laser with an operating wavelength between approximately 1530 nm and approximately 1560 nm.

In particular embodiments, scanner 120 may include one or more mirrors, where each mirror is mechanically driven by a galvanometer scanner, a resonant scanner, a MEMS device, a voice coil motor, or any suitable combination thereof. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate.

In particular embodiments, a scanner 120 may include any suitable number of mirrors driven by any suitable number of mechanical actuators. As an example, a scanner 120 may include a single mirror configured to scan an output beam 125 along a single direction (e.g., a scanner 120 may be a one-dimensional scanner that scans along a horizontal or vertical direction). The mirror may be driven by one actuator (e.g., a galvanometer) or two actuators configured to drive the mirror in a push-pull configuration. As another example, a scanner 120 may include a single mirror that scans an output beam 125 along two directions (e.g., horizontal and vertical). The mirror may be driven by two actuators, where each actuator provides rotational motion along a particular direction or about a particular axis. As another example, a scanner 120 may include two mirrors, where one mirror scans an output beam 125 along a horizontal direction and the other mirror scans the output beam 125 along a vertical direction. In the example of FIG. 32, scanner 120 includes two mirrors, mirror 750A and mirror 750B. Mirror 750A may scan output beam 125 along a substantially horizontal direction, and mirror 750B may scan the output beam 125 along a substantially vertical direction.

In particular embodiments, a scanner 120 may include two mirrors, where each mirror is driven by a corresponding galvanometer scanner. As an example, scanner 120 may include a galvanometer actuator that scans mirror 750A along a first direction (e.g., horizontal), and scanner 120 may include another galvanometer actuator that scans mirror 750B along a second direction (e.g., vertical). In particular embodiments, a scanner 120 may include two mirrors, where one mirror is driven by a resonant actuator and the other mirror is driven by a galvanometer actuator. As an example, a resonant actuator may scan mirror 750A along a first direction, and a galvanometer actuator may scan mirror 750B along a second direction. The first and second directions may be substantially orthogonal to one another. As an example, the first direction may be substantially horizontal, and the second direction may be substantially vertical, or vice versa. In particular embodiments, a scanner 120 may include one mirror driven by two actuators which are configured to scan the mirror along two substantially orthogonal directions. As an example, one mirror may be driven along a substantially horizontal direction by a resonant actuator or a galvanometer actuator, and the mirror may also be driven along a substantially vertical direction by a galvanometer actuator. As another example, a mirror may be driven along two substantially orthogonal directions by two resonant actuators.

In particular embodiments, a scanner 120 may include a mirror configured to be scanned along one direction by two actuators arranged in a push-pull configuration. Driving a mirror in a push-pull configuration may refer to a mirror that is driven in one direction by two actuators. The two actuators may be located at opposite ends or sides of the mirror, and the actuators may be driven in a cooperative manner so that when one actuator pushes on the mirror, the other actuator pulls on the mirror, and vice versa. As an example, a mirror may be driven along a horizontal or vertical direction by two voice coil actuators arranged in a push-pull configuration. In particular embodiments, a scanner 120 may include one mirror configured to be scanned along two axes, where motion along each axis is provided by two actuators arranged in a push-pull configuration. As an example, a mirror may be driven along a horizontal direction by two resonant actuators arranged in a horizontal push-pull configuration, and the mirror may be driven along a vertical direction by another two resonant actuators arranged in a vertical push-pull configuration.

In particular embodiments, a scanner 120 may include two mirrors which are driven synchronously so that the output beam 125 is directed along any suitable scan pattern 200. As an example, a galvanometer actuator may drive mirror 750A with a substantially linear back-and-forth motion (e.g., the galvanometer may be driven with a substantially triangle-shaped waveform) that causes output beam 125 to trace a substantially horizontal back-and-forth pattern. Additionally, another galvanometer actuator may scan mirror 750B relatively slowly along a substantially vertical direction. For example, the two galvanometers may be synchronized so that for every 64 horizontal traces, the output beam 125 makes a single trace along a vertical direction. As another example, a resonant actuator may drive mirror 750A along a substantially horizontal direction, and a galvanometer actuator may scan mirror 750B relatively slowly along a substantially vertical direction.

In particular embodiments, a scanner 120 may include one mirror driven by two or more actuators, where the actuators are driven synchronously so that the output beam 125 is directed along a particular scan pattern 200. As an example, one mirror may be driven synchronously along two substantially orthogonal directions so that the output beam 125 follows a scan pattern 200 that includes substantially straight lines. In particular embodiments, a scanner 120 may include two mirrors driven synchronously so that the synchronously driven mirrors trace out a scan pattern 200 that includes substantially straight lines. As an example, the scan pattern 200 may include a series of substantially straight lines directed substantially horizontally, vertically, or along any other suitable direction. The straight lines may be achieved by applying a dynamically adjusted deflection along a vertical direction (e.g., with a galvanometer actuator) as an output beam 125 is scanned along a substantially horizontal direction (e.g., with a galvanometer or resonant actuator). If a vertical deflection is not applied, the output beam 125 may trace out a curved path as it scans from side to side. By applying a vertical deflection as the mirror is scanned horizontally, a scan pattern 200 that includes substantially straight lines may be achieved. In particular embodiments, a vertical actuator may be used to apply both a dynamically adjusted vertical deflection as the output beam 125 is scanned horizontally as well as a discrete vertical offset between each horizontal scan (e.g., to step the output beam 125 to a subsequent row of a scan pattern 200).

In the example of FIG. 32, lidar system 100 produces an output beam 125 and receives light from an input beam 135. The output beam 125, which includes at least a portion of the pulses of light emitted by light source 110, may be scanned across a field of regard. The input beam 135 may include at least a portion of the scanned pulses of light which are scattered by one or more targets 130 and detected by receiver 140. In particular embodiments, output beam 125 and input beam 135 may be substantially coaxial. The input and output beams being substantially coaxial may refer to the beams being at least partially overlapped or sharing a common propagation axis so that input beam 135 and output beam 125 travel along substantially the same optical path (albeit in opposite directions). As output beam 125 is scanned across a field of regard, the input beam 135 may follow along with the output beam 125 so that the coaxial relationship between the two beams is maintained.

In particular embodiments, a lidar system 100 may include an overlap mirror 115 configured to overlap the input beam 135 and output beam 125 so that they are substantially coaxial. In FIG. 32, the overlap mirror 115 includes a hole, slot, or aperture 752 which the output beam 125 passes through and a reflecting surface 754 that reflects at least a portion of the input beam 135 toward the receiver 140. The overlap mirror 115 may be oriented so that input beam 135 and output beam 125 are at least partially overlapped. In particular embodiments, input beam 135 may pass through a lens 756 which focuses the beam onto an active region of the receiver 140 (e.g., the active region may have a diameter d). In particular embodiments, overlap mirror 115 may have a reflecting surface 754 that is substantially flat or the reflecting surface 754 may be curved (e.g., mirror 115 may be an off-axis parabolic mirror configured to focus the input beam 135 onto an active region of the receiver 140).

In particular embodiments, aperture 752 may have any suitable size or diameter $\Phi_1$, and input beam 135 may have any suitable size or diameter $\Phi_2$, where $\Phi_2$ is greater than $\Phi_1$. As an example, aperture 752 may have a diameter $\Phi_1$ of approximately 0.2 mm, 0.5 mm, 1 mm, 2 mm, 3 mm, 5 mm, or 10 mm, and input beam 135 may have a diameter $\Phi_2$ of approximately 2 mm, 5 mm, 10 mm, 15 mm, 20 mm, 30 mm, 40 mm, or 50 mm. In particular embodiments, reflective surface 754 of overlap mirror 115 may reflect greater than or equal to 70% of input beam 135 toward the receiver 140. As an example, if reflective surface 754 has a reflectivity R at an operating wavelength of the light source 110, then the fraction of input beam 135 directed toward the receiver 140 may be expressed as $R \times [1-(\Phi_1/\Phi_2)^2]$. For example, if R is 95%, $\Phi_1$ is 2 mm, and $\Phi_2$ is 10 mm, then approximately 91% of input beam 135 may be directed toward the receiver 140 by reflective surface 754.

Figure 33:
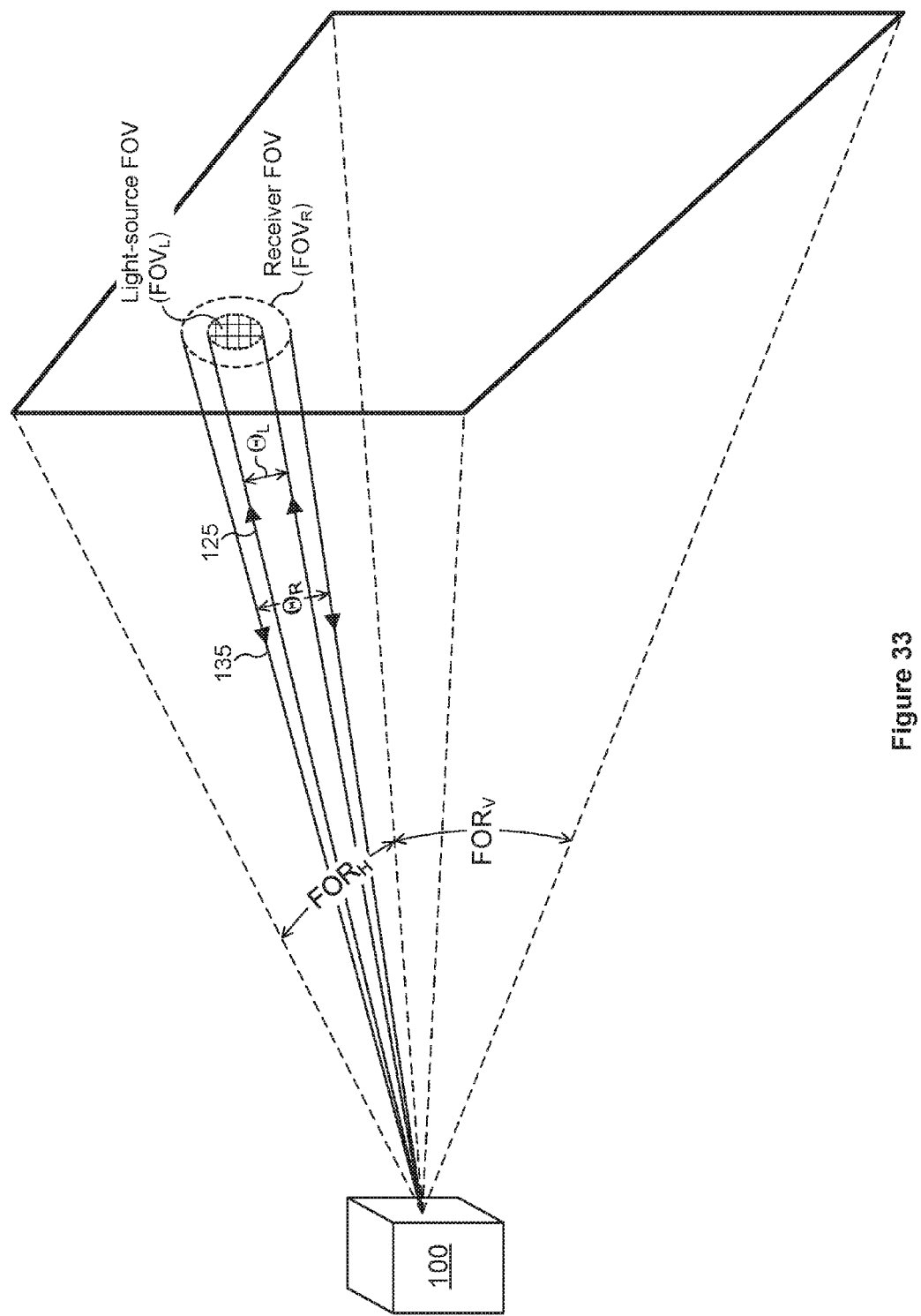
FIG. 33 illustrates an example light-source field of view and receiver field of view for a lidar system.

FIG. 33 illustrates an example light-source field of view ($FOV_L$) and receiver field of view ($FOV_R$) for a lidar system 100. The light source 110 may emit pulses of light as the $FOV_L$ and $FOV_R$ are scanned across a field of regard of the lidar system 100. In particular embodiments, a light-source field of view may refer to an angular cone illuminated by the light source 110 at a particular instant of time. Similarly, the receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 33), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 3 mrad. In particular embodiments, the receiver field of view may be larger than the light-source field of view, or the light-source field of view may be larger than the receiver field of view. As an example, $\Theta_L$ may be approximately equal to 1.5 mrad, and $\Theta_R$ may be approximately equal to 3 mrad.

In particular embodiments, a pixel 210 may represent or may correspond to a light-source field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 34:
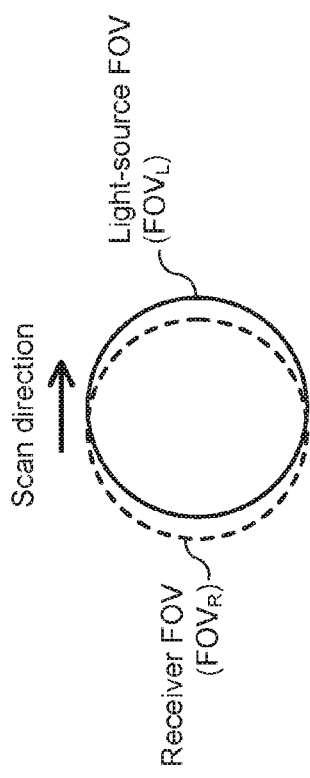
FIG. 34 illustrates an example light-source field of view and receiver field of view with a corresponding scan direction.

FIG. 34 illustrates an example light-source field of view and receiver field of view with a corresponding scan direction. In particular embodiments, scanner 120 may scan the $FOV_L$ and $FOV_R$ along any suitable scan direction or combination of scan directions, such as for example, left to right, right to left, upward, downward, or any suitable combination thereof. As an example, the $FOV_L$ and $FOV_R$ may follow a left-to-right scan direction (as illustrated in FIG. 34) across a field of regard, and then the $FOV_L$ and $FOV_R$ may travel back across the field of regard in a right-to-left scan direction. In particular embodiments, a light-source field of view and a receiver field of view may be at least partially overlapped during scanning. As an example, the $FOV_L$ and $FOV_R$ may have any suitable amount of angular overlap, such as for example, approximately 1%, 2%, 5%, 10%, 25%, 50%, 75%, 90%, or 100% of angular overlap. As another example, if $\Theta_L$ and $\Theta_R$ are 2 mrad, and $FOV_L$ and $FOV_R$ are offset from one another by 1 mrad, then $FOV_L$ and $FOV_R$ may be referred to as having a 50% angular overlap. As another example, the $FOV_L$ and $FOV_R$ may be substantially coincident with one another and may have an angular overlap of approximately 100%. In the example of FIG. 34, the $FOV_L$ and $FOV_R$ are approximately the same size and have an angular overlap of approximately 90%.

Figure 35:
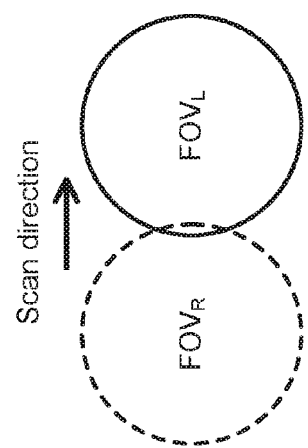
FIG. 35 illustrates an example receiver field of view that is offset from a light-source field of view.

FIG. 35 illustrates an example receiver field of view that is offset from a light-source field of view. In particular embodiments, a $FOV_L$ and $FOV_R$ may be scanned along a particular scanning direction, and the $FOV_R$ may be offset from the $FOV_L$ in a direction opposite the scanning direction. In the example of FIG. 35, the $FOV_L$ and $FOV_R$ are approximately the same size, and the $FOV_R$ lags behind the $FOV_L$ so that the $FOV_L$ and $FOV_R$ have an angular overlap of approximately 5%. In particular embodiments, the $FOV_R$ may be configured to lag behind the $FOV_L$ to produce any suitable angular overlap, such as for example, an angular overlap of less than or equal to 50%, 25%, 5%, 1%, or 0.1%. After a pulse of light is emitted by light source 110, the pulse may scatter from a target 130, and some of the scattered light may propagate back to the lidar system 100 along a path that corresponds to the orientation of the light-source field of view at the time the pulse was emitted. As the pulse of light propagates to and from the target 130, the receiver field of view moves in the scan direction and increases its overlap with the previous location of the light-source field of view (e.g., the location of the light-source field of view when the pulse was emitted). For a close-range target (e.g., a target 130 located within 20% of the maximum range of the lidar system), when the receiver 140 detects scattered light from the emitted pulse, the receiver field of view may overlap less than or equal to 20% of the previous location of the light-source field of view. The receiver 140 may receive less than or equal to 20% of the scattered light that propagates back to the lidar system 100 along the path that corresponds to the orientation of the light-source field of view at the time the pulse was emitted. However, since the target 130 is located relatively close to the lidar system 100, the receiver 140 may still receive a sufficient amount of light to produce a signal indicating that a pulse has been detected. For a midrange target (e.g., a target 130 located between 20% and 80% of the maximum range of the lidar system 100), when the receiver 140 detects the scattered light, the receiver field of view may overlap between 20% and 80% of the previous location of the light-source field of view. For a target 130 located a distance greater than or equal to 80% of the maximum range of the lidar system 100, when the receiver 140 detects the scattered light, the receiver field of view may overlap greater than or equal to 80% of the previous location of the light-source field of view. For a target 130 located at the maximum range from the lidar system 100, when the receiver 140 detects the scattered light, the receiver field of view may be substantially overlapped with the previous location of the light-source field of view, and the receiver 140 may receive substantially all of the scattered light that propagates back to the lidar system 100.

Figure 36:
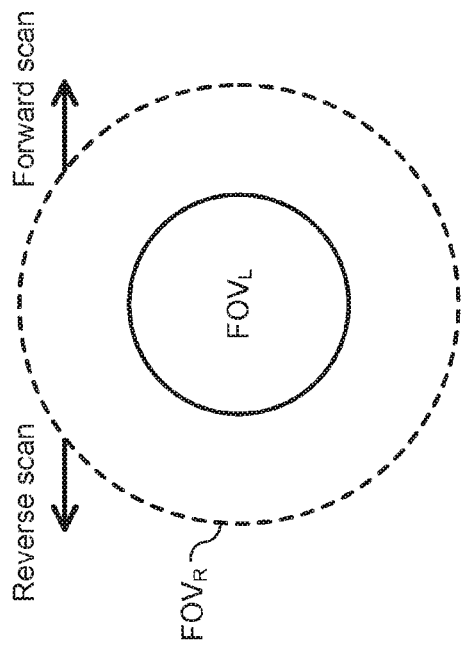
FIG. 36 illustrates an example forward-scan direction and reverse-scan direction for a light-source field of view and a receiver field of view.

FIG. 36 illustrates an example forward-scan direction and reverse-scan direction for a light-source field of view and a receiver field of view. In particular embodiments, a lidar system 100 may be configured so that the $FOV_R$ is larger than the $FOV_L$, and the receiver and light-source FOVs may be substantially coincident, overlapped, or centered with respect to one another. As an example, the $FOV_R$ may have a diameter or angular extent $\Theta_R$, that is approximately 1.5×, 2×, 3×, 4×, 5×, or 10× larger than the diameter or angular extent $\Theta_L$ of the $FOV_L$. In the example of FIG. 36, the diameter of the receiver field of view is approximately 2 times larger than the diameter of the light-source field of view, and the two FOVs are overlapped and centered with respect to one another. The receiver field of view being larger than the light-source field of view may allow the receiver 140 to receive scattered light from emitted pulses in both scan directions (forward scan or reverse scan). In the forward-scan direction illustrated in FIG. 36, scattered light may be received primarily by the left side of the $FOV_R$, and in the reverse-scan direction, scattered light may be received primarily by the right side of the $FOV_R$. For example, as a pulse of light propagates to and from a target 130 during a forward scan, the $FOV_R$ scans to the right, and scattered light that returns to the lidar system 100 may be received primarily by the left portion of the $FOV_R$.

In particular embodiments, a lidar system 100 may perform a series of forward and reverse scans. As an example, a forward scan may include the $FOV_L$ and the $FOV_R$ being scanned horizontally from left to right, and a reverse scan may include the two fields of view being scanned from right to left. As another example, a forward scan may include the $FOV_L$ and the $FOV_R$ being scanned along any suitable direction (e.g., along a 45-degree angle), and a reverse scan may include the two fields of view being scanned along a substantially opposite direction. In particular embodiments, the forward and reverse scans may trace paths that are adjacent to or displaced with respect to one another. As an example, a reverse scan may follow a line in the field of regard that is displaced above, below, to the left of, or to the right of a previous forward scan. As another example, a reverse scan may scan a row in the field of regard that is displaced below a previous forward scan, and the next forward scan may be displaced below the reverse scan. The forward and reverse scans may continue in an alternating manner with each scan being displaced with respect to the previous scan until a complete field of regard has been covered. Scans may be displaced with respect to one another by any suitable angular amount, such as for example, by approximately 0.05°, 0.1°, 0.2°, 0.5°, 1°, or 2°.

Figure 37:
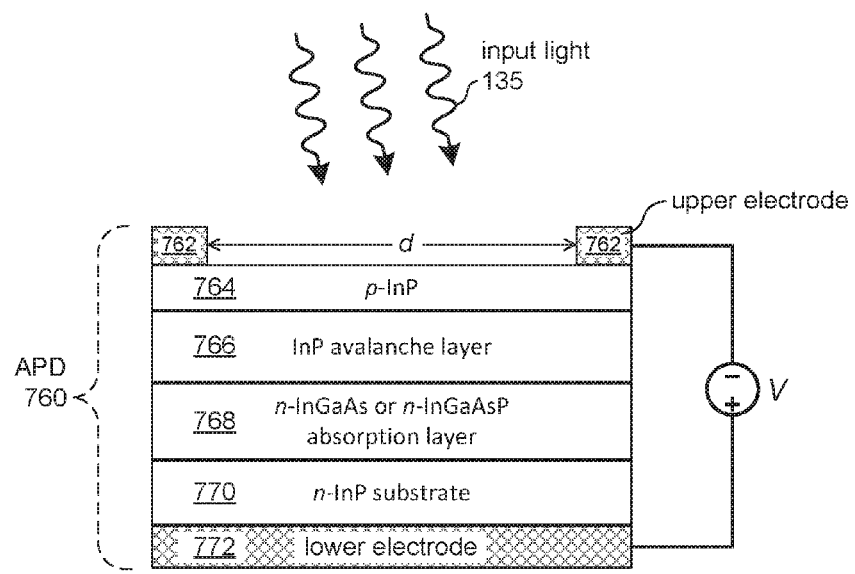
FIG. 37 illustrates an example InGaAs avalanche photodiode (APD).

FIG. 37 illustrates an example InGaAs avalanche photodiode (APD) 760.

In particular embodiments, a receiver 140 may include one or more APDs 760 configured to receive and detect light from an input beam 135. In particular embodiments, an APD 760 may be configured to detect a portion of pulses of light which are scattered by a target 130 located downrange from lidar system 100. As an example, an APD 760 may receive a portion of a pulse of light scattered by a target 130, and the APD 760 may generate an electrical-current signal corresponding to the received pulse of light.

In particular embodiments, an APD 760 may include doped or undoped layers of any suitable semiconductor material, such as for example, silicon, germanium, InGaAs, InGaAsP, or indium phosphide (InP). Additionally, an APD 760 may include an upper electrode 762 and a lower electrode 772 for coupling the ADP 760 to an electrical circuit. As an example, the APD 760 may be electrically coupled to a voltage source that supplies a reverse-bias voltage V to the APD 760. Additionally, the APD 760 may be electrically coupled to a transimpedance amplifier which receives electrical current generated by the APD 760 and produces an output voltage signal that corresponds to the received current. The upper electrode 762 or lower electrode 772 may include any suitable electrically conductive material, such as for example a metal (e.g., gold, copper, silver, or aluminum), a transparent conductive oxide (e.g., indium tin oxide), a carbon-nanotube material, or polysilicon. In particular embodiments, the upper electrode 762 may be partially transparent or may have an opening to allow input light 135 to pass through to the active region of the APD 760. In FIG. 37, the upper electrode 762 may have a ring shape that at least partially surrounds the active region of the APD, where the active region refers to an area over which the APD 760 may receive and detect input light 135. The active region may have any suitable size or diameter d, such as for example, a diameter of approximately 25 μm, 50 μm, 80 μm, 100 μm, 200 μm, 500 μm, 1 mm, 2 mm, or 5 mm.

In particular embodiments, an APD 760 may include any suitable combination of any suitable semiconductor layers having any suitable doping (e.g., n-doped, p-doped, or intrinsic undoped material). In the example of FIG. 37, the InGaAs APD 760 includes a p-doped InP layer 764, an InP avalanche layer 766, an absorption layer 768 with n-doped InGaAs or InGaAsP, and an n-doped InP substrate layer 770. In particular embodiments, an APD 760 may include separate absorption and avalanche layers, or a single layer may act as both an absorption and avalanche region. An InGaAs APD 760 may operate electrically as a PN diode or a PIN diode, and during operation, the APD 760 may be reverse biased with a positive voltage V applied to the lower electrode 772 with respect to the upper electrode 762. The applied reverse-bias voltage V may have any suitable value, such as for example approximately 5 V, 10 V, 20 V, 30 V, 50 V, 75 V, 100 V, or 200 V.

In FIG. 37, photons of input light 135 may be absorbed primarily in the absorption layer 768, resulting in the generation of electron-hole pairs (which may be referred to as photo-generated carriers). As an example, the absorption layer 768 may be configured to absorb photons corresponding to the operating wavelength of the lidar system 100 (e.g., any suitable wavelength between approximately 1400 nm and approximately 1600 nm). In the avalanche layer 766, an avalanche-multiplication process occurs where carriers (e.g., electrons or holes) generated in the absorption layer 768 collide with the semiconductor lattice of the absorption layer 768, and produce additional carriers through impact ionization. This avalanche process can repeat numerous times so that one photo-generated carrier may result in the generation of multiple carriers. As an example, a single photon absorbed in the absorption layer 768 may lead to the generation of approximately 10, 50, 100, 200, 500, 1000, 10,000, or any other suitable number of carriers through an avalanche-multiplication process. The carriers generated in an APD 760 may produce an electrical current that is coupled to an electrical circuit which may perform signal amplification, sampling, filtering, signal conditioning, analog-to-digital conversion, time-to-digital conversion, pulse detection, threshold detection, rising-edge detection, or falling-edge detection.

In particular embodiments, the number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 760 is saturated regardless of the input light level). In particular embodiments, an APD 760 that is operated at or above a breakdown voltage may be referred to as a single-photon avalanche diode (SPAD) and may be referred to as operating in a Geiger mode or a photon-counting mode. An APD 760 operated below a breakdown voltage may be referred to as a linear APD 760, and the output current generated by the APD may be sent to an amplifier circuit (e.g., a transimpedance amplifier). In particular embodiments, receiver 140 may include an APD configured to operate as a SPAD and a quenching circuit configured to reduce a reverse-bias voltage applied to the SPAD when an avalanche event occurs in the SPAD. An APD 760 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 760 may be coupled to a circuit that generates an electrical output pulse or edge when an avalanche event occurs.

In particular embodiments, an APD 760 or an APD 760 and a transimpedance amplifier may have a noise-equivalent power (NEP) that is less than or equal to 100 photons, 50 photons, 30 photons, 20 photons, or 10 photons. As an example, an InGaAs APD 760 may be operated as a SPAD and may have a NEP of less than or equal to 20 photons. As another example, an InGaAs APD 760 may be coupled to a transimpedance amplifier that produces an output voltage signal with a NEP of less than or equal to 50 photons. The NEP of an APD 760 is a metric that quantifies the sensitivity of the APD 760 in terms of a minimum signal (or a minimum number of photons) that the APD 760 can detect. In particular embodiments, the NEP may correspond to an optical power (or to a number of photons) that results in a signal-to-noise ratio of 1, or the NEP may represent a threshold number of photons above which an optical signal may be detected. As an example, if an APD 760 has a NEP of 20 photons, then an input beam 135 with 20 photons may be detected with a signal-to-noise ratio of approximately 1 (e.g., the APD 760 may receive 20 photons from the input beam 135 and generate an electrical signal representing the input beam 135 that has a signal-to-noise ratio of approximately 1). Similarly, an input beam 135 with 100 photons may be detected with a signal-to-noise ratio of approximately 5. In particular embodiments, a lidar system 100 with an APD 760 (or a combination of an APD 760 and transimpedance amplifier) having a NEP of less than or equal to 100 photons, 50 photons, 30 photons, 20 photons, or 10 photons may offer improved detection sensitivity with respect to a conventional lidar system that uses a PN or PIN photodiode. As an example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with an InGaAs APD detector 760.

In particular embodiments, an optical filter 630 located in front of receiver 140 may be configured to transmit light at one or more operating wavelengths of the light source 110 and attenuate light at surrounding wavelengths. As an example, an optical filter 630 may be a free-space spectral filter located in front of APD 760. The spectral filter may transmit light at the operating wavelength of the light source 110 (e.g., between approximately 1530 nm and 1560 nm) and may attenuate light outside that wavelength range. As an example, light with wavelengths of approximately 400-1530 nm or 1560-2000 nm may be attenuated by any suitable amount, such as for example, by at least 5 dB, 10 dB, 20 dB, 30 dB, or 40 dB.

Figure 38:
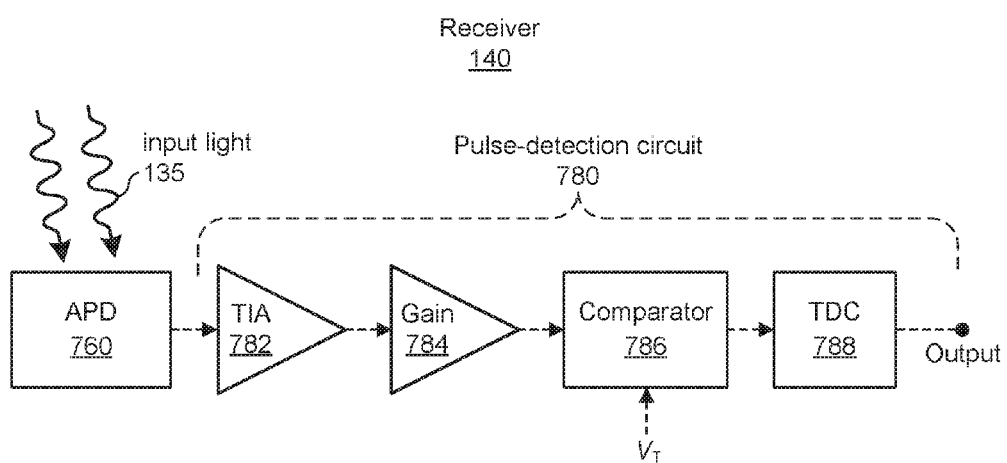
FIG. 38 illustrates an APD coupled to an example pulse-detection circuit.

FIG. 38 illustrates an APD 760 coupled to an example pulse-detection circuit 780. In particular embodiments, a pulse-detection circuit 780 may include circuitry that receives a signal from a detector (e.g., an electrical current from APD 760) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 780 may determine whether an optical pulse has been received by an APD 760 or may determine a time associated with receipt of an optical pulse by APD 760. In particular embodiments, a pulse-detection circuit 780 may include a transimpedance amplifier (TIA) 782, a gain circuit 784, a comparator 786, or a time-to-digital converter (TDC) 788. In particular embodiments, a pulse-detection circuit 780 may be included in a receiver 140 or a controller 150, or parts of a pulse-detection circuit 780 may be included in a receiver 140 and controller 150. As an example, a TIA 782 and a voltage-gain circuit 784 may be part of a receiver 140, and a comparator 786 and a TDC 788 may be part of a controller 150 that is coupled to the receiver 140.

In particular embodiments, a pulse-detection circuit 780 may include a TIA 782 configured to receive an electrical-current signal from an APD 760 and produce a voltage signal that corresponds to the received electrical-current signal. As an example, in response to a received optical pulse, an APD 760 may produce a current pulse corresponding to the optical pulse. A TIA 782 may receive the current pulse from the APD 760 and produce a voltage pulse that corresponds to the received current pulse. In particular embodiments, a TIA 782 may also act as an electronic filter. As an example, a TIA 782 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency). In particular embodiments, a pulse-detection circuit 780 may include a gain circuit 784 configured to amplify a voltage signal. As an example, a gain circuit 784 may include one or more voltage-amplification stages that amplify a voltage signal received from a TIA 782. For example, the gain circuit 784 may receive a voltage pulse from a TIA 782, and the gain circuit 784 may amplify the voltage pulse by any suitable amount, such as for example, by a gain of approximately 3 dB, 10 dB, 20 dB, 30 dB, 40 dB, or 50 dB. Additionally, the gain circuit 784 may also act as an electronic filter configured to remove or attenuate electrical noise.

In particular embodiments, a pulse-detection circuit 780 may include a comparator 786 configured to receive a voltage signal from TIA 782 or gain circuit 784 and produce an electrical-edge signal (e.g., a rising edge or a falling edge) when the received voltage signal rises above or falls below a particular threshold voltage $V_T$. As an example, when a received voltage rises above $V_T$, a comparator 786 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, a comparator 786 may produce a falling-edge digital-voltage signal (e.g., a signal that steps down from approximately 2.5 V, 3.3 V, 5 V, or any other suitable digital-high level to approximately 0 V). The voltage signal received by the comparator 786 may be received from a TIA 782 or gain circuit 784 and may correspond to an electrical-current signal generated by an APD 760. As an example, the voltage signal received by the comparator 786 may include a voltage pulse that corresponds to an electrical-current pulse produced by the APD 760 in response to receiving an optical pulse. The voltage signal received by the comparator 786 may be an analog signal, and an electrical-edge signal produced by the comparator 786 may be a digital signal.

In particular embodiments, a pulse-detection circuit 780 may include a time-to-digital converter (TDC) 788 configured to receive an electrical-edge signal from a comparator 786 and determine an interval of time between emission of a pulse of light by the light source 110 and receipt of the electrical-edge signal. The output of the TDC 788 may be a numerical value that corresponds to the time interval determined by the TDC 788. In particular embodiments, a TDC 788 may have an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. As an example, the TDC 788 may have an internal counter or clock with a 20 ps period, and the TDC 788 may determine that an interval of time between emission and receipt of a pulse is equal to 25,000 time periods, which corresponds to a time interval of approximately 0.5 microseconds. The TDC 788 may send the numerical value "25000" to a processor or controller 150 of the lidar system 100. In particular embodiments, a lidar system 100 may include a processor configured to determine a distance from the lidar system 100 to a target 130 based at least in part on an interval of time determined by a TDC 788. As an example, the processor may be an ASIC or FPGA and may be a part of controller 150. The processor may receive a numerical value (e.g., "25000") from the TDC 788, and based on the received value, the processor may determine the distance from the lidar system 100 to a target 130.

In particular embodiments, determining an interval of time between emission and receipt of a pulse of light may be based on determining (1) a time associated with the emission of the pulse by light source 110 or lidar system 100 and (2) a time when scattered light from the pulse is detected by receiver 140. As an example, a TDC 788 may count the number of time periods or clock cycles between an electrical edge associated with emission of a pulse of light and an electrical edge associated with detection of scattered light from the pulse. Determining when scattered light from the pulse is detected by receiver 140 may be based on determining a time for a rising or falling edge (e.g., a rising or falling edge produced by comparator 786) associated with the detected pulse. In particular embodiments, determining a time associated with emission of a pulse of light may be based on an electrical trigger signal. As an example, light source 110 may produce an electrical trigger signal for each pulse of light that is emitted, or an electrical device (e.g., function generator 420 or controller 150) may provide a trigger signal to the light source 110 to initiate the emission of each pulse of light. A trigger signal associated with emission of a pulse may be provided to TDC 788, and a rising edge or falling edge of the trigger signal may correspond to a time when a pulse is emitted. In particular embodiments, a time associated with emission of a pulse may be determined based on an optical trigger signal. As an example, a time associated with the emission of a pulse of light may be determined based at least in part on detection of a portion of light from the emitted pulse of light. The portion of light may be detected by a separate detector (e.g., a PIN photodiode or an APD 760) or by the receiver 140. A portion of light from an emitted pulse of light may be scattered or reflected from a surface (e.g., a surface of a beam splitter or a surface of light source 110, mirror 115, or scanner 120) located within lidar system 100 or sensor head 310. Some of the scattered or reflected light may be received by an APD 760 of receiver 140, and a pulse-detection circuit 780 coupled to the APD 760 may determine that a pulse has been received. The time at which the pulse was received may be associated with the emission time of the pulse. In particular embodiments, receiver 140 may include one APD 760 and one pulse-detection circuit 780 configured to detect a portion of an emitted pulse of light that is scattered or reflected from within the lidar system 100 as well a portion of the pulse of light that is subsequently scattered by a target 130. In particular embodiments, receiver 140 may include two APDs 760 and two pulse-detection circuits 780. One APD 760 and pulse-detection circuit 780 may detect a portion of an emitted pulse of light that is scattered or reflected from within the lidar system 100, and the other APD 760 and pulse-detection circuit 780 may detect a portion of the pulse of light scattered by a target 130.

In particular embodiments, a lidar system 100 may include a processor configured to determine a distance D from the lidar system 100 to a target 130 based at least in part on a round-trip time of flight for a pulse of light emitted by the light source 110 to travel from the lidar system 100 to the target 130 and back to the lidar system 100. In particular embodiments, a round-trip time of flight for a pulse of light may be determined based at least in part on a rising edge or a falling edge associated with the pulse of light detected by receiver 140. As an example, a pulse of light detected by receiver 140 may generate a current pulse in an APD 760, which results in a rising-edge signal produced by a comparator 786 coupled to the APD 760. In particular embodiments, a lidar system 100 may include a TDC 788 configured to determine a time interval between emission of a pulse of light by light source 110 and detection by receiver 140 of at least a portion of the pulse of light scattered by a target 130.

Figure 39:
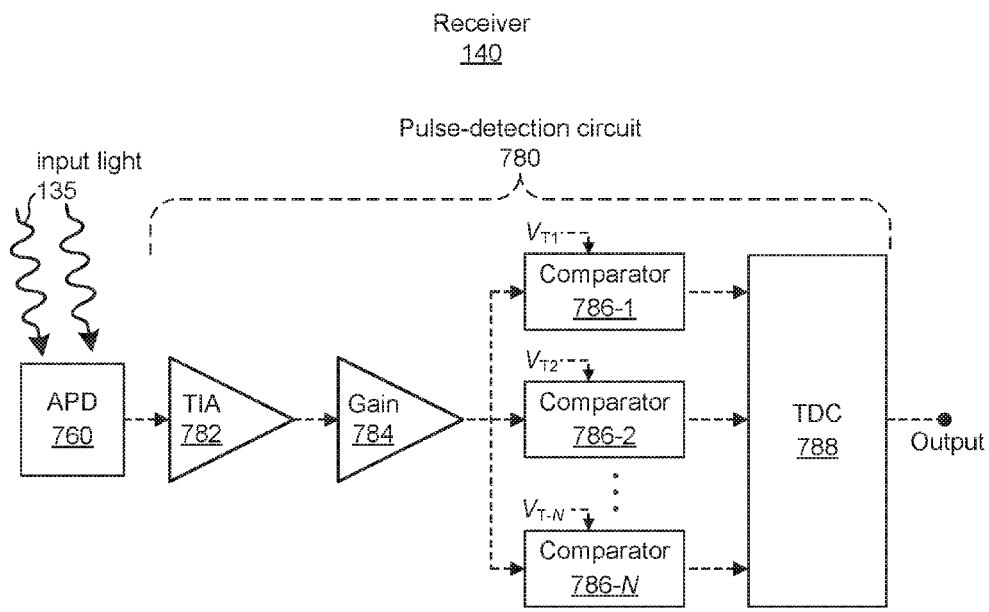
FIG. 39 illustrates an APD coupled to an example multi-channel pulse-detection circuit.

FIG. 39 illustrates an APD 760 coupled to an example multi-channel pulse-detection circuit 780. In particular embodiments, a multi-channel pulse-detection circuit 780 may include two or more comparators 786 and a TDC 788 with two or more input channels. In the example of FIG. 39, the multi-channel pulse detection circuit includes a TIA 782 that receives a current signal from APD 760 and a gain circuit 784 that boosts a voltage signal provided by TIA 782. The amplified voltage signal from the gain circuit 784 is sent to the N comparators (comparators 786-1, 786-2, . . . , 786-N), and each comparator is supplied with a particular reference or threshold voltage ($V_{T1}$, $V_{T2}$, . . . , $V_{T-N}$). In particular embodiments, a multi-channel pulse-detection circuit 780 may include 2, 3, 4, 6, 8, 16, 32, 64, 128, or any other suitable number of comparators 786. As an example, a multi-channel pulse-detection circuit 780 may include N=8 comparators 786, and each comparator may be configured to provide a rising or falling edge to TDC 788 when a voltage signal provided by TIA 782 or gain circuit 784 rises above or falls below a particular threshold voltage $V_T$. For example, four of the comparators 786 may provide a rising edge when the voltage signal rises above 0.2 V, 0.4 V, 0.6 V, and 0.8 V, respectively, and the other four comparators 786 may provide a falling edge when the voltage signal falls below 0.2 V, 0.4 V, 0.6 V, and 0.8 V, respectively. A multi-channel pulse-detection circuit 780 may provide additional information about a received pulse of light, such as for example, a shape of the pulse, a duration of the pulse, or timing information about the rising edge, falling edge, or peak of the pulse.

In particular embodiments, a multi-channel pulse-detection circuit 780 may include two comparators (786-1, 786-2). The first comparator 786-1 may produce a first electrical-edge signal when a voltage signal provided by TIA 782 or gain circuit 784 rises above a threshold voltage $V_{T1}$. The second comparator 786-2 may produce a second electrical-edge signal when the voltage signal falls below a threshold voltage $V_{T2}$. The threshold voltages $V_{T1}$ and $V_{T2}$ may be the same or may be different voltages. As an example, if $V_{T1}$ and $V_{T2}$ are the same, the edge from the first comparator 786-1 may correspond to a particular level of a rising edge of a received pulse, and the edge from the second comparator 786-2 may correspond to the same level of a falling edge of the received pulse. Additionally, the time difference between the two edges may represent a width or duration of the pulse. In particular embodiments, a multi-channel pulse-detection circuit 780 may include a TDC 788 configured to receive the first and second electrical-edge signals from comparators 786-1 and 786-2, respectively. The TDC 788 may determine a duration of the received pulse of light based on a time difference between receipt of the first and second electrical-edge signals. The TDC 788 may determine a first interval of time between emission of the pulse of light by the light source 110 and receipt of the first electrical-edge signal by the TDC 788. Additionally, the TDC 788 may determine a second interval of time between emission of the pulse of light and receipt of the second electrical-edge signal. The TDC 788 may determine a time associated with a peak of the received pulse of light based at least in part on the first and second electrical-edge signals (e.g., the peak may be located approximately midway between the times associated with the first and second electrical-edge signals). In particular embodiments, a processor or controller 150 may determine a distance from the lidar system 100 to a target 130 based at least in part on a duration of a received pulse of light, a shape of a received pulse of light, a first or second interval of time associated with a rising or falling edge, respectively, of a received pulse of light, or a time associated with a peak of a received pulse of light.

Figure 40:
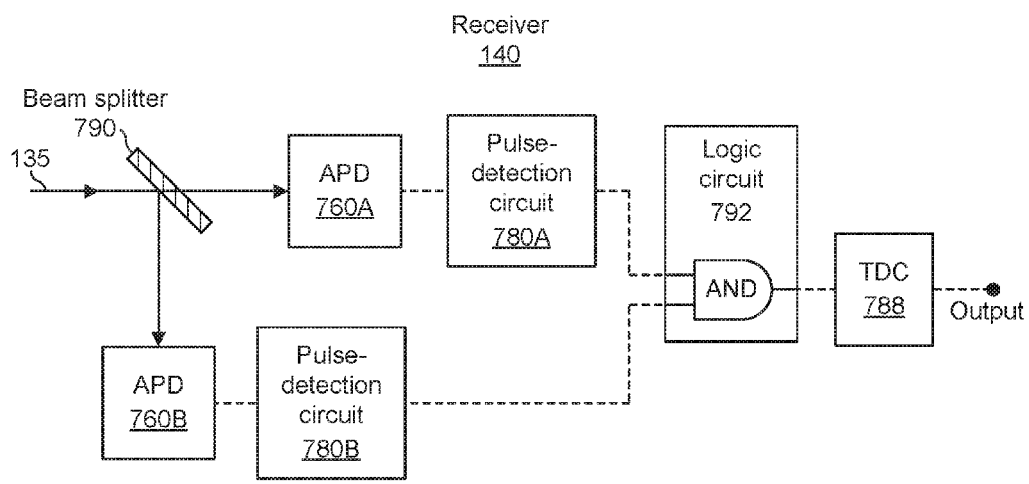
FIG. 40 illustrates an example receiver that includes two APDs coupled to a logic circuit.

FIG. 40 illustrates an example receiver 140 that includes two APDs (760A, 760B) coupled to a logic circuit 792. In particular embodiments, a receiver 140 may include two or more APDs 760 which are coupled to a logic circuit 792 (e.g., each APD may be coupled to the logic circuit through a pulse-detection circuit). The logic circuit 792 may include one or more logic gates (e.g., one or more AND gates), where the logic gates are configured to produce an output indicating that the receiver 140 has detected an optical pulse only if each of the APDs (760A, 760B) or their associated pulse-detection circuits (780A, 780B) produces an electrical signal corresponding to detection of the optical pulse. In the example of FIG. 40, input beam 135 is split by beam splitter 790 into two beams which are coupled to APDs 760A and 760B. APD 760A is coupled to pulse-detection circuit 780A, and APD 760B is coupled to pulse-detection circuit 780B. Each pulse-detection circuit illustrated in FIG. 40 may include a TIA 782, a gain circuit 784, or a comparator 786, and a comparator 786 of each pulse-detection circuit may provide a digital signal to the logic circuit 792. The logic circuit 792 in FIG. 40 includes a single AND gate which may be configured to provide an electrical-edge signal to TDC 788 only if both pulse-detection circuits 780A and 780B provide a digital-high signal to the AND gate. The receiver 140 illustrated in FIG. 40 provides redundancy that may reduce the probability of false pulse-detection events caused by noise (e.g., noise in an APD resulting from dark current or thermally induced carrier generation). A noise event in APD 760A or 760B may cause an associated pulse-detection circuit 780A or 780B to produce a digital-high signal. However, the AND gate will not send an electrical-edge signal to the TDC 788 if it receives a digital-high signal from only one of the pulse-detection circuits 780A or 780B. The AND gate will only send an electrical-edge signal to the TDC 788 if it receives a digital-high signal from both pulse-detection circuits 780A and 780B, which indicates that both APDs 760A and 760B have detected an optical pulse.

Figure 41:
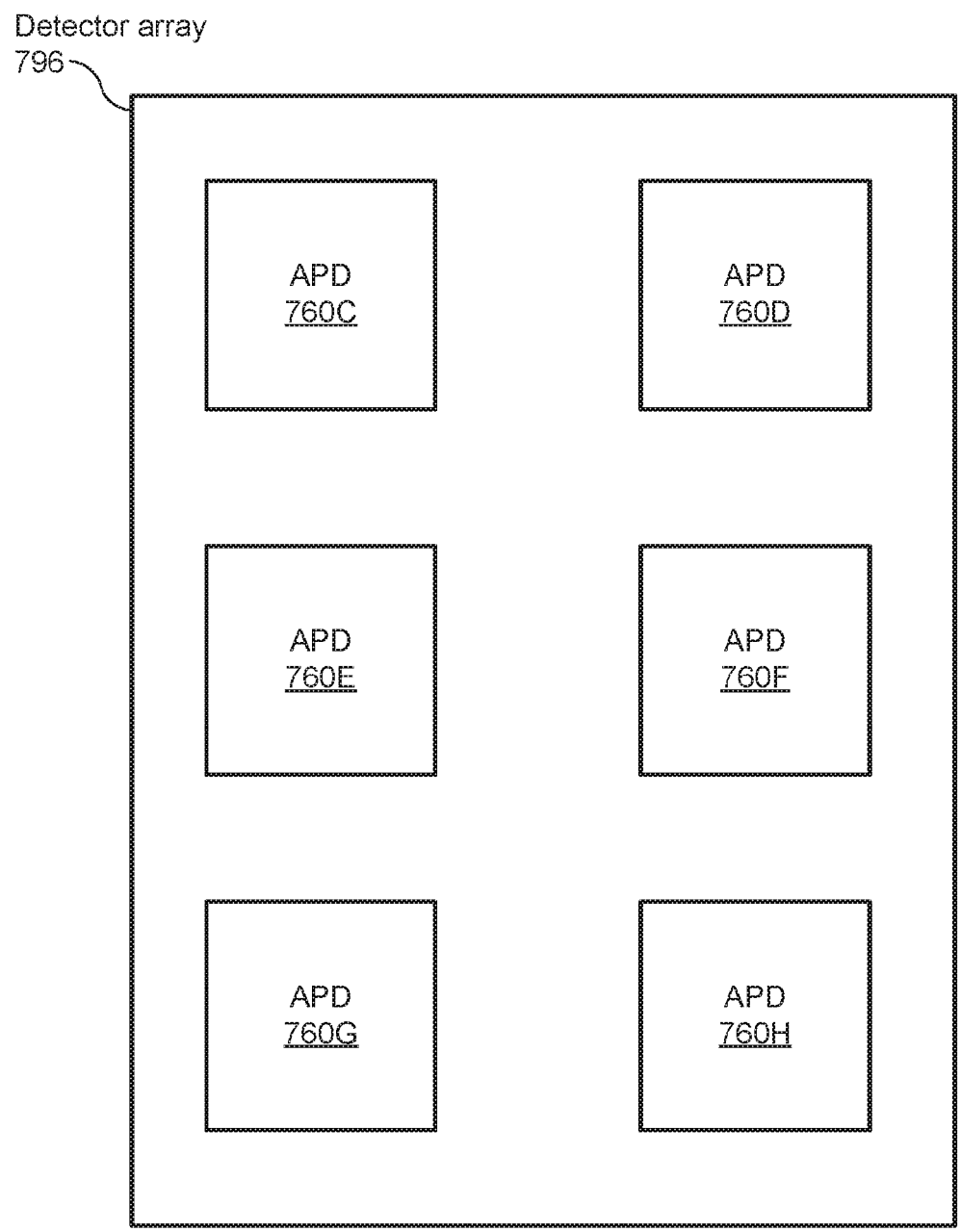
FIG. 41 illustrates an example detector array.

FIG. 41 illustrates an example detector array 796. In particular embodiments, a receiver 140 may include an array 796 of two or more APDs 760. A detector array 796 may include any suitable number or arrangement of APDs 760. As an example, a detector array 796 may include two APDs 760 arranged side-by-side or one above the other. An arrangement of two side-by-side APDs 760 may be used to scan alternate pixels 210 across a field of regard (e.g., APD 760C may detect light from odd-numbered pixels 210, and APD 760D may detect light from even-numbered pixels 210). The detector array 796 in FIG. 41 includes six APDs (760C, 760D, 760E, 760F, 760G, and 760H) arranged in a 2×3 configuration. A detector array 796 may allow a lidar system 100 to simultaneously scan multiple rows in a field of regard. As an example, detector 760C or 760D may scan a particular row (e.g., row #1), detector 760E or 760F may scan another row (e.g., row #17), and detector 760G or 760H may scan a different row (e.g., row #33). On a subsequent scan across the field of regard, detector 760C or 760D may scan row #2, detector 760E or 760F may scan row #18, and detector 760G or 760H may scan row #34.

Figure 42:
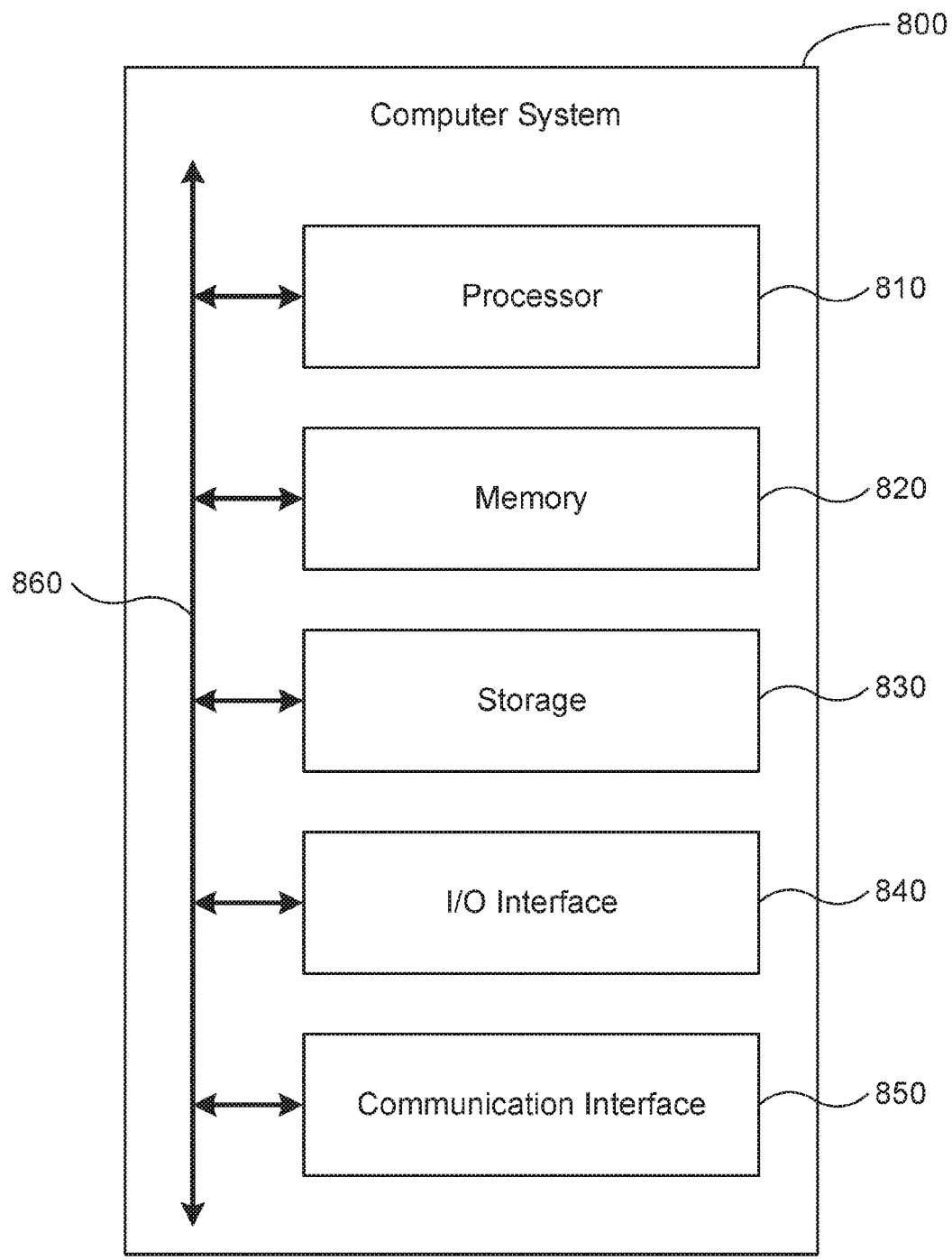
FIG. 42 illustrates an example computer system.

FIG. 42 illustrates an example computer system 800. In particular embodiments, one or more computer systems 800 may perform one or more steps of one or more methods described or illustrated herein. In particular embodiments, one or more computer systems 800 may provide functionality described or illustrated herein. In particular embodiments, software running on one or more computer systems 800 may perform one or more steps of one or more methods described or illustrated herein or may provide functionality described or illustrated herein. Particular embodiments may include one or more portions of one or more computer systems 800. In particular embodiments, a computer system may be referred to as a computing device, a computing system, a computer, a general-purpose computer, or a data-processing apparatus. Herein, reference to a computer system may encompass one or more computer systems, where appropriate.

Computer system 800 may take any suitable physical form. As an example, computer system 800 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 800 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 800 may include one or more computer systems 800; be unitary or distributed; span multiple locations; span multiple machines; span multiple data centers; or reside in a cloud, which may include one or more cloud components in one or more networks. Where appropriate, one or more computer systems 800 may perform without substantial spatial or temporal limitation one or more steps of one or more methods described or illustrated herein. As an example, one or more computer systems 800 may perform in real time or in batch mode one or more steps of one or more methods described or illustrated herein. One or more computer systems 800 may perform at different times or at different locations one or more steps of one or more methods described or illustrated herein, where appropriate.

As illustrated in the example of FIG. 42, computer system 800 may include a processor 810, memory 820, storage 830, an input/output (I/O) interface 840, a communication interface 850, or a bus 860. Computer system 800 may include any suitable number of any suitable components in any suitable arrangement.

In particular embodiments, processor 810 may include hardware for executing instructions, such as those making up a computer program. As an example, to execute instructions, processor 810 may retrieve (or fetch) the instructions from an internal register, an internal cache, memory 820, or storage 830; decode and execute them; and then write one or more results to an internal register, an internal cache, memory 820, or storage 830. In particular embodiments, processor 810 may include one or more internal caches for data, instructions, or addresses. Processor 810 may include any suitable number of any suitable internal caches, where appropriate. As an example, processor 810 may include one or more instruction caches, one or more data caches, or one or more translation lookaside buffers (TLBs). Instructions in the instruction caches may be copies of instructions in memory 820 or storage 830, and the instruction caches may speed up retrieval of those instructions by processor 810. Data in the data caches may be copies of data in memory 820 or storage 830 for instructions executing at processor 810 to operate on; the results of previous instructions executed at processor 810 for access by subsequent instructions executing at processor 810 or for writing to memory 820 or storage 830; or other suitable data. The data caches may speed up read or write operations by processor 810. The TLBs may speed up virtual-address translation for processor 810. In particular embodiments, processor 810 may include one or more internal registers for data, instructions, or addresses. Processor 810 may include any suitable number of any suitable internal registers, where appropriate. Where appropriate, processor 810 may include one or more arithmetic logic units (ALUs); may be a multi-core processor; or may include one or more processors 810.

In particular embodiments, memory 820 may include main memory for storing instructions for processor 810 to execute or data for processor 810 to operate on. As an example, computer system 800 may load instructions from storage 830 or another source (such as, for example, another computer system 800) to memory 820. Processor 810 may then load the instructions from memory 820 to an internal register or internal cache. To execute the instructions, processor 810 may retrieve the instructions from the internal register or internal cache and decode them. During or after execution of the instructions, processor 810 may write one or more results (which may be intermediate or final results) to the internal register or internal cache. Processor 810 may then write one or more of those results to memory 820. One or more memory buses (which may each include an address bus and a data bus) may couple processor 810 to memory 820. Bus 860 may include one or more memory buses. In particular embodiments, one or more memory management units (MMUs) may reside between processor 810 and memory 820 and facilitate accesses to memory 820 requested by processor 810. In particular embodiments, memory 820 may include random access memory (RAM). This RAM may be volatile memory, where appropriate. Where appropriate, this RAM may be dynamic RAM (DRAM) or static RAM (SRAM). Memory 820 may include one or more memories 820, where appropriate.

In particular embodiments, storage 830 may include mass storage for data or instructions. As an example, storage 830 may include a hard disk drive (HDD), a floppy disk drive, flash memory, an optical disc, a magneto-optical disc, magnetic tape, or a Universal Serial Bus (USB) drive or a combination of two or more of these. Storage 830 may include removable or non-removable (or fixed) media, where appropriate. Storage 830 may be internal or external to computer system 800, where appropriate. In particular embodiments, storage 830 may be non-volatile, solid-state memory. In particular embodiments, storage 830 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 830 may include one or more storage control units facilitating communication between processor 810 and storage 830, where appropriate. Where appropriate, storage 830 may include one or more storages 830.

In particular embodiments, I/O interface 840 may include hardware, software, or both, providing one or more interfaces for communication between computer system 800 and one or more I/O devices. Computer system 800 may include one or more of these I/O devices, where appropriate. One or more of these I/O devices may enable communication between a person and computer system 800. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 840 may include one or more device or software drivers enabling processor 810 to drive one or more of these I/O devices. I/O interface 840 may include one or more I/O interfaces 840, where appropriate.

In particular embodiments, communication interface 850 may include hardware, software, or both providing one or more interfaces for communication (such as, for example, packet-based communication) between computer system 800 and one or more other computer systems 800 or one or more networks. As an example, communication interface 850 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 800 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 800 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 800 may communicate using fiber-optic communication based on 100 Gigabit Ethernet (100 GbE), 10 Gigabit Ethernet (10 GbE), or Synchronous Optical Networking (SONET). Computer system 800 may include any suitable communication interface 850 for any of these networks, where appropriate. Communication interface 850 may include one or more communication interfaces 850, where appropriate.

In particular embodiments, bus 860 may include hardware, software, or both coupling components of computer system 800 to each other. As an example, bus 860 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 860 may include one or more buses 860, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 800. As an example, computer software may include instructions configured to be executed by processor 810. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

The following paragraphs describe various specific embodiments of a lidar system and a laser system:

A lidar system comprising: a light source configured to emit pulses of light; a plurality of optical links, wherein each optical link couples the light source to a corresponding sensor head of a plurality of sensor heads, wherein the optical link is configured to convey at least a portion of the emitted pulses of light from the light source to the corresponding sensor head; and the plurality of sensor heads, wherein each sensor head comprises: a scanner configured to scan pulses of light across a field of regard of the sensor head, wherein the scanned pulses of light comprise the portion of the emitted pulses of light conveyed from the light source to the sensor head by the corresponding optical link; and a receiver configured to detect at least a portion of the scanned pulses of light scattered or reflected by a target located downrange from the sensor head.

The lidar system, wherein: the target is at least partially contained within the field of regard of the sensor head and is located a distance from the sensor head that is less than or equal to a maximum range of the lidar system; and the sensor head further comprises a processor configured to determine the distance from the sensor head to the target based at least in part on a time of flight for a pulse of light to travel from the sensor head to the target and back to the sensor head.

The lidar system, wherein the lidar system is incorporated into a vehicle wherein the sensor heads are positioned to provide a 360-degree view of an environment around the vehicle.

The lidar system, wherein each optical link comprises a fiber-optic cable having a length greater than or equal to 1 meter.

The lidar system, further comprising a plurality of electrical links corresponding to the plurality of optical links, wherein each electrical link couples the light source to a respective sensor head of the plurality of sensor heads, wherein the electrical link is configured to convey electrical power or one or more electrical signals between the light source and the respective sensor head.

The lidar system, wherein the light source comprises: a seed laser configured to produce low-power optical pulses; and one or more optical amplifiers configured to amplify the low-power optical pulses to produce the pulses of light emitted by the light source.

The lidar system, wherein the light source further comprises one or more optical filters, wherein each optical filter is configured to reduce an amount of amplified spontaneous emission light produced by one or more of the optical amplifiers.

The lidar system, wherein the light source further comprises a supplemental light source combined with the seed laser, wherein light from the supplemental light source is configured to prevent at least one of the optical amplifiers from spontaneously emitting an optical pulse during a time after amplification of a first low-power optical pulse and prior to receipt of a second low-power optical pulse.

The lidar system, wherein the light source comprises: a plurality of laser diodes, wherein each laser diode is configured to produce light at a different operating wavelength; and an optical multiplexer configured to combine the light produced by each laser diode into a single optical fiber.

The lidar system, wherein the light source comprises a wavelength-tunable laser configured to produce optical pulses at a plurality of wavelengths of light corresponding to the plurality of sensor heads, wherein each wavelength produced by the wavelength-tunable laser is conveyed to a corresponding sensor head.

The lidar system, wherein the light source comprises an optical amplifier comprising one or more optical filters, wherein each optical filter is configured to reduce an amount of amplified spontaneous emission light produced by the optical amplifier.

The lidar system, wherein: the lidar system comprises N optical links coupled to N respective sensor heads; and the light source comprises a 1×N optical demultiplexer configured to distribute the emitted pulses of light between the N optical links.

The lidar system, wherein the optical demultiplexer comprises an optical-power splitter, an optical switch, or a wavelength demultiplexer.

The lidar system, wherein distributing the emitted pulses of light between the N optical links comprises: splitting each emitted pulse of light into N pulses of light; and sending each pulse of the N pulses to a corresponding optical link for transmission to a corresponding sensor head.

The lidar system, wherein: the pulses of light emitted by the light source comprise pulses having N different wavelengths; and distributing the emitted pulses of light between the N optical links comprises sending each pulse having a particular wavelength to a corresponding optical link for transmission to a corresponding sensor head.

The lidar system, wherein each optical link comprises a gain fiber of a fiber-optic amplifier, wherein the gain fiber is configured to amplify the portion of the emitted pulses of light while propagating from the light source to the corresponding sensor head.

The lidar system, wherein each optical link comprises a gain fiber of an optical amplifier, wherein the gain fiber is distributed along a length of the optical link and is configured to amplify the portion of the emitted pulses of light while the portion of the emitted pulses of light is conveyed from the light source to the corresponding sensor head.

The lidar system, wherein each sensor head further comprises an optical amplifier configured to: amplify the pulses of light conveyed to the sensor head by the optical link; and send the amplified pulses of light to the scanner for scanning across the field of regard of the sensor head.

The lidar system, wherein the optical amplifier is a free-space amplifier or a fiber-optic amplifier.

A laser system comprising: a seed laser configured to produce optical seed pulses; a first fiber-optic amplifier configured to amplify the seed pulses by a first amplifier gain to produce a first-amplifier output that comprises amplified seed pulses and amplified spontaneous emission (ASE); a first optical filter configured to remove from the first-amplifier output an amount of the ASE; and a second fiber-optic amplifier configured to receive the amplified seed pulses from the first optical filter and amplify the received pulses by a second amplifier gain to produce output pulses, wherein the output pulses have output-pulse characteristics comprising: a pulse repetition frequency of less than or equal to 100 MHz; a pulse duration of less than or equal to 20 nanoseconds; and a duty cycle of less than or equal to 1%.

The laser system, wherein the output-pulse characteristics further comprise: an operating wavelength of between approximately 1400 nm and 2050 nm; a pulse energy of greater than or equal to 10 nanojoules; a peak power of greater than or equal to 1 watt; and an average power of less than or equal to 50 watts, wherein the ASE comprises less than or equal to 25% of the average power.

The laser system, wherein: the optical seed pulses have an average power of greater than or equal to 1 microwatt; the output pulses have an average power of greater than or equal to 1 milliwatt; and the first amplifier gain and the second amplifier gain together correspond to an overall optical power gain of greater than or equal to 40 dB.

The laser system, wherein the seed laser comprises a laser diode configured to be electrically driven by a pulse generator to produce the optical seed pulses.

The laser system, wherein the seed laser comprises: a laser diode configured to produce continuous-wave (CW) light; and an optical modulator configured to receive the CW light and produce the optical seed pulses from the received CW light.

The laser system, wherein the seed laser comprises: a laser diode configured to produce optical pulses having a duration $\tau$; and an optical modulator configured to: receive the optical pulses from the laser diode; and selectively transmit a portion of each of the received optical pulses to produce the optical seed pulses, wherein each optical seed pulse has a duration less than $\tau$.

The laser system, wherein the seed laser comprises: a plurality of laser diodes, wherein each laser diode is configured to produce light at a different wavelength; and an optical multiplexer configured to combine the light produced by each laser diode into a single optical fiber.

The laser system, further comprising a wavelength-dependent delay line configured to receive input light comprising a plurality of operating wavelengths of the laser system and produce time-delayed light, wherein the time-delayed light comprises the light at the plurality of operating wavelengths, wherein each wavelength of the plurality of operating wavelengths has a particular time delay based on the wavelength.

The laser system, wherein the delay line comprises: a circulator; and a plurality of fiber Bragg gratings (FBGs) corresponding to the plurality of operating wavelengths, wherein: the FBGs are arranged in series and separated from one another by a particular length of optical fiber; and each FBG is configured to reflect one wavelength of the operating wavelengths.

The laser system, wherein the seed laser comprises a wavelength-tunable laser configured to produce light at a plurality of wavelengths.

The laser system, wherein the seed laser comprises a mode-locked fiber laser and a pulse picker configured to extract optical pulses produced by the mode-locked fiber laser.

The laser system, wherein the first optical filter is configured to remove greater than or equal to 80% of the ASE from the first-amplifier output.

The laser system, wherein the first optical filter comprises a spectral filter configured to transmit light at one or more operating wavelengths of the laser system and attenuate light away from the transmitted wavelengths by at least 20 dB.

The laser system, wherein the first optical filter comprises a temporal filter comprising an optical switch or a semiconductor optical amplifier, wherein the temporal filter is configured to be in a transmitting state when an amplified seed pulse is present and to be in a non-transmitting state otherwise, wherein when operating in the non-transmitting state, the ASE is substantially prevented from being transmitted through the first optical filter.

The laser system, further comprising a second optical filter configured to receive the output pulses from the second amplifier and reduce an amount of ASE produced by the second amplifier.

The laser system, further comprising an optical demultiplexer configured to receive the output pulses from the second fiber-optic amplifier and distribute the output pulses to a plurality of optical links of a lidar system, wherein the optical links are coupled to a respective plurality of sensor heads of the lidar system.

The laser system, further comprising an output collimator configured to receive the output pulses from the second fiber-optic amplifier and produce a free-space optical beam comprising the output pulses.

The laser system, wherein: the first fiber-optic amplifier comprises a double-pass amplifier comprising: a circulator; an erbium-doped or erbium/ytterbium-doped gain fiber comprising a first end and a second end, wherein the first end is coupled to the circulator; and a fiber Bragg grating (FBG) coupled to the second end of the gain fiber, wherein the FBG is configured to reflect light corresponding to one or more operating wavelengths of the laser system and transmit or attenuate light that is away from the reflected wavelengths; and the second fiber-optic amplifier comprises a booster amplifier comprising a double-clad gain fiber comprising erbium dopants or erbium and ytterbium dopants.

The laser system, wherein: the first fiber-optic amplifier comprises a first single-pass amplifier comprising a first gain fiber comprising erbium dopants or erbium and ytterbium dopants; the second fiber-optic amplifier comprises a second single-pass amplifier comprising a second gain fiber comprising erbium dopants or erbium and ytterbium dopants; and the laser system further comprises a third fiber-optic amplifier, wherein the third amplifier comprises a booster amplifier comprising a double-clad gain fiber comprising erbium dopants or erbium and ytterbium dopants.

The laser system, wherein: the first fiber-optic amplifier comprises a double-pass amplifier comprising: a circulator; an erbium-doped or erbium/ytterbium-doped gain fiber comprising a first end and a second end, wherein the first end is coupled to the circulator; and a fiber Bragg grating (FBG) coupled to the second end of the gain fiber, wherein the FBG is configured to reflect light corresponding to one or more operating wavelengths of the laser system and transmit or attenuate light that is away from the reflected wavelengths; the second fiber-optic amplifier comprises a single-pass amplifier comprising erbium-doped or erbium/ytterbium-doped gain fiber; and the laser system further comprises a third fiber-optic amplifier, wherein the third amplifier comprises a booster amplifier comprising a double-clad gain fiber comprising erbium dopants or erbium and ytterbium dopants.

The laser system, wherein the second fiber-optic amplifier comprises a booster amplifier comprising a double-clad gain fiber comprising erbium dopants or erbium and ytterbium dopants.

The laser system, wherein the booster amplifier further comprises a cladding mode stripper.

The laser system, wherein the seed laser, the first amplifier, the first optical filter, and the second amplifier are packaged together within a single housing.

The laser system, wherein the laser system further comprises a third fiber-optic amplifier configured to receive the output pulses from the second amplifier and amplify the output pulses by a third amplifier gain, wherein the third amplifier comprises a booster amplifier comprising a double-clad gain fiber comprising erbium dopants or erbium and ytterbium dopants.

The laser system, wherein the laser system is part of a lidar system comprising a light source, an optical link, and a sensor head, wherein: the optical link couples the light source to the sensor head; the seed laser is disposed in the light source; the first fiber-optic amplifier is disposed in the light source, the optical link, or the sensor head; and the second fiber-optic amplifier is disposed in the light source, the optical link, or the sensor head.

The laser system, wherein: the first and second amplifiers are disposed in the light source; and the laser system further comprises a third fiber-optic amplifier comprising a gain fiber distributed along a length of the optical link.

The laser system, wherein: the first amplifier is disposed in the light source; and the second amplifier comprises a gain fiber distributed along a length of the optical link.

The laser system, wherein: the first and second amplifiers are disposed in the light source; and the laser system further comprises a third amplifier disposed in the sensor head, wherein the third amplifier comprises a free-space amplifier or a fiber-optic amplifier.

The laser system, wherein: the first amplifier is disposed in the light source; the second amplifier comprises a gain fiber distributed along a length of the optical link; and the laser system further comprises a third amplifier disposed in the sensor head, wherein the third amplifier comprises a free-space amplifier or a fiber-optic amplifier.

A lidar system comprising: a light source configured to emit pulses of light; a scanner configured to scan at least a portion of the emitted pulses of light across a field of regard; and a receiver configured to detect at least a portion of the scanned pulses of light scattered by a target located a distance from the lidar system.

The lidar system, further comprising a sensor head located remotely from the light source, wherein: the sensor head comprises the scanner and the receiver; and the sensor head is coupled to the light source by an optical link, wherein the optical link conveys the portion of the emitted pulses of light from the light source to the sensor head.

The lidar system, wherein the lidar system further comprises one or more additional sensor heads, wherein: each of the additional sensor heads comprises a respective scanner and receiver; and the light source is coupled to each of the additional sensor heads by a respective optical link which conveys a respective portion of the emitted pulses of light from the light source to each of the additional sensor heads.

The lidar system, wherein the lidar system is incorporated into a vehicle wherein the sensor head and one or more additional sensor heads of the lidar system are positioned to provide a greater than or equal to 30-degree view of an environment around the vehicle.

The lidar system, wherein the lidar system has a maximum range of greater than or equal to 50 meters.

The lidar system, wherein the field of regard comprises: a horizontal field of regard greater than or equal to 25 degrees; and a vertical field of regard greater than or equal to 5 degrees.

The lidar system, wherein the lidar system has a horizontal resolution of greater than or equal to 100 pixels and a vertical resolution of greater than or equal to 4 pixels.

The lidar system, wherein the lidar system is configured to generate point clouds at a rate between approximately 0.1 frames per second and approximately 1,000 frames per second.

The lidar system of, wherein the light source comprises a pulsed laser diode.

The lidar system, wherein the light source comprises: a seed laser configured to produce optical seed pulses; and one or more optical amplifiers configured to amplify the optical seed pulses to produce the pulses of light emitted by the light source.

The lidar system, wherein the seed laser comprises a distributed-feedback (DFB) laser or a distributed-Bragg reflector (DBR) laser.

The lidar system, wherein the light source comprises a booster amplifier comprising a double-clad gain fiber comprising erbium dopants or erbium and ytterbium dopants.

The lidar system, wherein the light source comprises: a plurality of laser diodes, wherein each laser diode is configured to produce light at a different operating wavelength; and an optical multiplexer configured to combine the light produced by each laser diode into a single optical fiber.

The lidar system, wherein the light source is an eye-safe laser with an operating wavelength between approximately 1400 nm and approximately 1600 nm.

The lidar system, wherein the pulses of light emitted by the light source have pulse characteristics comprising: an operating wavelength between approximately 1400 nm and approximately 1600 nm; a pulse repetition frequency of less than or equal to 100 MHz; a pulse duration of less than or equal to 20 nanoseconds; and a duty cycle of less than or equal to 1%.

The lidar system, wherein the pulse characteristics further comprise: a pulse energy of greater than or equal to 10 nanojoules; a peak power of greater than or equal to 1 watt; and an average power of less than or equal to 50 watts.

The lidar system, wherein the light source comprises an optical filter configured to transmit light at one or more operating wavelengths of the light source and attenuate light away from the transmitted wavelengths by at least 10 dB.

The lidar system, wherein the light source comprises an optical filter configured to reduce an amount of amplified spontaneous emission light produced by one or more optical amplifiers of the light source.

The lidar system, wherein the light source comprises a diode-pumped solid-state (DPSS) laser.

The lidar system, wherein the scanner comprises one or more mirrors, wherein each mirror is mechanically driven by a galvanometer scanner, a resonant scanner, a microelectromechanical systems (MEMS) device, or a voice coil motor.

The lidar system, wherein the scanner comprises: a first mirror driven by a first galvanometer scanner that scans the first mirror along a first direction; and a second mirror driven by a second galvanometer scanner that scans the second mirror along a second direction substantially orthogonal to the first direction.

The lidar system, wherein the scanner comprises: a first mirror driven by a resonant scanner that scans the first mirror along a first direction; and a second mirror driven by a galvanometer scanner that scans the second mirror along a second direction substantially orthogonal to the first direction.

The lidar system, wherein the scanner comprises two mirrors driven synchronously, wherein the synchronously driven mirrors trace out a scan pattern that comprises substantially straight lines.

The lidar system, wherein the scanner comprises a mirror driven by two actuators configured to scan the mirror along two substantially orthogonal directions.

The lidar system, wherein the scanner comprises a mirror configured to be scanned along two axes, wherein motion along each axis is provided by two actuators arranged in a push-pull configuration.

The lidar system, wherein: an output beam of the lidar system comprises the portion of the emitted pulses of light which are scanned across the field of regard; an input beam of the lidar system comprises the portion of the scanned pulses of light detected by the receiver; and the input and output beams are substantially coaxial.

The lidar system, further comprising an overlap mirror configured to overlap the input and output beams so that they are substantially coaxial, wherein the overlap mirror comprises: a hole, slot, or aperture which the output beam passes through; and a reflecting surface that reflects at least a portion of the input beam toward the receiver.

The lidar system, wherein: scanning the portion of the emitted pulses of light across the field of regard comprises scanning a field of view of the light source across the field of regard; and the scanner is further configured to scan a field of view of the receiver across the field of regard, wherein the light-source field of view and the receiver field of view are scanned synchronously with respect to one another.

The lidar system, wherein the light-source field of view and the receiver field of view are at least partially overlapped during scanning.

The lidar system, wherein: the light-source field of view and the receiver field of view are scanned along a scanning direction; and the receiver field of view is offset from the light-source field of view in a direction opposite the scanning direction.

The lidar system, wherein an angular extent of the light-source field of view is approximately equal to an angular extent of the receiver field of view.

The lidar system, wherein: the light-source field of view has an angular extent of less than or equal to 50 milliradians; and the receiver field of view has an angular extent of less than or equal to 50 milliradians.

The lidar system, wherein: the receiver comprises an avalanche photodiode (APD); and detecting the portion of the scanned pulses of light scattered by the target comprises: receiving, by the APD, a pulse of light of the portion of the scanned pulses of light scattered by the target; and generating, by the APD, an electrical-current signal corresponding to the received pulse of light.

The lidar system, wherein the receiver further comprises a transimpedance amplifier configured to receive the electrical-current signal from the APD and produce a voltage signal that corresponds to the received electrical-current signal.

The lidar system, wherein the receiver further comprises a comparator configured to produce an electrical-edge signal when a voltage signal corresponding to the electrical-current signal generated by the APD rises above a predetermined threshold voltage.

The lidar system, further comprising a time-to-digital converter (TDC) configured to: receive the electrical-edge signal; and determine an interval of time between emission of the pulse of light by the light source and receipt of the electrical-edge signal.

The lidar system, wherein determining the interval of time comprises determining a time associated with the emission of the pulse of light by the light source, wherein the time associated with the emission of the pulse of light is determined based at least in part on detection by the receiver of a portion of light from the emitted pulse of light.

The lidar system, further comprising a processor configured to determine the distance from the lidar system to the target based at least in part on the interval of time determined by the TDC.

The lidar system, wherein the receiver further comprises: a first comparator configured to produce a first electrical-edge signal when a voltage signal corresponding to the electrical-current signal generated by the APD rises above a first predetermined threshold voltage; a second comparator configured to produce a second electrical-edge signal when the voltage signal falls below a second predetermined threshold voltage; and a time-to-digital converter (TDC) configured to: receive the first and second electrical-edge signals; determine a first interval of time between emission of the pulse of light by the light source and receipt of the first electrical-edge signal; and determine a second interval of time between emission of the pulse of light by the light source and receipt of the second electrical-edge signal.

The lidar system, further comprising a processor configured to determine the distance from the lidar system to the target based at least in part on the first and second intervals of time.

The lidar system, further comprising an optical filter located in front of the receiver, wherein the optical filter is configured to transmit light at one or more operating wavelengths of the light source and attenuate light at surrounding wavelengths by at least 10 dB.

The lidar system, wherein the receiver comprises an array of two or more avalanche photodiodes (APDs).

The lidar system, wherein the receiver comprises: an avalanche photodiode (APD) configured to operate as a single-photon avalanche diode (SPAD); and a quenching circuit configured to reduce a reverse-bias voltage applied to the SPAD when an avalanche event occurs in the SPAD.

The lidar system, wherein the receiver comprises: two or more avalanche photodiodes (APDs); and one or more logic gates coupled to the APDs, wherein the logic gates are configured to produce an output indicating that the receiver has detected an optical pulse only if each of the APDs produces an electrical signal corresponding to detection of the optical pulse.

The lidar system, further comprising a processor configured to determine the distance from the lidar system to the target based at least in part on a round-trip time of flight for a pulse of light emitted by the light source to travel from the lidar system to the target and back to the lidar system.

The lidar system, wherein the round-trip time of flight is determined based at least in part on a rising edge or a falling edge associated with the pulse of light detected by the receiver.

The lidar system, further comprising a time-to-digital converter (TDC) configured to determine a time interval between emission of a pulse of light by the light source and detection by the receiver of at least a portion of the pulse of light scattered by the target.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately," "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A laser system comprising:
   a seed laser configured to produce optical seed pulses;
   a first fiber-optic amplifier configured to amplify the seed pulses by a first amplifier gain to produce a first-amplifier output that comprises amplified seed pulses and amplified spontaneous emission (ASE);
   a first optical filter configured to remove from the first-amplifier output an amount of the ASE;
   a second fiber-optic amplifier configured to receive the amplified seed pulses from the first optical filter and amplify the received pulses by a second amplifier gain to produce output pulses, wherein the output pulses have output-pulse characteristics comprising:
      a pulse repetition frequency of less than or equal to 100 MHz;
      a pulse duration of less than or equal to 20 nanoseconds; and
      a duty cycle of less than or equal to 1%; and
   an optical demultiplexer configured to receive the output pulses from the second fiber-optic amplifier and distribute the output pulses to a plurality of optical links of a lidar system, wherein the optical links are coupled to a respective plurality of sensor heads of the lidar system.

2. The laser system of claim 1, wherein the output-pulse characteristics further comprise:
   an operating wavelength of between approximately 1400 nm and 2050 nm;

a pulse energy of greater than or equal to 10 nanojoules;
a peak power of greater than or equal to 1 watt; and
an average power of less than or equal to 50 watts, wherein the ASE comprises less than or equal to 25% of the average power.

3. The laser system of claim 1, wherein:
the optical seed pulses have an average power of greater than or equal to 1 microwatt;
the output pulses have an average power of greater than or equal to 1 milliwatt; and
the first amplifier gain and the second amplifier gain together correspond to an overall optical power gain of greater than or equal to 40 dB.

4. The laser system of claim 1, wherein the seed laser comprises a laser diode configured to be electrically driven by a pulse generator to produce the optical seed pulses.

5. The laser system of claim 1, wherein the seed laser comprises:
a laser diode configured to produce continuous-wave (CW) light; and
an optical modulator configured to receive the CW light and produce the optical seed pulses from the received CW light.

6. The laser system of claim 1, wherein the seed laser comprises:
a laser diode configured to produce optical pulses having a duration τ; and
an optical modulator configured to:
receive the optical pulses from the laser diode; and
selectively transmit a portion of each of the received optical pulses to produce the optical seed pulses, wherein each optical seed pulse has a duration less than τ.

7. The laser system of claim 1, wherein the seed laser comprises:
a plurality of laser diodes, wherein each laser diode is configured to produce light at a different wavelength; and
an optical multiplexer configured to combine the light produced by each laser diode into a single optical fiber.

8. The laser system of claim 7, wherein:
each output pulse has a wavelength corresponding to a wavelength of one of the laser diodes; and
the optical demultiplexer is a wavelength demultiplexer configured to distribute the output pulses to the optical links by separating the output pulses according to wavelength and sending each output pulse to a corresponding optical link for transmission to a corresponding sensor head.

9. The laser system of claim 1, further comprising a wavelength-dependent delay line configured to receive input light comprising a plurality of operating wavelengths of the laser system and produce time-delayed light, wherein the time-delayed light comprises the light at the plurality of operating wavelengths, wherein each wavelength of the plurality of operating wavelengths has a particular time delay based on the wavelength.

10. The laser system of claim 9, wherein the delay line comprises:
a circulator; and
a plurality of fiber Bragg gratings (FBGs) corresponding to the plurality of operating wavelengths, wherein:
the FBGs are arranged in series and separated from one another by a particular length of optical fiber; and
each FBG is configured to reflect one wavelength of the operating wavelengths.

11. The laser system of claim 1, wherein the seed laser comprises a wavelength-tunable laser configured to produce light at a plurality of wavelengths.

12. The laser system of claim 1, wherein the seed laser comprises a mode-locked fiber laser and a pulse picker configured to extract optical pulses produced by the mode-locked fiber laser.

13. The laser system of claim 1, wherein the first optical filter is configured to remove greater than or equal to 80% of the ASE from the first-amplifier output.

14. The laser system of claim 1, wherein the first optical filter comprises a spectral filter configured to transmit light at one or more operating wavelengths of the laser system and attenuate light away from the transmitted wavelengths by at least 20 dB.

15. The laser system of claim 1, wherein the first optical filter comprises a temporal filter comprising an optical switch or a semiconductor optical amplifier, wherein the temporal filter is configured to be in a transmitting state when an amplified seed pulse is present and to be in a non-transmitting state otherwise, wherein when operating in the non-transmitting state, the ASE is substantially prevented from being transmitted through the first optical filter.

16. The laser system of claim 1, further comprising a second optical filter configured to receive the output pulses from the second amplifier and reduce an amount of ASE produced by the second amplifier.

17. The laser system of claim 1, further comprising an output collimator configured to receive the output pulses from the second fiber-optic amplifier and produce a free-space optical beam comprising the output pulses.

18. The laser system of claim 1, wherein:
the first fiber-optic amplifier comprises a double-pass amplifier comprising:
a circulator;
an erbium-doped or erbium/ytterbium-doped gain fiber comprising a first end and a second end, wherein the first end is coupled to the circulator; and
a fiber Bragg grating (FBG) coupled to the second end of the gain fiber, wherein the FBG is configured to reflect light corresponding to one or more operating wavelengths of the laser system and transmit or attenuate light that is away from the reflected wavelengths; and
the second fiber-optic amplifier comprises a booster amplifier comprising a double-clad gain fiber comprising erbium dopants or erbium and ytterbium dopants.

19. The laser system of claim 1, wherein:
the first fiber-optic amplifier comprises a first single-pass amplifier comprising a first gain fiber comprising erbium dopants or erbium and ytterbium dopants;
the second fiber-optic amplifier comprises a second single-pass amplifier comprising a second gain fiber comprising erbium dopants or erbium and ytterbium dopants; and
the laser system further comprises a third fiber-optic amplifier, wherein the third amplifier comprises a booster amplifier comprising a double-clad gain fiber comprising erbium dopants or erbium and ytterbium dopants.

20. The laser system of claim 1, wherein:
the first fiber-optic amplifier comprises a double-pass amplifier comprising:
a circulator;
an erbium-doped or erbium/ytterbium-doped gain fiber comprising a first end and a second end, wherein the first end is coupled to the circulator; and a fiber Bragg grating (FBG) coupled to the second end of the gain fiber, wherein the FBG is configured to reflect light corresponding to one or more operating wavelengths of the laser system and transmit or attenuate light that is away from the reflected wavelengths;

the second fiber-optic amplifier comprises a single-pass amplifier comprising erbium-doped or erbium/ytterbium-doped gain fiber; and the laser system further comprises a third fiber-optic amplifier, wherein the third amplifier comprises a booster amplifier comprising a double-clad gain fiber comprising erbium dopants or erbium and ytterbium dopants.

21. The laser system of claim 1, wherein the second fiber-optic amplifier comprises a booster amplifier comprising a double-clad gain fiber comprising erbium dopants or erbium and ytterbium dopants.

22. The laser system of claim 21, wherein the booster amplifier further comprises a cladding mode stripper.

23. The laser system of claim 1, wherein the seed laser, the first amplifier, the first optical filter, and the second amplifier are packaged together within a single housing.

24. The laser system of claim 1, wherein the laser system further comprises a third fiber-optic amplifier configured to receive the output pulses from the second amplifier and amplify the output pulses by a third amplifier gain, wherein the third amplifier comprises a booster amplifier comprising a double-clad gain fiber comprising erbium dopants or erbium and ytterbium dopants.

25. A laser system comprising:
a seed laser configured to produce optical seed pulses;
a first fiber-optic amplifier configured to amplify the seed pulses by a first amplifier gain to produce a first-amplifier output that comprises amplified seed pulses and amplified spontaneous emission (ASE);
a first optical filter configured to remove from the first-amplifier output an amount of the ASE; and
a second fiber-optic amplifier configured to receive the amplified seed pulses from the first optical filter and amplify the received pulses by a second amplifier gain to produce output pulses, wherein the output pulses have output-pulse characteristics comprising:
a pulse repetition frequency of less than or equal to 100 MHz;
a pulse duration of less than or equal to 20 nanoseconds; and
a duty cycle of less than or equal to 1%,
wherein the laser system is part of a lidar system comprising a light source, an optical link, and a sensor head, wherein:
the optical link couples the light source to the sensor head;
the seed laser is disposed in the light source;
the first fiber-optic amplifier is disposed in the light source, the optical link, or the sensor head; and
the second fiber-optic amplifier is disposed in the light source, the optical link, or the sensor head.

26. The laser system of claim 25, wherein:
the first and second amplifiers are disposed in the light source; and
the laser system further comprises a third fiber-optic amplifier comprising a gain fiber distributed along a length of the optical link.

27. The laser system of claim 25, wherein:
the first amplifier is disposed in the light source; and
the second amplifier comprises a gain fiber distributed along a length of the optical link.

28. The laser system of claim 25, wherein:
the first and second amplifiers are disposed in the light source; and
the laser system further comprises a third amplifier disposed in the sensor head, wherein the third amplifier comprises a free-space amplifier or a fiber-optic amplifier.

29. The laser system of claim 25, wherein:
the first amplifier is disposed in the light source;
the second amplifier comprises a gain fiber distributed along a length of the optical link; and
the laser system further comprises a third amplifier disposed in the sensor head, wherein the third amplifier comprises a free-space amplifier or a fiber-optic amplifier.

* * * * *